US012772403B2

(12) United States Patent
Amin et al.

(10) Patent No.: US 12,772,403 B2
(45) Date of Patent: Oct. 20, 2026

(54) COVER ARTICLES WITH HIGH HARDNESS AND ANTI-REFLECTIVE PROPERTIES FOR INFRARED SENSORS

(71) Applicant: CORNING INCORPORATED, Corning, NY (US)

(72) Inventors: Jaymin Amin, Corning, NY (US); Jason Thomas Harris, Horseheads, NY (US); Shandon Dee Hart, Elmira, NY (US); Karl William Koch, III, Elmira, NY (US); Carlo Anthony Kosik Williams, Painted Post, NY (US); Lin Lin, Painted Post, NY (US); Alexandre Michel Mayolet, Corning, NY (US); Dong-gun Moon, Yongin-si (KR); Jeonghong Oh, Cheonan-si (KR); James Joseph Price, Corning, NY (US); Charlene Marie Smith, Corning, NY (US); Ananthanarayanan Subramanian, Corning, NY (US); Ljerka Ukrainczyk, Ithaca, NY (US); Tingge Xu, Santa Clara, CA (US)

(73) Assignee: CORNING INCORPORATED, Corning, NY (US)

( * ) Notice: Subject to any disclaimer, the term of this patent is extended or adjusted under 35 U.S.C. 154(b) by 721 days.

(21) Appl. No.: 18/123,391

(22) Filed: Mar. 20, 2023

(65) Prior Publication Data

US 2023/0301002 A1 Sep. 21, 2023

Related U.S. Application Data

(60) Provisional application No. 63/450,687, filed on Mar. 8, 2023, provisional application No. 63/321,905, filed on Mar. 21, 2022.

(51) Int. Cl.
*H05K 5/03* (2006.01)

(52) U.S. Cl.
CPC .................................... *H05K 5/03* (2013.01)

(58) Field of Classification Search
CPC .... H05K 5/03; C03C 2217/734; C03C 3/097; C03C 10/0027; C03C 17/3435; C03C 21/002; G02B 1/115; G02B 1/14
See application file for complete search history.

(56) References Cited

U.S. PATENT DOCUMENTS 4,483,700 A 11/1984 Forker et al.
5,674,790 A 10/1997 Araujo
(Continued)

FOREIGN PATENT DOCUMENTS

JP 2018-058738 A 4/2018
WO 2018/125676 A1 7/2018
(Continued)

OTHER PUBLICATIONS

Corning Inc., "Information Related to Coatings on Commercially Available Tablet Devices—Supplying data related to the Apple iPad Air 2 (released Oct. 2014), Apple iPad Pro 2nd Generation (released Jun. 2017), and Apple iPad Air 4th Generation (released Oct. 2020)" 28 pages. This document has not been published in a book, magazine, journal, etc.
(Continued)

*Primary Examiner* — Md K Talukder
(74) *Attorney, Agent, or Firm* — William J. Tucker

(57) ABSTRACT

A cover article for a sensor is described herein that includes: a substrate comprising a thickness from 50 μm to 5000 μm, an outer primary surface, and an inner primary surface; and an outer layered film disposed on the outer primary surface. The substrate is a chemically-strengthened glass or glass-ceramic substrate. The cover article exhibits a first-surface
(Continued)

average reflectance of less than 10% for wavelengths from 1000 nm to 1700 nm for at least one angle of incidence from 8° to 60°.

28 Claims, 33 Drawing Sheets

(56) References Cited

U.S. PATENT DOCUMENTS

| | | | | |
|---|---|---|---|---|
| 7,666,511 | B2 | 2/2010 | Ellison et al. | |
| 8,312,739 | B2 | 11/2012 | Lee et al. | |
| 8,561,429 | B2 | 10/2013 | Allan et al. | |
| 9,703,011 | B2 | 7/2017 | Adib et al. | |
| 10,802,179 | B2 | 10/2020 | Bellman et al. | |
| 11,500,130 | B2 | 11/2022 | Hart et al. | |
| 11,567,237 | B2 | 1/2023 | Hart et al. | |
| 2014/0113083 | A1 | 4/2014 | Lee et al. | |
| 2014/0377522 | A1* | 12/2014 | Koch, III | C03C 17/3435 428/428 |
| 2016/0223717 | A1* | 8/2016 | Hart | G02B 1/14 |
| 2017/0108622 | A1 | 4/2017 | Uchida et al. | |
| 2018/0011225 | A1* | 1/2018 | Bellman | G02B 1/14 |
| 2018/0319704 | A1* | 11/2018 | Adib | H05K 5/03 |
| 2018/0339938 | A1* | 11/2018 | Bellman | C04B 41/5025 |
| 2019/0179550 | A1* | 6/2019 | Hart | G02B 1/14 |
| 2019/0255818 | A1* | 8/2019 | Ueki | G06F 3/041 |
| 2019/0346592 | A1* | 11/2019 | Nakazawa | G02B 1/14 |
| 2020/0156992 | A1 | 5/2020 | Baloukas et al. | |
| 2020/0158916 | A1 | 5/2020 | Hart et al. | |
| 2020/0310000 | A1* | 10/2020 | Hart | G02B 1/115 |
| 2021/0033751 | A1* | 2/2021 | Hart | G02B 1/11 |
| 2021/0063609 | A1 | 3/2021 | Bellman et al. | |
| 2021/0286106 | A1 | 9/2021 | Kim et al. | |
| 2022/0299606 | A1* | 9/2022 | Hart | G02B 1/14 |
| 2022/0317340 | A1 | 10/2022 | Amin et al. | |
| 2022/0317353 | A1 | 10/2022 | Hart et al. | |
| 2023/0010461 | A1 | 1/2023 | Hart et al. | |
| 2023/0301002 | A1* | 9/2023 | Amin | C03C 3/097 455/575.8 |

FOREIGN PATENT DOCUMENTS

| | | | |
|---|---|---|---|
| WO | 2020/247292 | A1 | 12/2020 |
| WO | 2022/125846 | A1 | 6/2022 |

OTHER PUBLICATIONS

International Search Report and Written Opinion of the International Searching Authority; PCT/US2023/015431; dated Aug. 28, 2023; 19 pages; European Patent Office.

Katsuyama, T., "Development of semiconductor laser for optical communication", SEI Techn Rev, vol. 69, 2009, pp. 13-20.

Oliver, W.C., et al., "Measurement of Hardness and Elastic Modulus by Instrument Indentation: Advances in Understanding and Refinements to Methodology", J. Mater. Res., vol. 19, No. 1, 2004, pp. 3-20.

Price, J. J., et al., "Nanoindentation Hardness and Practical Scratch Resistance in Mechanically Tunable Anti-Reflection Coatings", Coatings, vol. 11, No. 2, 213, pp. 1-18.

W.C. Pharr, G. M., "An improved technique for determining hardness and elastic modulus using load and displacement sensing indentation experiments", J. Mater. Res., vol. 7, No. 6, 1992, pp. 1564-1583.

Willey, "Predicting achievable design performance of broadband antireflection coatings", Applied optics, vol. 32, No. 28, 1993, pp. 5447-5451.

* cited by examiner

Ex. 8

Ex. 9

Comp Ex. 2

COVER ARTICLES WITH HIGH HARDNESS AND ANTI-REFLECTIVE PROPERTIES FOR INFRARED SENSORS

CLAIM OF PRIORITY

This application claims the benefit of priority under 35 U.S.C. § 119 of U.S. Provisional Application No. 63/321,905 filed Mar. 21, 2022, and claims the benefit of priority under 35 U.S.C. § 119 of U.S. Provisional Application No. 63/450,687 filed Mar. 8, 2023, the content of which is incorporated herein by reference in its entirety.

FIELD OF THE DISCLOSURE

This disclosure relates to durable and/or scratch resistant cover articles for electronic devices and, more particularly, to durable and/or scratch resistant cover articles for infrared sensors and other sensors.

BACKGROUND

Cover articles are often used to protect critical devices within electronic products, to provide a user interface for input and/or display, and/or many other functions. Such products include mobile devices, such as smart phones, mp3 players, and computer tablets. Cover articles also include architectural articles, transportation articles (e.g., articles used in automotive applications, trains, aircraft, sea craft, etc.), appliance articles, or any article that requires some transparency, scratch-resistance, abrasion resistance, or a combination thereof.

These applications often demand scratch-resistance and strong optical performance characteristics, in terms of maximum light transmittance and minimum reflectance. Furthermore, some cover applications require that the color exhibited or perceived, in reflection and/or transmission, does not change appreciably as the viewing angle is changed. In display applications, this is because, if the color in reflection or transmission changes with viewing angle to an appreciable degree, the user of the product will perceive a change in color or brightness of the display, which can diminish the perceived quality of the display. In other applications, changes in color may negatively impact the aesthetic requirements or other functional requirements.

Recently, infrared (IR) sensors are increasingly being deployed in these same applications, for example in LIDAR or time-of-flight infrared sensing for applications such as distance sensing for camera focus and facial recognition. These IR sensors (which may include IR cameras) typically operate at wavelengths where semiconductor IR components have historically been developed, driven by semiconductor bandgap considerations (e.g., silicon, gallium arsenide (GaAs), germanium, indium phosphide (InP), InGaAs, GaInAsP, AlGaInAs, (Ga)InAs+quantum dot, and GaInNAs(Sb) emission and absorption wavelengths), rare earth and other emitting elements and compounds (e.g., erbium, ytterbium, neodymium-doped yttrium aluminum garnet) emission wavelengths, as well as telecom (e.g., silica optical fiber) transparency window considerations, as well as wavelength division multiplexing telecom applications operating in a wavelength window from about 1260-1675 nm. Typical exemplary wavelengths include those at or near (e.g., within 50 nm) central wavelengths around 850 nm, 940 nm, 1060 nm, 1260 nm, 1310 nm, and 1550 nm.

The optical performance of cover articles can be improved by using various anti-reflective coatings. However, known anti-reflective (AR) coatings are susceptible to wear, abrasion and/or scratch damage. Such wear, abrasion and scratch damage can compromise any optical performance improvements achieved by the AR coating. Further, some known anti-reflective coatings exhibit good performance in the visible spectrum, but also exhibit high reflectance and/or low transmittance in the infrared spectrum utilized by IR sensors (e.g., 1000-1700 nm).

Further, conventional cover articles employing glass or glass-ceramic substrates and outer layered films can suffer from reduced article-level mechanical performance. In particular, the inclusion of outer layered films and AR coatings on these substrates has provided advantages in terms of optical performance and certain mechanical properties (e.g., scratch resistance); however, conventional combinations of these substrates and outer layered films (e.g., as optimized for improved scratch resistance with high modulus and/or hardness) has resulted in inferior strength levels for the resultant article. Notably, it appears that the presence of the outer layered film on the substrate can disadvantageously reduce the strength level of the article to a level below the strength of the substrate in a bare form without the outer layered film.

Accordingly, there is a need for cover articles for electronic devices (e.g., which employ IR sensors) that are durable (e.g., with high hardness, damage resistance and/or retained strength) and/or scratch resistant with improved optical performance (e.g., low reflectance and/or high transmittance), particularly in a spectrum that includes both visible and infrared light or a spectrum of infrared light.

SUMMARY

According to an aspect of the disclosure, a cover article for a sensor is provided that includes: a substrate comprising a thickness from 50 μm to 5000 μm, an outer primary surface and an inner primary surface, wherein the outer and inner primary surfaces are opposite of one another; and an outer layered film disposed on the outer primary surface of the substrate. The substrate is a chemically-strengthened glass substrate or a glass-ceramic substrate. The cover article exhibits a first-surface average reflectance of less than 10% for wavelengths from 1000 nm to 1700 nm for at least one angle of incidence from 8° to 60°.

According to another aspect of the disclosure, a cover article for a sensor is provided that includes: a substrate comprising a thickness from 50 μm to 5000 μm, an outer primary surface and an inner primary surface, wherein the outer and inner primary surfaces are opposite of one another; and an outer layered film disposed on the outer primary surface of the substrate. The substrate is a chemically-strengthened glass substrate or a glass-ceramic substrate. The outer layered film exhibits a hardness of at least 8 GPa, as measured with a Berkovich Indenter Hardness Test from the outermost surface of the outer layered film to a depth from about 100 nm to about 500 nm. In addition, the cover article exhibits a first-surface average reflectance of less than 10% for wavelengths from 1000 nm to 1700 nm for at least one angle of incidence from 8° to 60°.

According to a further aspect of the disclosure, a cover article for a sensor is provided that includes: a substrate comprising a thickness from 50 μm to 5000 μm, an outer primary surface and an inner primary surface, wherein the outer and inner primary surfaces are opposite of one another; and an outer layered film disposed on the outer primary surface of the substrate. The substrate is a chemically-strengthened glass substrate or a glass-ceramic substrate.

The outer layered film comprises a plurality of alternating high refractive index and low refractive index layers. Each of the high refractive index layers comprises a nitride or an oxynitride and has a refractive index greater than a refractive index of each of the low refractive index layers. The outer layered film comprises a scratch resistant layer having a thickness from about 80 nm to 10,000 nm. One of the low refractive index layers is a capping layer defining an outermost surface of the outer layered film and the capping layer has a thickness of at least 110 nm. In addition, the outer layered film comprises an antireflective region over the scratch resistant layer, and the antireflective region comprises a thickness from about 100 nm to about 525 nm. Further, the low refractive index layers of the antireflective region comprise a total thickness of less than 275 nm. In addition, the outer layered film exhibits a hardness of at least 8 GPa, as measured with a Berkovich Indenter Hardness Test from the outermost surface of the outer layered film to a depth from about 100 nm to about 500 nm. In addition, the cover article exhibits a first-surface average reflectance of less than 10% for wavelengths from 1000 nm to 1700 nm for at least one angle of incidence from 8° to 60°.

According to a further aspect of the disclosure, a cover article for a sensor is provided that includes: a substrate comprising a thickness from 50 μm to 5000 μm, an outer primary surface and an inner primary surface, wherein the outer and inner primary surfaces are opposite of one another; and an outer layered film disposed on the outer primary surface of the substrate. The substrate is a chemically-strengthened glass substrate or a glass-ceramic substrate. The cover article exhibits a first-surface average reflectance of less than 10% for wavelengths from 1000 nm to 1700 nm for at least one angle of incidence from 8° to 60°. In addition, the outer layered film exhibits a residual compressive stress of greater than or equal to 700 MPa and an elastic modulus of greater than or equal to 140 GPa.

According to a further aspect of the disclosure, a cover article is provided that includes: a glass-ceramic substrate comprising a first primary surface and a second primary surface, the primary surfaces opposing one another; and an outer layered film defining an outer surface, the outer layered film disposed on the first primary surface. The cover article exhibits a hardness of greater than 15 GPa, as measured by a Berkovich Hardness Test at an indentation depth of about 125 nm from the outer surface of the outer layered film. Plus, the cover article exhibits a first-surface average reflectance of less than 10% for wavelengths from 1000 nm to 1700 nm for at least one angle of incidence from 8° to 60°.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
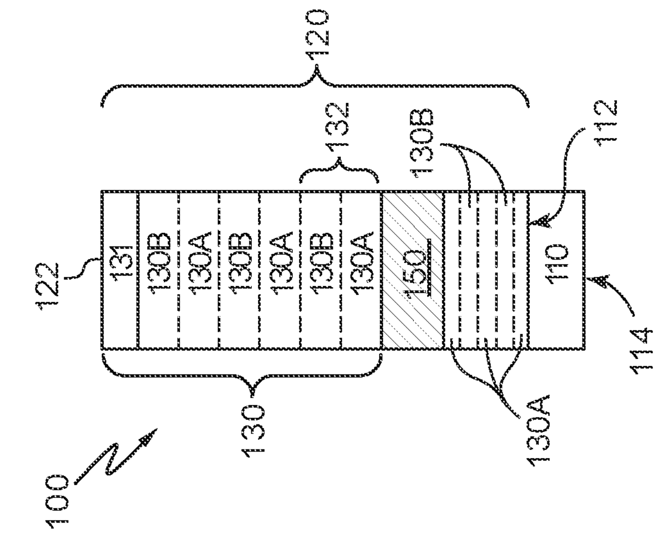
FIG. 1 is a cross-sectional side view of a cover article, according to one or more embodiments described herein.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example "up," "down," "right," "left," "front," "back," "top," "bottom"—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

As used herein, the term "dispose" includes coating, depositing, and/or forming a material onto a surface using any known or to be developed method in the art. The disposed material may constitute a layer, as defined herein. As used herein, the phrase "disposed on" includes forming a material onto a surface such that the material is in direct contact with the surface and embodiments where the material is formed on a surface with one or more intervening material(s) disposed between the material and the surface. The intervening material(s) may constitute a layer, as defined herein.

As used herein, the terms "low RI layer", "medium RI layer" and "high RI layer" refer to the relative values of the refractive index ("RI") of layers of an outer layered film of a cover article according to the disclosure. Hence, the RI of the low RI layer< the RI of the medium RI layer< the RI of the high RI layer, unless otherwise expressly noted in this disclosure. Accordingly, low RI layers have refractive index values that are less than the refractive index values of medium and high RI layers. Further, as used herein, "low RI layer" and "low index layer" are interchangeable with the same meaning. Likewise, "medium RI layer" and "medium index layer" are interchangeable with the same meaning. Similarly, "high RI layer" and "high index layer" are interchangeable with the same meaning.

As used herein, the term "strengthened substrate" refers to a substrate employed in a cover article of the disclosure that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

As used herein, the "Berkovich Indenter Hardness Test" and "Berkovich Hardness Test" are used interchangeably to refer to a test for measuring the hardness of a material on a surface thereof by indenting the surface with a diamond Berkovich indenter. The Berkovich Indenter Hardness Test includes indenting the outermost surface (e.g., an exposed surface) of an outer layered film of a cover article of the disclosure with the diamond Berkovich indenter to form an indent to an indentation depth in the range from about 50 nm to about 1000 nm (or the entire thickness of the outer layered film, whichever is less) and measuring the maximum hardness from this indentation along the entire indentation depth range or a segment of this indentation depth (e.g., in the range from about 100 nm to about 600 nm, from about 100 nm to about 500 nm, to a depth of 200 nm, etc.), generally using the methods set forth in Oliver, W. C.; Pharr, G. M. An improved technique for determining hardness and elastic modulus using load and displacement sensing indentation experiments. J. Mater. Res., Vol. 7, No. 6, 1992, 1564-1583; and Oliver, W. C.; Pharr, G. M. Measurement of Hardness and Elastic Modulus by Instrument Indentation: Advances in Understanding and Refinements to Methodology. J. Mater. Res., Vol. 19, No. 1, 2004, 3-20. As used herein, each of "hardness" and "maximum hardness" interchangeably refers to a maximum hardness as measured along a range of indentation depths, and not an average hardness.

Typically, in nanoindentation measurement methods (such as the Berkovich Indenter Hardness Test) of a coating or film that is harder than the underlying substrate, the measured hardness may appear to increase initially due to development of the plastic zone at shallow indentation depths and then increases and reaches a maximum value or plateau at deeper indentation depths. Thereafter, hardness begins to decrease at even deeper indentation depths due to the effect of the underlying substrate. Where a substrate having an increased hardness compared to the coating is utilized, the same effect can be seen; however, the hardness increases at deeper indentation depths due to the effect of the underlying substrate. The indentation depth range and the hardness values at certain indentation depth range(s) can be selected to identify a particular hardness response of the outer layered films and layers thereof, described herein, without the effect of the underlying substrate.

When measuring hardness of the outer layered film of the cover articles of the disclosure according to the Berkovich Indenter Hardness Test, the region of permanent deformation (plastic zone) of a material is associated with the hardness of the material. During indentation, an elastic stress field extends well beyond this region of permanent deformation. As indentation depth increases, the apparent hardness and modulus are influenced by stress field interactions with the underlying substrate. The substrate influence on hardness occurs at deeper indentation depths (i.e., typically at depths greater than about 10% of the outer layered film or layer thickness). Moreover, a further complication is that the hardness response requires a certain minimum load to develop full plasticity during the indentation process. Prior to that certain minimum load, the hardness shows a generally increasing trend.

At small indentation depths (which also may be characterized as small loads) (e.g., up to about 50 nm) in the outer layered film of the cover articles of the disclosure, the apparent hardness of a material appears to increase dramatically versus indentation depth. This small indentation depth regime does not represent a true metric of hardness, but instead reflects the development of the aforementioned plastic zone, which is related to the finite radius of curvature of the indenter. At intermediate indentation depths, the apparent hardness approaches maximum levels. At deeper indentation depths, the influence of the substrate (e.g., substrate 110, as described in detail below) becomes more pronounced as the indentation depths increase. Hardness may begin to drop dramatically once the indentation depth exceeds about 30% of the outer layered film of the cover articles of the disclosure (e.g., the outer layered film 120 shown in FIGS. 1-1F and discussed in detailed below).

For the 'model hardness' values quoted in the Examples below (see section entitled, "Examples"), the nanoindentation process of coated glass was modeled using the finite element method (FEM) in the commercial software package ABAQUS v. 2018. An axisymmetric model was used to reduce the computational time and a conical indenter tip with a semi-angle of 70.3° was assumed, which generates the same contact area-to-depth ratio as the Berkovich tip. In practice, a sharp Berkovich indenter having a zero-tip radius does not exist. The radius of a new indenter tip is in the range of 40 nm-50 nm, which can increase to 100-200 nm or more as it wears. In this disclosure, the indenter was assumed to have a 100 nm tip bluntness, which was incorporated in the model. In the modeling analyses employed in this disclosure, all the materials were assumed to be homogenous, isotropic, elastic perfectly-plastic, with the adoption of von Mises yield criterion. Displacement history from experiments (e.g., nanoindentation results on fabricated single-layer films) were used as input for the FEM simulations. Nanoindentation load as a function of prescribed displacement is the output of a simulation. To extract hardness as a function of nanoindentation depth, continuous stiffness measurement (CSM) nanoindentation is simulated. To this end, the nanoindenter tip was given a small amplitude of vibration during the loading stage. The load vs nanoindentation depth curves were extracted from numerical simulations. The hardness responses were then calculated using the Oliver-Pharr method.

As used herein, the term "ring-on-ring Test" or "ROR Test" refers to a test employed to determine the failure strength or stress (in units of MPa) of cover articles of the disclosure, along with comparative articles. Each ring-on-ring (ROR) Test was conducted with a test arrangement using loading and supporting rings made of high-strength steel having diameters of 12.7 mm and 25.4 mm, respectively. In addition, the load bearing surfaces of the loading and supporting rings are machined to a radius of about 0.0625 inches to minimize stress concentrations in the contact region between the rings and the cover articles. Further, the loading ring is placed on the outermost primary surface of the cover article (e.g., on the outer surface of its outer layered film) and the supporting ring is placed on the innermost primary surface of the cover article (e.g., on the second primary surface of its substrate). The loading ring incorporates a mechanism that enables articulation of the loading ring and that insures proper alignment and uniform loading of the test sample. In addition, each ROR Test was conducted by applying the loading ring against the cover article at a loading rate of 1.2 mm/min. The term "average" in the context of an ROR testis based on the mathematical average of failure stress measurements made on five (5) samples. Further, unless stated otherwise in specific instances of the disclosure, all failure stress values and measurements described herein refer to measurements from the ROR testing, which places the outer surface of the article in tension, as described in International Publication No. WO2018/125676, published on Jul. 5, 2018, entitled "Coated Articles with Optical Coatings Having Residual Compressive Stress," and incorporated herein by reference in its entirety. A failure in each ROR Test typically occurs on the side of the sample opposite the loading ring, which is in tension, and finite element modeling is used to provide an appropriate conversion from failure load to failure stress at the location of the failure. It also understood that other failure strength tests can be employed to determine the failure strengths of the cover articles of the disclosure, with an appropriate correlation made to the ROR values and results reported herein in this disclosure based on differences in test conditions, test specimen geometry, and other technical considerations understood by those with ordinary skill in the field. Nevertheless, unless otherwise noted, all average failure strength values reported for the cover articles of the disclosure, along with comparative articles, are given as measured from an ROR Test.

As also used herein, the term "strain-to-failure" refers to the strain at which cracks propagate in the outer layered film of the cover articles of the disclosure, the substrate, or both simultaneously without application of additional load, typically leading to catastrophic failure in a given material, layer or film and perhaps even bridge to another material, layer, or film, as defined herein. That is, breakage of the outer layered film without breakage of the substrate constitutes failure, and breakage of the substrate also constitutes failure. The term "average" when used in connection with average strain-to-failure or any other property is based on the mathematical average of measurements of such property on 5 samples. Typically, crack onset strain measurements are repeatable under normal laboratory conditions, and the standard deviation of crack onset strain measured in multiple samples may be as little as 0.01% of observed strain. The term "average strain-to-failure", as used herein, was measured using a ring-on-ring (ROR) Test. However, unless stated otherwise, strain-to-failure measurements described herein refer to measurements from the ring-on-ring testing, as described in International Publication No. WO2018/125676, published on Jul. 5, 2018, entitled "Coated Articles with Optical Coatings Having Residual Compressive Stress," and incorporated herein by reference in its entirety As used herein, the term "transmittance" is defined is the percentage of incident optical power within a given wavelength range transmitted through a material (e.g., the cover article, the substrate, the outer layered film, or portions thereof). The term "reflectance" is similarly defined as the percentage of incident optical power within a given wavelength range that is reflected from a material (e.g., the cover article, the substrate, or the outer layered film, or portions thereof). Transmittance and reflectance are measured using a specific linewidth. As used herein, an "average transmittance" refers to the average amount of incident optical power transmitted through a material over a defined wavelength regime. As used herein, an "average reflectance" refers to the average amount of incident optical power reflected by the material.

As used herein, "photopic reflectance" mimics the response of the human eye by weighting the reflectance or transmittance, respectively, versus wavelength spectrum according to the human eye's sensitivity. Photopic reflectance may also be defined as the luminance, or tri-stimulus Y value of reflected light, according to known conventions such as CIE color space conventions. The "average photopic reflectance", as used herein, for a wavelength range from 380 nm to 720 nm is defined in the below equation as the spectral reflectance, R(λ) multiplied by the illuminant spectrum, I(λ) and the CIE's color matching function $\bar{y}(\lambda)$, related to the eye's spectral response given by Equation (1):

$$\langle R_p \rangle = \int_{380\ nm}^{720\ nm} R(\lambda) \times I(\lambda) \times \bar{y}(\lambda) d\lambda \quad (1)$$

In addition, "average reflectance" can be determined over the visible spectrum, or over other wavelength ranges, according to measurement principles understood by those skilled in the field of the disclosure, e.g., in the infrared spectrum from 840 nm to 950 nm, etc. Unless otherwise noted, all reflectance values reported or otherwise referenced in this disclosure are associated with testing through the outer layered film of the cover articles and off of the primary surface of the substrate on which the outer layered film is disposed, e.g., a "first-surface" average photopic reflectance, a "first-surface" average reflectance over a specified range of wavelengths, etc.

Camera system usability and/or the usability of a cover article in an electronic device (e.g., as a protective cover) can be related to the total amount of reflectance in the camera system. Photopic reflectance is particularly important for visible light camera systems and display devices that employ visible light. Lower reflectance in a camera system or cover article over a camera lens or display can reduce multiple-bounce reflections in the system that can generate 'ghost images'. Thus, reflectance has an important relationship to image quality in camera systems and devices employing cover articles. Also, low-reflectance displays can enable better readability, reduced eye strain, and faster user response time. Low-reflectance displays can also allow for reduced display energy consumption and increased device batter life, since the display brightness can be reduced for low-reflectance displays compared to standard displays, while still maintaining the targeted level of display readability in bright ambient environments.

As used herein, "photopic transmittance" is defined in the below equation as the spectral transmittance, T(λ) multiplied by the illuminant spectrum, I(λ) and the CIE's color matching function $\bar{y}(\lambda)$, related to the eye's spectral response given by Equation (2):

$$\langle T_p \rangle = \int_{380\ nm}^{720\ nm} T(\lambda) \times I(\lambda) \times \bar{y}(\lambda) d\lambda \quad (2)$$

Figure 1A:
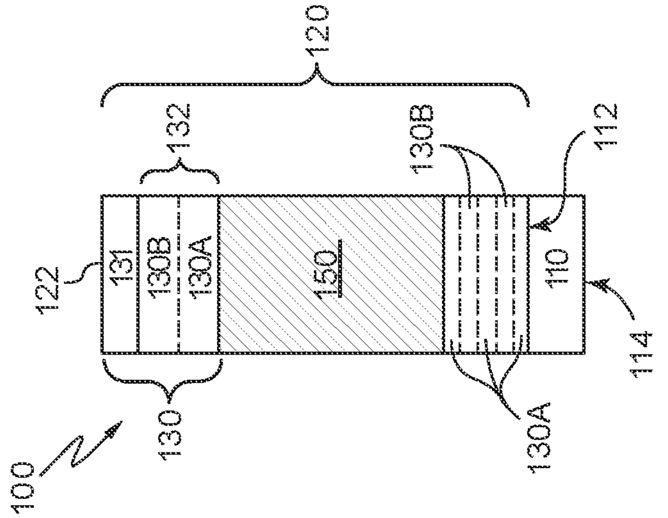
FIG. 1A is a cross-sectional side view of a cover article, according to one or more embodiments described herein.

In addition, "average transmittance" can be determined over the visible spectrum or other wavelength ranges, according to measurement principles understood by those skilled in the field of the disclosure, e.g., in the infrared spectrum from 840 nm to 950 nm, etc. Unless otherwise noted, all transmittance values reported or otherwise referenced in this disclosure are associated with testing through both primary surfaces of the substrate and the outer layered film (e.g., the substrate 110, primary surfaces 112, 114, and outer layered film 120 as shown in FIGS. 1-1F and described below) of the cover articles, e.g., a "two-surface" average photopic transmittance, a "two-surface" average transmittance over a specified range of wavelengths, etc.

As used herein, "transmitted color" and "reflected color" refer to the color transmitted or reflected through the cover articles of the disclosure with regard to color in the CIE L*,a*,b* colorimetry system under a D65 illuminant. More specifically, the "transmitted color" and "reflected color" are given by $\sqrt{(a^{*2}+b^{*2})}$, as these color coordinates are measured through transmission or reflectance of a D65 illuminant through the primary surfaces of the substrate of the cover article (e.g., the substrate 110, primary surfaces 112, 114, and outer layered film 120 as shown in FIGS. 1-1F and described below) over an incident angle range, e.g., from 0 degrees to 10 degrees, from 0 degrees to 45 degrees, from 0 degrees to 90 degrees, etc.

Generally, the disclosure is directed to cover articles that employ an outer layered film disposed on a chemically-strengthened glass substrate (e.g., Corning® Gorilla Glass® products) or a glass-ceramic substrate. These cover articles have high hardness and scratch resistance, and low optical reflectance, particularly in the infrared spectrum. The outer layered film of the cover article is a designed, multilayer film structure, and the cover articles of the disclosure reflect new system-level designs configured for camera lens, sensor and/or light source protective glass. Scratches and reflections are both detrimental to camera, sensor and light source performance, leading to signal loss, image distortion, and related artifacts. However, as the number of cameras, sensors and light sources increase in electronic devices and the need for imaging and sensing continues to grow, particularly sensors that operate in the infrared spectrum, the need for protective cover articles with optimized scratch and damage resistance, along with optical transmission across a wide spectrum, likewise continues to grow. The cover articles of the disclosure address these developing needs with new outer layered films and system-level designs.

The cover articles of the disclosure can be employed for camera lens, sensor and light source protection, along with protection of other components (e.g., buttons, speakers, microphones, etc.). The cover articles can also be employed for covers of displays, camera lenses, sensors and/or light source components within or otherwise part of electronic devices. These cover articles employ an outer layered film that exhibits a combination of high hardness and/or damage resistance, along with desirable optical properties, including high photopic transmittance and infrared transmittance. The cover articles include a scratch resistant layer within the outer layered film. Further, the outer layered film of these articles includes a plurality of alternating high and low index layers. In addition, each high index layer comprising a nitride or an oxynitride and each low index layer can comprise an oxide. According to some implementations, the outer layered film can be configured with at least one medium RI layer (e.g., $SiO_xN_y$) in contact with one of the high RI layers and the scratch-resistant layer (e.g., $SiO_xN_y$ or $SiN_y$) and/or a sum of the physical thicknesses of all of the low RI layers (e.g., $SiO_2$ or $SiO_xN_y$) in the outer structure limited to about 75 nm or less.

Aspects of the cover articles of the disclosure comprise an outer layered film (e.g, a hard optical coating) on chemically strengthened glass or glass-ceramic substrates which are optimized to give desirable combinations of hardness, reflectance, color, and color shift over a range of viewing angles. These outer layered films are intended for improving scratch resistance and optical performance (lower reflectance and/or higher transmittance) of chemically strengthened glass or glass-ceramic substrates onto which they are disposed. These outer layered films target low reflectance and color shift in the visible range. Notably, the cover articles of the disclosure exhibit a controlled, lower level of reflectance and a higher level of transmittance at infrared wavelengths in a broad band from about 800-1700 nm, most especially from 1000-1700 nm.

Aspects of the cover articles of the disclosure have a combination of 1) high hardness; 2) low visible reflectance; 3) controlled reflected color; 4) low infrared reflectance and high infrared transmittance over infrared wavelengths from 800-1700 nm; and 5) low reflectance (e.g., less than 1.5% photopic average at near-normal incidence) and well-controlled color over a wide range of viewing angles (e.g., first-surface reflected color from −8 to +3 in b* and −4 to +4 in a* for all viewing angles from 0 to 90 degrees).

An additional aspect of the disclosure includes devices and systems incorporating the cover articles of the disclosure as a protective cover glass, cover lens, or cover window. These devices and systems may, for example, include smartwatches, smart phones, camera modules (which may be on smart phones), smart glasses (e.g., AR/VR glasses), glass screen protectors with an adhesive backing placed over a smart phone cover glass, and LIDAR sensing systems for distance sensing in cameras or motor vehicles. These devices or systems may further include one or more semiconductor optical light emitters or detectors made from materials that comprise elements or compounds such as silicon, gallium arsenide (GaAs), germanium, indium phosphide (InP), InGaAs, GaInAsP, AlGaInAs, (Ga)InAs+quantum dot, GaInNAs(Sb), erbium, ytterbium, and neodymium-doped yttrium aluminum garnet. These systems may further include a display module such as an LCD or OLED display. Further, in implementations of the glass screen protectors for a smart phone, the screen protector includes a cover glass and an adhesive backing disposed on the cover glass, wherein at least a portion of the cover glass includes a cover article of the disclosure and the adhesive backing is for attachment to the smart phone (e.g., to the display of the smart phone). More generally, the cover articles of the disclosure may be fabricated or arranged in the device or system such that the cover article acts as a protective window covering more than one of the elements mentioned here, for example, covering combinations of elements such as: a) a display plus a camera plus an IR sensor; b) a camera plus an IR sensor; and c) multiple cameras and multiple IR sensors.

With regard to mechanical properties, the cover articles of the disclosure can exhibit a maximum hardness of 8 GPa or greater, 10 GPa or greater, or 12 GPa or greater (or even greater than 14 GPa in some instances), as measured by a Berkovich Hardness Test over an indentation depth range from 100 nm to about 500 nm in the outer layered film. Glass-ceramic substrates employed in these articles can have an elastic modulus of greater than 85 GPa, or greater than 95 GPa in some instances. These substrates also can exhibit a fracture toughness of greater than 0.8 $MPa\cdot\sqrt{m}$, or greater than 1 $MPa\cdot\sqrt{m}$ in some instances.

According to some embodiments of the cover articles of the disclosure (e.g., cover articles 100 detailed below), advantageous article-level failure stress levels can be achieved through the control of the composition, arrangement and/or processing of the outer layered films employed in the cover articles. Notably, the composition, arrangement and/or processing of the outer layered films can be adjusted to obtain residual compressive stress levels of at least 700

MPa (e.g., from 700 to 1100 MPa) and an elastic modulus of at least 140 GPa (e.g., from 140 to 170 GPa, or from 140 to 180 GPa). These outer layered film mechanical properties unexpectedly correlate to average failure stress levels of 700 MPa or greater (or average failure stress levels of 800 MPa or greater) in the cover articles employing these outer layered films, as measured in an ROR test with the outer surface of the outer layered film of the article placed in tension.

Reference will now be made in detail to various embodiments of cover articles, examples of which are illustrated in the accompanying drawings. Referring to FIG. 1, a cover article 100, according to one or more embodiments disclosed herein, may include a substrate 110, and an outer layered film 120 disposed on the substrate. The substrate 110 may include opposing primary surfaces 112, 114. The outer layered film 120 is shown in FIG. 1 as being disposed on an outer primary surface 112; however, the outer layered film 120 may be disposed on the inner primary surface 114 of the substrate 110, in addition to or instead of being disposed on the outer primary surface 112. The outer layered film 120 forms an outermost surface 122. Further, the outer layered film 120 can include a scratch-resistant layer 150. In some implementations, the outer layered film 120 can include an antireflective region 130 over the scratch-resistant layer 150. In some embodiments, the outer layered film 120 further includes an interference layer between the substrate 110 and scratch-resistant layer 150. Further, the outermost surface 122 of the outer layered film 120 forms an air-interface and generally defines the edge of the outer layered film 120 as well as the edge of the overall cover article 100. The substrate 110 may be substantially transparent, as described herein.

The outer layered film 120 includes at least one layer of at least one material. The term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments, a layer may include one or more contiguous and uninterrupted layers and/or one or more discontinuous and interrupted layers (i.e., a layer having different materials formed adjacent to one another). A layer or sub-layers may be formed by any known method in the art, including discrete deposition or continuous deposition processes. In one or more embodiments, the layer may be formed using only continuous deposition processes, or, alternatively, only discrete deposition processes.

In one or more embodiments, a single layer or multiple layers of the outer layered film 120 may be deposited onto the substrate 110 by a vacuum deposition technique such as, for example, chemical vapor deposition (e.g., plasma enhanced chemical vapor deposition (PECVD), low-pressure chemical vapor deposition, atmospheric pressure chemical vapor deposition, and plasma-enhanced atmospheric pressure chemical vapor deposition), physical vapor deposition (e.g., reactive or nonreactive sputtering or laser ablation), thermal or e-beam evaporation and/or atomic layer deposition. Liquid-based methods may also be used such as spraying, dipping, spin coating, or slot coating (e.g., using sol-gel materials). Generally, vapor deposition techniques may include a variety of vacuum deposition methods which can be used to produce thin films. For example, physical vapor deposition uses a physical process (such as heating or sputtering) to produce a vapor of material, which is then deposited on the object which is coated. Preferred methods of fabricating the outer layered film 120 can include reactive sputtering, metal-mode reactive sputtering and PECVD processes.

The thickness of the outer layered film 120 may be about 0.10 μm or greater, or about 0.25 μm or greater. In some examples, the thickness of the outer layered film 120 may be in the range from about 0.10 μm to about 20 μm, about 0.10 μm to about 10 μm, about 0.25 μm to about 20 μm, from about 0.25 μm to about 15 μm, from about 0.25 μm to about m, from about 0.25 μm to about 5 μm, from about 0.5 μm to about 10 μm, from about 0.5 m to about 5 μm, from about 0.5 μm to about 4 μm, and all thickness values of the outer layered film 120 between these thickness values. For example, the thickness of the outer layered film 120 can be about 0.25 μm, 0.3 μm, 0.4 μm, 0.5 μm, 0.6 μm, 0.7 μm, 0.8 μm, 0.9 m, 1 μm, 1.25 μm, 1.5 μm, 1.75 μm, 2 μm, 3 μm, 4 μm, 5 μm, 6 μm, 7 μm, 8 μm, 9 μm, 10 am, 12 μm, 14 μm, 16 μm, 18 μm, 20 μm, and all thickness values between these thicknesses.

As also shown in FIG. 1, the outer layered film 120 includes a plurality of layers (130A, 130B). In one or more embodiments, the outer layered film 120 may include a period 132 comprising two or more layers. In one or more embodiments, the two or more layers may be characterized as having different refractive indices from each another. In one embodiment, the period 132 includes a first low RI layer 130A and a second high RI layer 130B. The difference in the refractive index of the first low RI layer and the second high RI layer may be about 0.01 or greater, about 0.05 or greater, about 0.1 or greater, or even about 0.2 or greater.

In some embodiments, as depicted for example in FIG. 1, the outer layered film 120 is divided into an antireflective region 130 and interference layer, with a scratch-resistant layer 150 (as detailed further below) disposed between these structures. In these embodiments, the antireflective region 130 and interference layer may have the same thicknesses or different thicknesses, and each comprises one or more layers. In other embodiments (not shown), the outer layered film 120 includes an optical interference layer beneath the scratch-resistant layer 150 and no structure comparable to the antireflective region 130 (see FIG. 1).

As shown in FIG. 1 (along with FIGS. 1A-1F described below), and outlined above, cover articles 100 of the disclosure can include an outer layered film 120 with one or more of an antireflective region 130 and an interference layer. Each of the antireflective region 130 and interference layer (between scratch-resistant layer 150 and substrate 110) includes a plurality of alternating low and high refractive index (RI) layers, 130A and 130B, respectively. According to embodiments, each of the antireflective region 130 and interference layer includes a period 132 of two or more layers, such as the low RI layer 130A and high RI layer 130B, or a low RI layer 130A, high RI layer 130B and a low RI layer 130A. Further, each of the antireflective region 130 an interference layer of the outer layered film 120 may include a plurality of periods 132, such as 1 to 30 periods, 1 to 25 periods, 1 to 20 periods, and all periods within the foregoing ranges. In addition, the number of periods 132, the number of layers of the antireflective region 130 and interference layer, and/or the number of layers within a given period 132 can differ or they may be the same. Further, in some implementations, the total amount of the plurality of alternating low RI and high RI layers 130A and 130B and the scratch resistant layer 150 may range from 6 to 50 layers, 6 to 40 layers, 6 to 30 layers, 6 to 28 layers, 6 to 26 layers, 6 to 24 layers, 6 to 22 layer, 6 to 20 layers, 6 to 18 layers, 6 to 16 layers, and 6 to 14 layers, and all ranges of layers and amounts of layers between the foregoing values.

As shown in FIG. 1, the outer layered film 120 may include a plurality of periods 132. A single period 132 may include a first low RI layer 130A and a second high RI layer 130B, such that when a plurality of periods 132 are provided, the first low RI layer 130A (designated for illustration as "L") and the second high RI layer 130B (designated for illustration as "H") alternate in the following sequence of layers: L/H/L/H or H/L/H/L, such that the first low RI layer 130A and the second high RI layer 130B appear to alternate along the physical thickness of the outer layered film 120.

In the example cover article 100 in FIG. 1, the antireflective coating region 130 includes five (5) periods 132 (three periods above the scratch resistant layer 150 and two periods below the scratch resistant layer 150). In some embodiments, the outer layered film 120 may include up to twenty-five (25) periods 132 (also referred herein as "N" periods, in which N is an integer). For example, the outer layered film 120 may include from about 2 to about 20 periods 132, from about 2 to about 15 periods 132, from about 2 to about 12 periods 132, from about 2 to about 10 periods 132, from about 2 to about 12 periods 132, from about 3 to about 8 periods 132, from about 3 to about 6 periods 132, or any other period 132 within these ranges. For example, the outer layered film 120 may include 1, 2, 3, 4, 5, 6, 7, 8, 9, 10, 11, 12, 13, 14, 15, 16, 17, 18, 19, 20, 21, 22, 23, 24 or 25 period(s) 132.

In the embodiment shown in FIG. 1, the outer layered film 120 may include an additional capping layer 131, which may include a lower refractive index material than the second high RI layer 130B. In embodiments, one of the low refractive index layers of the outer layered film 120 is the capping layer 131.

As used herein, the terms "low RI" and "high RI" refer to the relative values for the refractive index of the layers 130A and 130B relative to one another (e.g., low RI<high RI). In one or more embodiments, the term "low RI" when used with the low RI layers 130A, includes a range from about 1.3 to about 1.7 or 1.75. In one or more embodiments, the term "high RI" when used with the high RI layers 130B, includes a range from about 1.7 to about 2.6 (e.g., about 1.85 or greater). In one or more embodiments, the term "medium RI", when used with an optional third layer of a period 132, includes a refractive index range from 1.55 to 1.80, 1.56 to 1.80, 1.6 to 1.75, and all indices within these ranges. In some embodiments, the ranges for low RI, medium RI, and/or high RI layers may overlap; however, in most instances, the layers of the outer layered film 120 have the general relationship regarding RI of: low RI<medium RI (where "medium RI" is applicable, e.g., the case of a three-layer period)<high RI. In one or more embodiments, the difference in the refractive index of each of the low RI layers 130A (and/or capping layer 131) and the high RI layers 130B (and/or scratch-resistant layer 150) may be about 0.01 or greater, about 0.05 or greater, about 0.1 or greater, or even about 0.2 or greater.

Materials suitable for use in the outer layered film 120 include: $SiO_2$, $Al_2O_3$, $GeO_2$, SiO, AlOxNy, AlN, SiNx, $SiO_xN_y$, $Si_uAl_vO_xN_y$, $Ta_2O_5$, $Nb_2O_5$, $TiO_2$, $ZrO_2$, TiN, MgO, $MgF_2$, $BaF_2$,$CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, other materials cited below as suitable for use in a scratch resistant layer, and other materials known in the art. Some examples of suitable materials for use in the low RI layers 130A include $SiO_2$, $Al_2O_3$, $GeO_2$, SiO, $AlO_xN_y$, $SiO_xN_y$, $Si_uAl_vO_xN_y$, MgO, $MgAl_2O_4$, $MgF_2$, $BaF_2$, $CaF_2$, $DyF_3$, $YbF_3$, $YF_3$, and $CeF_3$. The nitrogen content of the materials for use in the first low RI layer may be minimized (e.g., in materials such as $Al_2O_3$ and $MgAl_2O_4$). Some examples of suitable materials for use in a medium RI layer 130C include, without limitation, $SiAl_xO_yN_z$, $AlO_xN_y$, $SiO_xN_y$, $HfO_2$, $Y_2O_3$, and $Al_2O_3$. Where a material having a medium refractive index is desired as a medium RIlayer 130C, some embodiments may utilize $SiO_xN_y$, e.g., with a relatively low level of nitrogen (e.g., less than 3%). Some examples of suitable materials for use in the high RI layers 130B include $Si_uAl_vO_xN_y$, $Ta_2O_5$, $Nb_2O_5$, AlN, $Si_3N_4$, $AlO_xN_y$, $SiO_xN_y$, $SiN_x$, $SiN_x$:$H_y$, $HfO_2$, $TiO_2$, $ZrO_2$, $Y_2O_3$, $Al_2O_3$, $MoO_3$ and diamond-like carbon. According to some implementations, each high RI layer 130B of the outer layered film 120 includes a silicon-containing nitride or a silicon-containing oxynitride (e.g., $Si_3N_4$, $SiN_y$, or $SiO_xN_y$). In one or more embodiments, each of the high RI layers 130B may have high hardness (e.g., hardness of greater than 8 GPa), and the high RI materials listed above may comprise high hardness and/or scratch resistance.

In examples, the high RI layer 130B may also be a high hardness layer or a scratch resistant layer (e.g., scratch resistant layer 150 as shown in FIG. 1), and the high RI materials listed above may also comprise high hardness or scratch resistance. In some implementations, the oxygen content of the materials for the high RI layer 130B and/or the scratch resistant layer 150 may be minimized, especially in $SiN_x$ or $AlN_x$ materials. Further, exemplary $SiO_xN_y$ high RI materials may comprise from about 0 atom % to about 20 atom % oxygen, or from about 5 atom % to about 15 atom % oxygen, while including 30 atom % to about 50 atom % nitrogen. The foregoing materials may be hydrogenated up to about 30% by weight. Where a material having a medium refractive index is desired as a medium RI layer, some embodiments may utilize AlN and/or $SiO_xN_y$. In other implementations, each of the high RI layer 130B and/or the scratch resistant layer 150 comprises $SiN_x$ or $SiO_xN_y$. In some embodiments, $AlO_xN_y$ materials may be considered to be oxygen-doped $AlN_x$. That is, these oxygen-doped $AlN_x$ materials may have an $AlN_x$ crystal structure (e.g., wurtzite) and need not have an AlON crystal structure. It should be understood that a scratch-resistant layer 150 may comprise any of the materials disclosed as suitable for use in a high RIlayer 130B.

The hardness of the high RI layers 130B and/or the scratch resistant layer 150 may be characterized specifically. In some embodiments, the maximum hardness of the high RI layers 130B and/or a scratch resistant layer 150, as measured by the Berkovich Indenter Hardness Test at an indentation depth of about 100 nm or greater, may be about 8 GPa or greater, about 10 GPa or greater, about 12 GPa or greater, about 15 GPa or greater, about 18 GPa or greater, or about 20 GPa or greater.

In some cases, the high RI layer 130B material may be deposited as a single layer and may be characterized as a scratch resistant layer (e.g., scratch resistant layer 150), and this single layer may have a thickness between about 200 nm and 10000 nm for repeatable hardness determination. In other embodiments in which the high RI layer 130B is deposited as a single layer, this layer may have a thickness from about 200 nm to about 10000 nm, from about 200 nm to about 5000 nm, from about 500 nm to about 5000 nm, from about 1000 nm to about 4000 nm, from about 1500 nm to about 4000 nm, from about 1500 nm to about 3000 nm, and all thickness values between these thicknesses.

Referring again to the cover articles 100 depicted in FIGS. 1C-1F, according to some embodiments, each of the medium RI layers 130C may have a hardness greater than 10 GPa (or greater than 15 GPa, or greater than 17 GPa) as measured by a Berkovich Hardness Test at an indentation depth of 125 nm. Without being bound by theory, the use of medium RI layers 130C contributes to creating high hardness at shallow depths through two mechanisms: 1) reduction of the amount of low RI, low hardness material in the outer structure 130*a* of the optical film structure 120 (e.g., minimizing the volume of low RI layer(s) 130A); and 2) the inclusion of the relatively higher hardness of the medium RI materials employed in the medium RI layer(s) 130C, as compared to the low RI materials of the low RI layer(s) 130A that are replaced by medium RI materials in the optical film structure 120. In general, the inventors have found that the hardness as measured at 125 nm indentation depth has a good correlation to wear and abrasion resistance in certain abrasion tests, particularly those using lower loads and high numbers of abrasion cycles to simulate repeated real world abrasion events that are common for consumer electronics devices. For additional details and embodiments of the cover articles depicted in FIGS. 1C-1F reference is made to co-assigned U.S. Provisional Application 63/337,846, filed on May 3, 2022, entitled "Transparent glass-ceramic articles with high shallow hardness and display devices with the same," the content of which is incorporated herein by reference in its entirety.

According to embodiments of the cover article 100 depicted in FIG. 1 (along with FIGS. 1A-1F described below), each of the high RI layers 130B of the outer layered film 120 can have a physical thickness that ranges from about 5 nm to 2000 nm, about 5 nm to 1500 nm, about 5 nm to 1000 nm, and all thicknesses and ranges of thickness between these values. For example, each of the high RI layers 130B can have a physical thickness of 5 nm, 10 nm, 20 nm, 30 nm, 40 nm, 50 nm, 60 nm, 70 nm, 80 nm, 90 nm, 100 nm, 250 nm, 500 nm, 750 nm, 1000 nm, 1250 nm, 1500 nm, 1750 nm, 2000 nm and all thickness values between these levels. Further, each of the high RI layers 130B can have a physical thickness that ranges from about 5 nm to 500 nm, about 5 nm to 400 nm, about 5 nm to 300 nm, and all thicknesses and ranges of thickness between these values. As an example, each of these high RI layers 130B can have a physical thickness of 5 nm, 10 nm, 20 nm, 30 nm, 40 nm, 50 nm, 60 nm, 70 nm, 80 nm, 90 nm, 100 nm, 200 nm, 300 nm, 400 nm, 500 nm, and all thickness values between these levels.

In addition, according to some embodiments of the cover articles 100 depicted in FIG. 1 (along with FIGS. 1A-1F below), each of the low RI layers 130A of the outer layered film 120 can have a physical thickness from about 5 nm to 300 nm, about 5 nm to 250 nm, about 5 nm to 200 nm, and all thicknesses and ranges of thickness between these values. For example, each of these low RI layers 130A can have a physical thickness of 5 nm, 10 nm, 20 nm, 30 nm, 40 nm, 50 nm, 60 nm, 70 nm, 80 nm, 90 nm, 100 nm, 150 nm, 200 nm, 250 nm, 300 nm, and all thickness values between these levels.

According to embodiments of the cover article 100 depicted in FIGS. 1C-1F, each of the medium RI layers 130C can have a physical thickness from about 5 nm to 300 nm, about 5 nm to 250 nm, about 5 nm to 200 nm, and all thicknesses and ranges of thickness between these values. For example, each of these medium RI layers 130C can have a physical thickness of 5 nm, 10 nm, 20 nm, 30 nm, 40 nm, 50 nm, 60 nm, 70 nm, 80 nm, 90 nm, 100 nm, 150 nm, 200 nm, 250 nm, 300 nm, and all thickness values between these levels.

In one or more embodiments, at least one of the layer(s) of the outer layered film 120 may include a specific optical thickness range. As used herein, the term "optical thickness" is determined by the product of the physical thickness (d) and the refractive index (n) of a layer. In one or more embodiments, at least one of the layers of the outer layered film 120 may include an optical thickness in the range from about 2 nm to about 200 nm, from about 10 nm to about 100 nm, from about 15 nm to about 100 nm, from about 15 to about 500 nm, or from about 15 to about 5000 nm. In some embodiments, all of the layers in the outer layered film 120 may each have an optical thickness in the range from about 2 nm to about 200 nm, from about 10 nm to about 100 nm, from about 15 nm to about 100 nm, from about 15 nm to about 500 nm, or from about 15 nm to about 5000 nm. In some cases, at least one layer of the outer layered film 120 has an optical thickness of about 50 nm or greater. In some cases, each of the low RI layers 130A and/or the medium RI layers 130C have an optical thickness in the range from about 2 nm to about 200 nm, from about 10 nm to about 100 nm, from about 15 nm to about 100 nm, from about 15 nm to about 500 nm, or from about 15 nm to about 5000 nm. In other cases, each of the high RI layers 130B have an optical thickness in the range from about 2 nm to about 200 nm, from about 10 nm to about 100 nm, from about 15 nm to about 100 nm, from about 15 nm to about 500 nm, or from about 15 nm to about 5000 nm. In some embodiments, the scratch-resistant layer 150 is the thickest layer in the outer layered film 120, and/or has an index of refraction higher than that of any other layer in the film structure.

In some embodiments, the top-most air-side layer of the outer layered film 120 may comprise a high RI layer 130B (not shown) that also exhibits high hardness. In some embodiments, an additional coating (not shown) may be disposed on top of this top-most air-side high RI layer 130B or capping layer 131 (e.g., the additional coating may include a low-friction coating, an oleophobic coating, or an easy-to-clean coating). The addition of a low RI layer 130A and/or capping layer 131 having a very low thickness (e.g., about 10 nm or less, about 5 nm or less, or about 2 nm or less) has minimal influence on the optical performance when added to the top-most air-side layer comprising a high RI layer 130B. The low RI layer 130A having a very low thickness may include $SiO_2$, an oleophobic or low-friction layer, or a combination of $SiO_2$ and an oleophobic material. Exemplary low-friction layers may include diamond-like carbon. Such materials (or one or more layers of the outer layered film 120) may exhibit a coefficient of friction less than 0.4, less than 0.3, less than 0.2, or even less than 0.1.

In one or more embodiments, the combined physical thickness of the high RI layer(s) 130B may be characterized. For example, in some embodiments, the combined thickness of the high RI layer(s) 130B may be about 100 nm or greater, about 150 nm or greater, about 200 nm or greater, about 250 nm or greater, about 300 nm or greater, about 350 nm or greater, about 400 nm or greater, about 450 nm or greater, about 500 nm or greater, about 550 nm or greater, about 600 nm or greater, about 650 nm or greater, about 700 nm or greater, about 750 nm or greater, about 800 nm or greater, about 850 nm or greater, about 900 nm or greater, about 950 nm or greater, or even about 1000 nm or greater. The combined thickness is the calculated combination of the thicknesses of the individual high RI layer(s) 130B in the outer layered film 120, even when there are intervening low RI layer(s) 130A or other layer(s). In some embodiments, the combined physical thickness of the high RI layer(s) 130B, which may also comprise a high-hardness material (e.g., a nitride or an oxynitride material), may be greater than 30% of the total physical thickness of the outer layered film 120. For example, the combined physical thickness of the high RI layer(s) 130B may be about 25% or greater, 30% or greater, 35% or greater, 40% or greater, about 50% or greater, or even about 60% or greater, of the total physical thickness of the outer layered film 120.

The cover article 100 may include one or more additional coatings disposed on the outer layered film 120. In one or more embodiments, the additional coating may include an easy-to-clean coating. An example of a suitable easy-to-clean coating is described in U.S. patent application Ser. No. 13/690,904, entitled "Process for Making of Glass Articles with Optical and Easy-to-Clean Coatings," filed on Nov. 30, 2012, and published as U.S. Patent Application Publication No. 2014/0113083 on Apr. 24, 2014, and the salient portions of this application are incorporated by reference herein in their entirety. The easy-to-clean coating may have a thickness in the range from about 5 nm to about 50 nm and may include known materials such as fluorinated silanes. The easy-to-clean coating may alternately or additionally comprise a low-friction coating or surface treatment. Exemplary low-friction coating materials may include diamond-like carbon, silanes (e.g., fluorosilanes), phosphonates, alkenes, and alkynes. In some embodiments, the easy-to-clean coating may have a thickness in the range from about 1 nm to about 40 nm, from about 1 nm to about 30 nm, from about 1 nm to about 25 nm, from about 1 nm to about 20 nm, from about 1 nm to about 15 nm, from about 1 nm to about 10 nm, from about 5 nm to about 50 nm, from about 10 nm to about 50 nm, from about 15 nm to about 50 nm, from about 7 nm to about 20 nm, from about 7 nm to about 15 nm, from about 7 nm to about 12 nm or from about 7 nm to about 10 nm, and all ranges and sub-ranges therebetween.

The additional coating may include a scratch resistant layer or layers (e.g., with a composition similar to scratch resistant layer 150). In some embodiments, the additional coating includes a combination of easy-to-clean material and scratch resistant material. In one example, the combination includes an easy-to-clean material and diamond-like carbon. Such additional coatings may have a thickness in the range from about 5 nm to about 20 nm. The constituents of the additional coating may be provided in separate layers. For example, the diamond-like carbon may be disposed as a first layer and the easy-to clean material can be disposed as a second layer on the first layer of diamond-like carbon. The thicknesses of the first layer and the second layer may be in the ranges provided above for the additional coating. For example, the first layer of diamond-like carbon may have a thickness of about 1 nm to about 20 nm or from about 4 nm to about 15 nm (or more specifically about 10 nm) and the second layer of easy-to-clean material may have a thickness of about 1 nm to about 10 nm (or more specifically about 6 nm). The diamond-like coating may include tetrahedral amorphous carbon (Ta—C), Ta—C:H, and/or a-C—H.

Figure 1B:
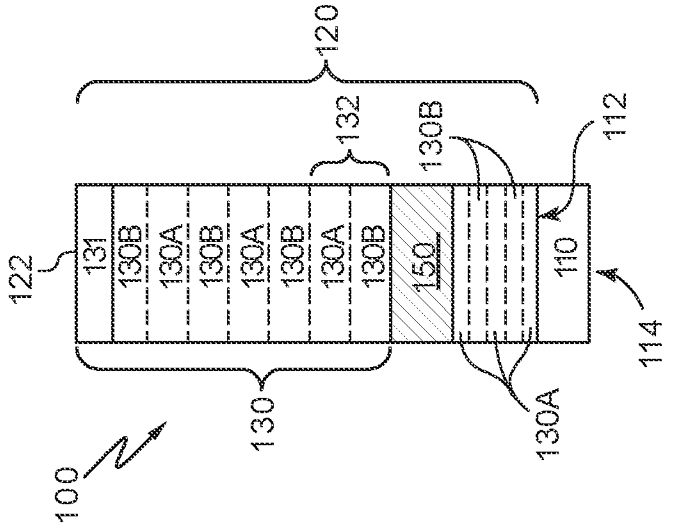
FIG. 1B is a cross-sectional side view of a cover article, according to one or more embodiments described herein.

As mentioned herein, the outer layered film 120 includes a scratch resistant layer 150, which may be disposed within the outer layered film 120 (as shown in FIGS. 1-1B), directly on the substrate 110 (not shown) or at the outermost surface 122 of the outer layered film 120 (not shown). In some embodiments, as shown in FIGS. 1-1B, the scratch resistant layer 150 is disposed between the layers of the outer layered film 120 such that an antireflective region 130 is located above the scratch resistant layer 150 and another portion of the outer layered film 120 is below the layer 150 and above the substrate 110. In embodiments, the portion of the outer layered film 120 below the layer 150 serves as an optical interference layer, which can function to bridge the difference in refractive indices of the substrate 110 and the scratch resistant layer 150 and comprises alternating high and low refractive index layers 130B, 130A. The two sections of the outer layered film 120 (i.e., a first section disposed between the scratch resistant layer 150 and the substrate 110, and the antireflective region 130 disposed on the scratch resistant layer 150) may have a different thickness from one another or may have essentially the same thickness as one another. The layers of the two sections of the outer layered film 120 may be the same in composition, order, thickness and/or arrangement as one another or may differ from one another. In addition, the layers of the two sections of the outer layered film 120 may comprise the same number of periods 132(N) or the number of periods 132 in each of these sections may differ from one another (see periods 132 shown in FIGS. 1-1B).

Exemplary materials used in the scratch resistant layer 150 (or the scratch resistant layer used as an additional coating, as noted earlier) may include an inorganic carbide, nitride, oxide, diamond-like material, or combination of these. Examples of suitable materials for the scratch resistant layer 150 include metal oxides, metal nitrides, metal oxynitride, metal carbides, metal oxycarbides, and/or combinations thereof. Exemplary metals include B, Al, Si, Ti, V, Cr, Y, Zr, Nb, Mo, Sn, Hf, Ta and W. Specific examples of materials that may be utilized in the scratch resistant layer 150 or coating may include $Si_uAl_vO_xN_y$, $Ta_2O_5$, $Nb_2O_5$, AlN, $AlN_x$, $SiAl_xN_y$, $AlN_x/SiAl_xN_y$, $Si_3N_4$, $AlO_xN_y$, $SiO_xN_y$, $SiN_y$, $SiN_x$:$H_y$, $HfO_2$, $TiO_2$, $ZrO_2$, $Y_2O_3$, $Al_2O_3$, $MoO_3$, diamond, diamond-like carbon, $Si_xC_y$, $Si_xO_yC_z$, $TiO_xN_y$ and combinations thereof. Examples of suitable materials for the scratch-resistant layer 150 include metal oxides, metal nitrides, metal oxynitride, metal carbides, metal oxycarbides, and/or combinations thereof. Exemplary metals include B, Al, Si, Ti, V, Cr, Y, Zr, Nb, Mo, Sn, Hf, Ta and W. Specific examples of materials that may be utilized in the scratch-resistant layer 150 may include $Al_2O_3$, AlN, $AlO_xN_y$, $Si_3N_4$, $SiO_xN_y$, $Si_uAl_vO_xN_y$, diamond, diamond-like carbon, $Si_xC_y$, $Si_xO_yC_z$, $ZrO_2$, $TiO_xN_y$, and combinations thereof. In some implementations, the scratch-resistant layer 150 may include $Si_3N_4$, $SiN_y$, $SiO_xN_y$, and combinations thereof. In embodiments, each of the scratch-resistant layers 150 employed in the cover article 100 exhibits a fracture toughness value greater than about 1 MPa m and simultaneously exhibits a hardness value greater than about 10 GPa, as measured by a Berkovich Hardness Test.

The scratch resistant layer 150 may also comprise nanocomposite materials, or materials with a controlled microstructure to improve hardness, toughness, or abrasion/wear resistance. For example, the scratch resistant layer 150 may comprise nanocrystallites in the size range from about 5 nm to about 30 nm. In embodiments, the scratch resistant layer 150 may comprise transformation-toughened zirconia, partially stabilized zirconia, or zirconia-toughened alumina. In embodiments, the scratch resistant layer 150 exhibits a fracture toughness value greater than about 1 MPa m and simultaneously exhibits a hardness value greater than about 8 GPa.

Figure 1C:
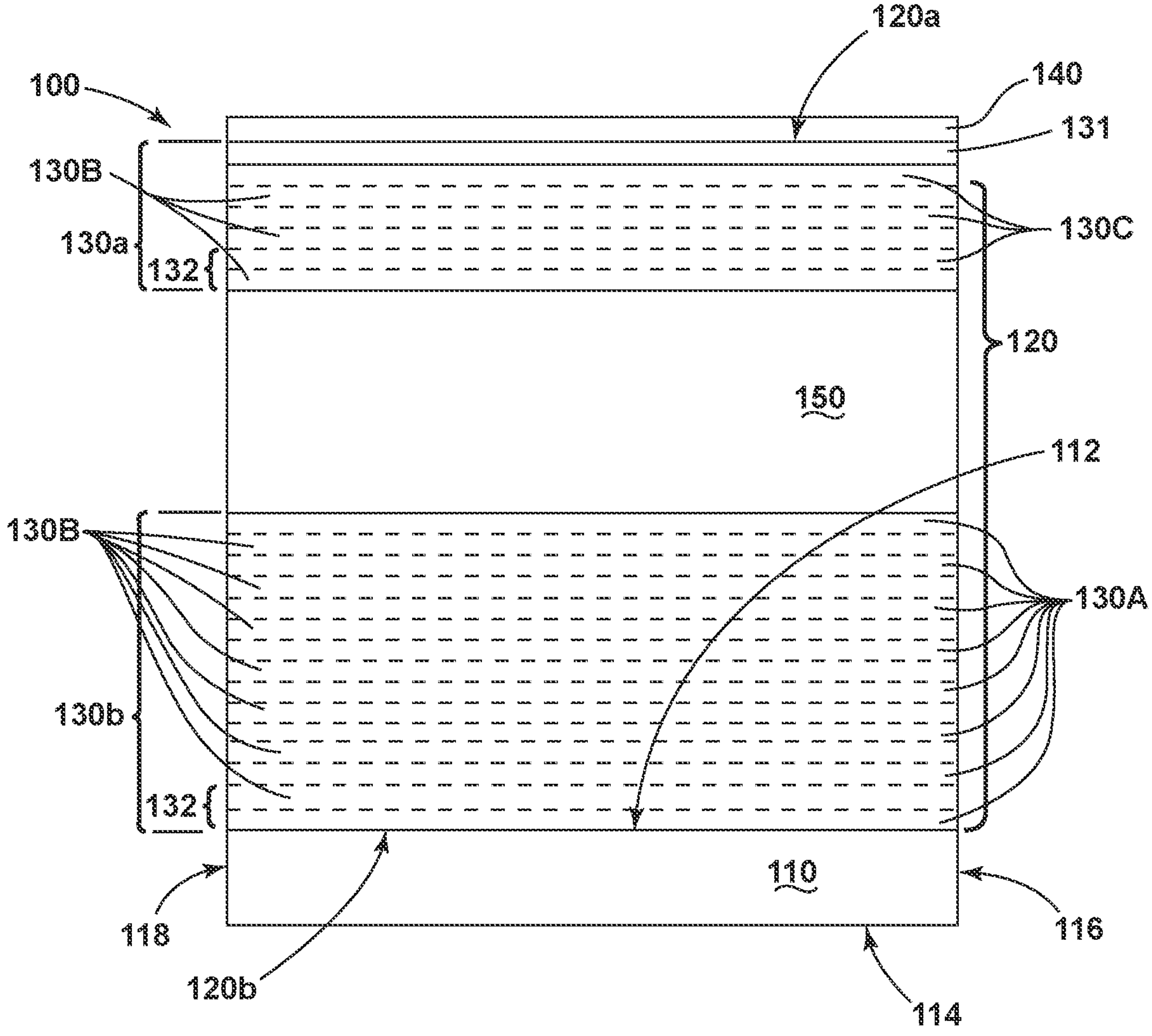
FIG. 1C is a cross-sectional side view of a cover article, according to one or more embodiments described herein.

The scratch resistant layer 150 may include a single layer (as shown in FIGS. 1-1C), or multiple sub-layers or single layers that exhibit a refractive index gradient. Where multiple layers are used, such layers form a scratch resistant coating. For example, a scratch resistant layer 150 may include a compositional gradient of $Si_uAl_vO_xN_y$ where the concentration of any one or more of Si, Al, O and N are varied to increase or decrease the refractive index. The refractive index gradient may also be formed using porosity. Such gradients are more fully described in U.S. patent application Ser. No. 14/262,224, entitled "Scratch-Resistant Articles with a Gradient Layer", filed on Apr. 25, 2014, and now issued as U.S. Pat. No. 9,703,011 on Jul. 11, 2017, the salient portions of which are hereby incorporated by reference in their entirety.

In other embodiments, the scratch resistant layer 150 may include a single layer (as shown in FIGS. 1-1C), or multiple sub-layers or single layers that exhibit a refractive index gradient, or a thick high hardness portion in addition to a refractive gradient portion. The gradient portion is characterized by gradual changes in refractive index. For example, some or all of the refractive index transitions in the layer structure may be characterized by an absolute (positive or negative) value of refractive index 'slope' of 0.1/nm or less (meaning less than 0.1 refractive index change per nm of coating thickness), 0.05/nm or less (or less than about 0.5 per 10 nm), 0.02/nm or less (or less than 0.2 per 10 nm), 0.016/nm or less, 0.012/nm or less, or even 0.01/nm or less (less than about 0.1 per 10 nm). In some embodiments, the refractive index slope of a gradient portion is 0.001 or more, 0.002 or more, or 0.005 or more. The refractive index gradient may be implemented as a continuous change in refractive index, or as a series of small steps in refractive index. For example, the refractive index slopes discussed herein are measured and calculated over a refractive index interval of 0.04. In other words, the refractive index slope is 0.04 divided by the distance over which the refractive index changes by 0.04. This methodology causes the distance between steps in refractive index to be considered when calculating a refractive index slope where the step sizes are 0.04 or less. In some embodiments, the refractive index interval over which a refractive index slope is calculated may be 0.02, 0.03, 0.04, 0.05 or 0.06. For example, the scratch resistant layer 150 may include a compositional gradient of $Si_uAl_vO_xN_y$ where the concentration of at least two of Si, Al, O and N are varied to increase or decrease the refractive index. The refractive index gradient may be a gradient selected from at least one of a porosity gradient, a density gradient and an elastic modulus gradient. Such gradients are more fully described in U.S. patent application Ser. No. 16/643,339, filed Feb. 28, 2020, and entitled "Hybrid Gradient-Interference Hard Coatings", the content of which is hereby incorporated by reference in their entirety.

The scratch resistant layer 150 may have a thickness from about 200 nm to about 5000 nm, according to some embodiments. Each of the scratch-resistant layers 150, as shown in exemplary form in the cover article 100 depicted in FIGS. 1-1C, may be relatively thick as compared with other layers (e.g., low RI layers 130A, high RI layers 130B, capping layer 131, etc.) such as greater than or equal to about 50 nm, 60 nm, 70 nm, 75 nm, 80 nm, 90 nm, 100 nm, 150 nm, 200 nm, 250 nm, 300 nm, 325 nm, 350 nm, 375 nm, 400 nm, 425 nm, 450 nm, 475 nm, 500 nm, 525 nm, 550 nm, 575 nm, 600 nm, 700 nm, 800 nm, 900 nm, 1 micron, 2 microns, 3 microns, 4 microns, 5 microns, 6 microns, 7 microns, or even 8 microns. In some implementations, the scratch resistant layer 150 has a thickness from about 50 nm to about 10000 nm, about 80 nm to about 10000 nm, about 100 nm to about 10000 nm, about 200 nm to about 10000 nm, from about 200 nm to about 7500 nm, from about 200 nm to about 5000 nm, from about 200 nm to about 3000 nm, from about 500 nm to about 5000 nm, from about 500 nm to about 3000 nm, from about 500 nm to about 2500 nm, from about 1000 nm to about 4000 nm, from about 1500 nm to about 4000 nm, from about 1500 nm to about 3000 nm, and all thickness values between these thicknesses. For example, the thickness of the scratch resistant layer 150 can be 200 nm, 300 nm, 400 nm, 500 nm, 600 nm, 700 nm, 800 nm, 900 nm, 1000 nm, 1100 nm, 1200 nm, 1300 nm, 1400 nm, 1500 nm, 1600 nm, 1700 nm, 1800 nm, 1900 nm, 2000 nm, 2100 nm, 2200 nm, 2300 nm, 2400 nm, 2500 nm, 2600 nm, 2700 nm, 2800 nm, 2900 nm, 3000 nm, 3500 nm, 4000 nm, 4500 nm, 5000 nm, 7500 nm, 10000 nm, and all thickness sub-ranges and thickness values between the foregoing thicknesses.

In one exemplary embodiment of the cover article 100 of the disclosure, as depicted in FIG. 1, the outer layered film 120 may comprise a scratch resistant layer 150 that is of the same composition as a high RI layer 130B, and one or more low RI layers 130A and high RI layers 130B may be respectively and alternately positioned over the scratch resistant layer 150, with an optional capping layer 131 positioned over the low RI layers 130A and high RI layers 130B, where the capping layer 131 comprises a low RI material. In this configuration, the low RI layers 130A, high RI layers 130B and the capping layer 131 define an antireflective region 130. The scratch resistant layer 150 may be alternately defined as the thickest hard layer or the thickest high RI layer in the overall outer layered film 120 or in the overall cover article 100. Without being bound by theory, it is believed that the cover article 100 may exhibit increased hardness at indentation depths when a relatively thin amount of material is deposited over the scratch resistant layer 150. However, the inclusion of low RI and high RI layers over the scratch resistant layer 150 may enhance the optical properties of the cover article 100.

In some embodiments of the cover article 100 of FIG. 1, relatively few layers (e.g., only 1, 2, 3, 4, or 5 layers) may be positioned over the scratch resistant layer 150 in the antireflective region 130 and these layers may each be relatively thin (e.g., less than 100 nm, less than 75 nm, less than 50 nm, or even less than 25 nm). In other embodiments, a larger quantity of layers (e.g., 3 to 15 layers) may be positioned over the scratch resistant layer 150 in the antireflective region 130 and each of these layers may also be relatively thin (e.g., less than 200 nm, less than 175 nm, less than 150 nm, less than 125 nm, less than 100 nm, less than 75 nm, less than 50 nm, and even less than 25 nm).

In one implementation of the embodiment of the cover article 100 depicted in FIG. 1, the antireflective region 130 may include three (3) periods 132 above the scratch resistant layer 150 and a capping layer 131. Further, two (2) periods 132 exist below the scratch resistant 150 layer, and the additional low RI layer 130A below the scratch resistant layer 150 and the scratch resistant layer 150 itself make up an additional period 132. As such, in this configuration, the outer layered film 120 has six periods 132 (i.e., N=6) and the capping layer 131. In another implementation of the embodiment depicted in FIG. 1, the region of the outer layered film 120 below the scratch resistant layer 150 includes six periods 132 (as detailed in Examples 1 and 3, discussed in detail below). As such, the outer layered film 120 in this configuration hasten periods 132 (i.e., N=10). In a further implementation of the embodiment depicted in FIG. 1, the region of the outer layered film 120 below the scratch resistant layer 150 includes five (5) periods 132 (as detailed in Examples 2 and 4, discussed in detail below). As such, the outer layered film 120 in this configuration has nine periods 132 (i.e., N=9).

In another exemplary implementation of the cover article 100 of the disclosure, as depicted in FIG. 1A, the antireflective region 130 may include one (1) period 132 above the scratch resistant layer 150, and a capping layer 131. Further, two (2) periods 132 exist below the scratch resistant 150 layer, and the additional low RI layer 130A below the scratch resistant layer 150 and the scratch resistant layer 150 itself makeup an additional period 132. As such, in this configuration, the outer layered film 120 has four periods 132 (i.e., N=4) and the capping layer 131.

In another exemplary implementation of the cover article 100 of the disclosure, as depicted in FIG. 1B, the outer layered film 120 may comprise a scratch resistant layer 150 that is of the same composition as a high RI layer 130B, and one or more high RI layers 130B and low RI layers 130A may be respectively and alternately positioned over the scratch resistant layer 150, with an optional capping layer 131 positioned over a high RI layer 130B, where the capping layer 131 comprises a low RI material. In this configuration, the low RI layers 130A, high RI layers 130B and the capping layer 131 define the antireflective region 130. In the exemplary embodiment depicted in FIG. 1B, the antireflective region 130 may include four (4) periods 132 (i.e., each period 132 is a high RI layer 130B, and a low RI layer 130A or capping layer 131) above the scratch resistant layer 150. Further, two (2) periods 132 exist below the scratch resistant layer 150, and the additional low RI layer 130A below the scratch resistant layer 150 and the scratch resistant layer 150 itself make up an additional period 132. As such, in this configuration, the outer layered film 120 has seven periods 132 (i.e., N=7). In another implementation of the embodiment depicted in FIG. 1B (as detailed in Examples 5 and 6, discussed in detail below), the region of the outer layered film 120 below the scratch resistant layer 150 includes five (5) periods 132; the additional low RI layer 130A below the scratch resistant layer 150 and the scratch resistant layer 150 itself make up an additional period 132; and the antireflective region 130 includes five (5) periods 132. As such, the outer layered film 120 in this configuration has eleven periods 132 (i.e., N=11).

In another exemplary implementation of the cover article 100 of the disclosure, as depicted in FIGS. 1C-1F, the cover article 100 may include a substrate 110, and an outer layered film 120 defining an outer surface 120*a* and an inner surface 120*b* disposed on the substrate 110. The substrate 110 includes opposing primary surfaces 112, 114 and opposing secondary surfaces 116, 118. The outer layered film 120 is shown in FIGS. 1C-1F, with its inner surface 120*b* disposed on a first opposing primary surface 112 and outer layered films are shown as being disposed on the second opposing primary surface 114. In some embodiments, however, one or more of the outer layered films 120 can be disposed on the second opposing primary surface 114 and/or on one or both of the opposing secondary surfaces 116, 118. As shown in FIGS. 1C-1F, and outlined above, the cover articles 100 of the disclosure include an outer layered film 120 with one or more of an outer structure 130*a* and inner structure 130*b*. The outer layered film 120 includes a plurality of alternating low RI and high RI layers, 130A and 130B, respectively. In embodiments, each, or one of, the outer and inner structures 130*a*, 130*b* includes a plurality of alternating low RI and high RI layers, 130A and 130B, respectively. In embodiments, each, or one of, the outer and inner structures 130*a*, 130*b* includes a plurality of alternating medium RI and high RI layers, 13° C. and 130B, respectively. In some preferred implementations, the outer structure 130*a* includes at least one medium RI layer 130C in contact with one of the high RI layers 130B and the scratch-resistant layer 150. In some preferred implementations, the outer structure 130*a* is inclusive of at least one outermost capping layer 131, as depicted in exemplary form in FIGS. 1C-1F.

As an example, in FIGS. 1C-1F the periods 132 of the outer or inner structures 130*a*, 130*b* include a low RI layer 130A and a high RI layer 130B or a medium RI layer 130C and a high RI layer 130B. When a plurality of periods is included in either or both of the outer and inner structures 130*a* and 130*b*, the low RI layers 130A (designated as “L”), the medium RI layers 130C (designated “M”), and the high RI layers 130B (designated as “H”) can alternate in the following sequence of layers: L/H/L/H . . . , H/L/H/L . . . , M/H/M/H . . . , H/M/H/M . . . , such that the low RI layers 130A and the high RI layers 130B, or the medium RI layers 130C and the high RI layers 130B, alternate along the physical thickness of the outer and inner structures 130*a*, 130*b* of the outer layered film 120. In preferred implementations, as shown in FIGS. 1C-1F, the periods 132 in the outer structures 130*a* are configured as H/M/H/M . . . above the scratch-resistant layer 150; and the periods 132 in the inner structures 130*b* are configured as L/H/L/H . . . above the substrate 110 and beneath the scratch-resistant layer 150.

In an implementation of the cover article 100, as shown in FIG. 1C, the number of periods 132 of the outer and inner structures 130*a* and 130*b* can be configured such that the outer structure 130*a* includes a total of six (6) alternating layers (e.g., alternating medium and high RI layers 130C and 130B); and the inner structure 130*b* includes at least fifteen (15) layers (e.g., alternating low RI and high RI layers 130A, 130B, respectively). Further, in this implementation, the outer structure 130*a* of the outer layered film 120 includes a capping layer 131 (similar in structure and thickness to a low RI layer 130A) over the outer structure 130*a*; and a scratch-resistant layer 150 between the outer and inner structures 130*a* and 130*b*.

Figure 1D:
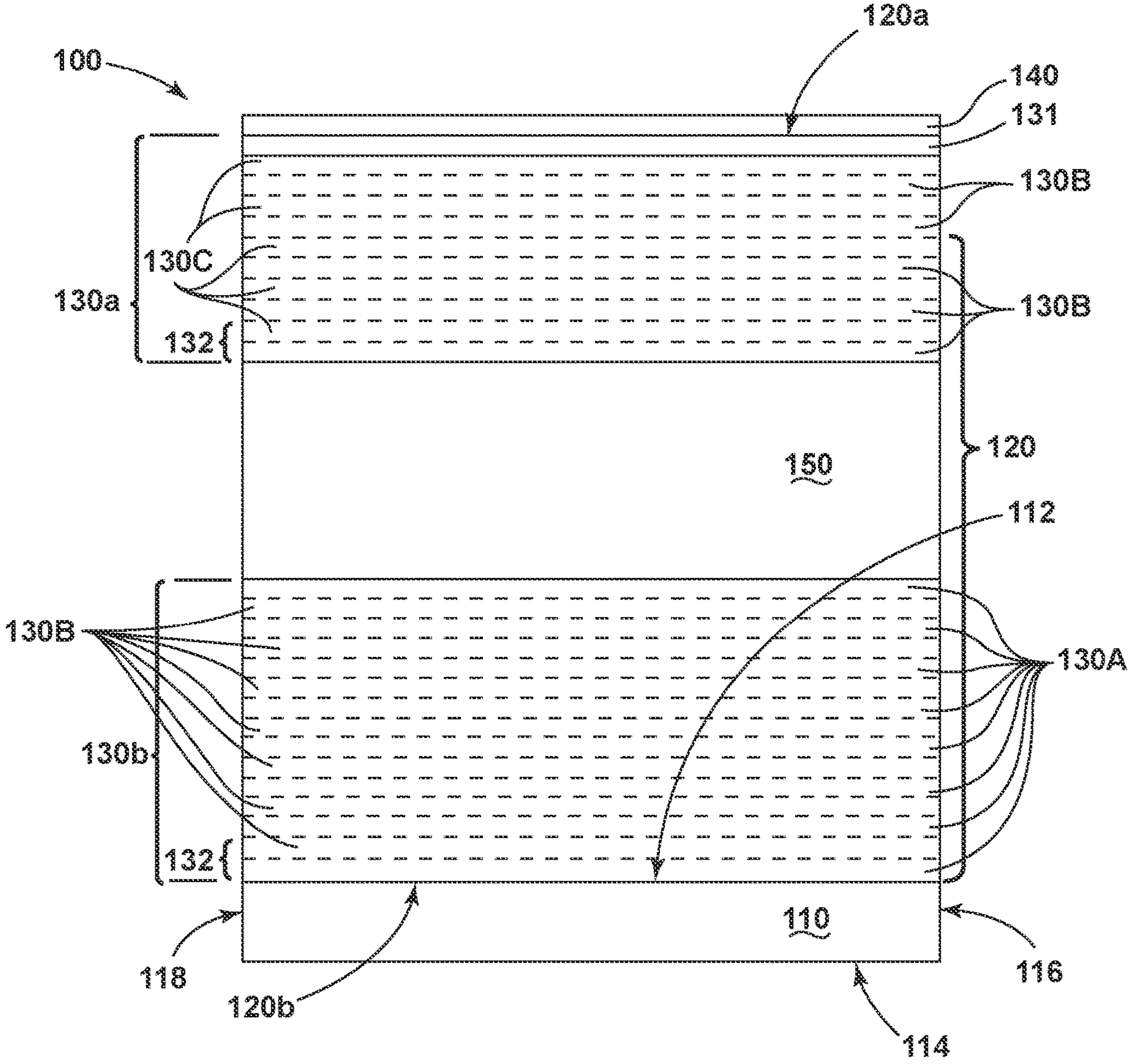
FIG. 1D is a cross-sectional side view of a cover article, according to one or more embodiments described herein.

In an implementation of the cover article 100, as shown in FIG. 1D, the number of periods 132 of the outer and inner structures 130*a* and 130*b* can be configured such that the outer structure 130*a* includes a total of ten (10) alternating layers (e.g., alternating medium and high RI layers 130C and 130B); and the inner structure 130*b* includes at least fifteen (15) layers (e.g., alternating low RI and high RI layers 130A, 130B, respectively). Further, in this implementation, the outer structure 130*a* of the outer layered film 120 includes a capping layer 131 (similar in structure and thickness to a low RI layer 130A) over the outer structure 130*a*; and a scratch-resistant layer 150 between the outer and inner structures 130*a* and 130*b*.

Figure 1E:
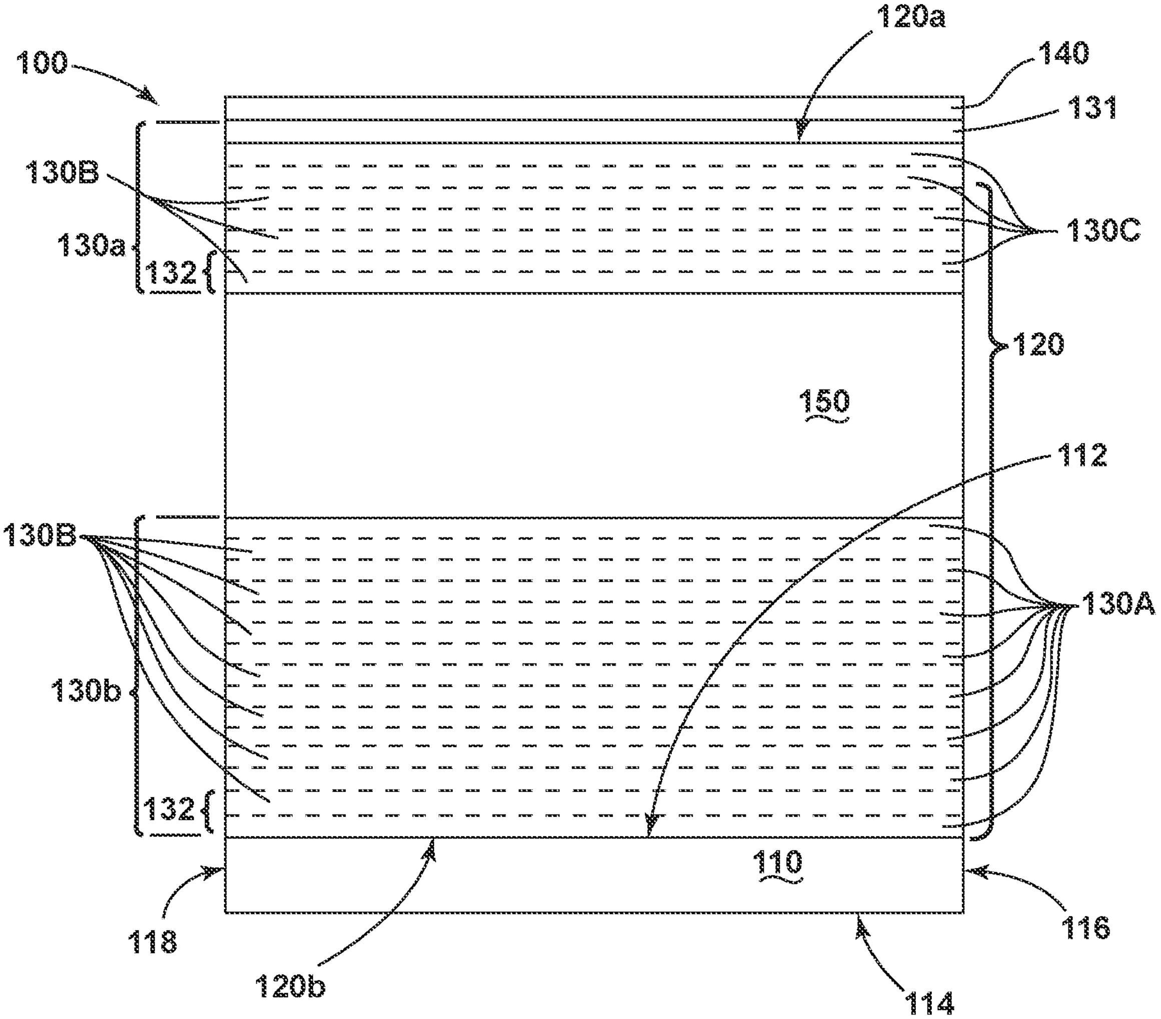
FIG. 1E is a cross-sectional side view of a cover article, according to one or more embodiments described herein.
Figure 1F:
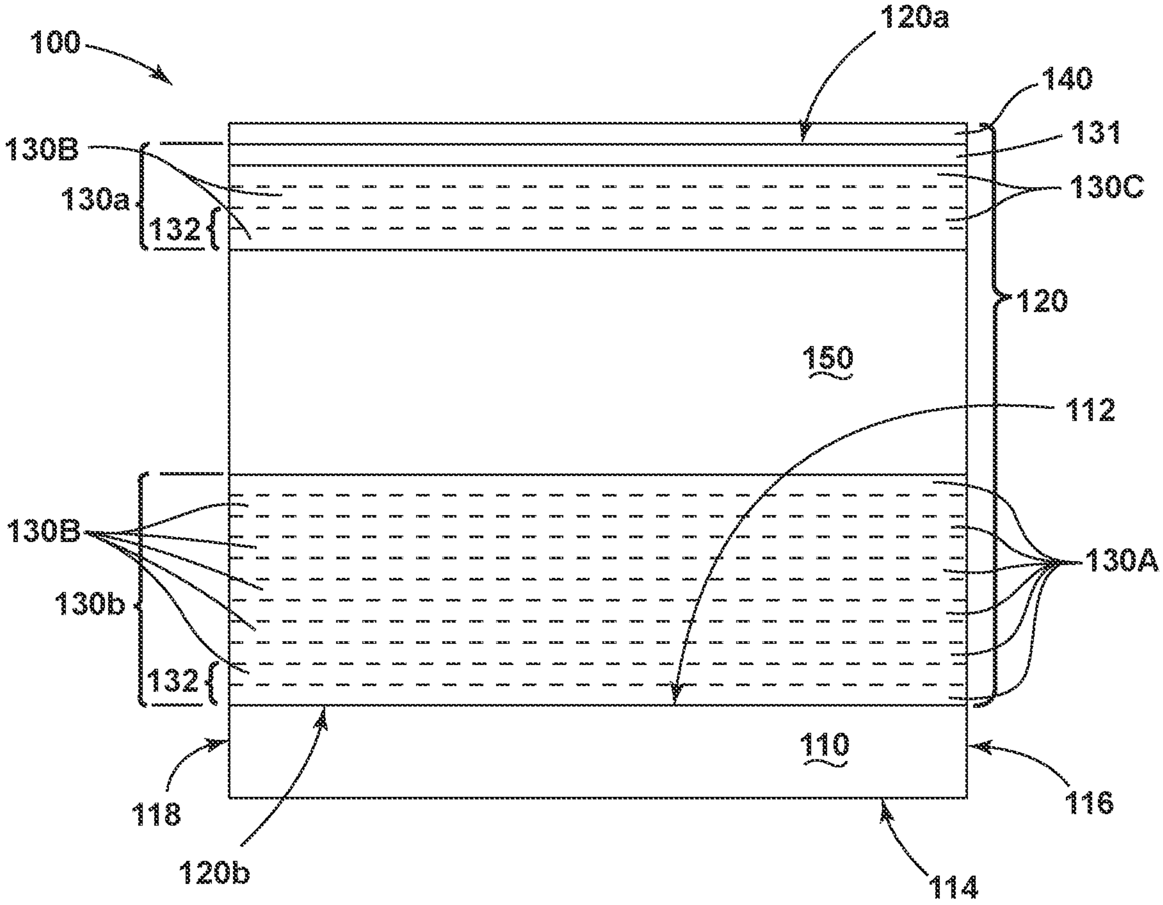
FIG. 1F is a cross-sectional side view of a cover article, according to one or more embodiments described herein.

In an implementation of the cover article 100, as shown in FIG. 1E, the number of periods 132 of the outer and inner structures 130*a* and 130*b* can be configured such that the outer structure 130*a* includes a total of six (6) alternating layers (e.g., alternating medium and high RI layers 130C and 130B) and an additional, repeating medium RI layer 130C adjacent to another medium RI layer 130C; and the inner structure 130*b* includes at least fifteen (15) layers (e.g., alternating low RI and high RI layers 130A, 130B, respectively). Further, in this implementation, the outer structure 130*a* of the outer layered film 120 includes a capping layer 131 (similar in structure and thickness to a low RI layer 130A) over the outer structure 130*a*; and a scratch-resistant layer 150 between the outer and inner structures 130*a* and 130*b*.

In an implementation of the cover article 100, as shown in FIG. 1F, the number of periods 132 of the outer and inner structures 130*a* and 130*b* can be configured such that the outer structure 130*a* includes a total of four (4) alternating layers (e.g., alternating medium and high RI layers 130C and 130B); and the inner structure 130*b* includes at least eleven (11) layers (e.g., alternating low RI and high RI layers 130A, 130B, respectively). Further, in this implementation, the outer structure 130*a* of the outer layered film 120 includes a capping layer 131 (similar in structure and thickness to a low RI layer 130A) over the outer structure 130*a*; and a scratch-resistant layer 150 between the outer and inner structures 130*a* and 130*b*.

According to another implementation of the cover articles 100 of the disclosure (not shown), the number of periods 132 of the antireflective region 130 and interference layer below the scratch-resistant layer 150 can be configured such that the antireflective region 130 includes at least two (2) layers (e.g., an alternating low and high RI layer 130A and 130B) and the interference layer includes at least seven (7) layers (e.g., two periods 132 of alternating low RI and high RI layers 130A, 130B, and an additional period 132 of three (3) layers, alternating low RI/high RI/low RI layers 130A, 130B). Also, in this implementation, the outer layered film 120 and antireflective region 130 includes a capping layer 131 (similar in structure and thickness to a low RI layer 130A); and a scratch-resistant layer 150 between the antireflective region 130 and interference layer.

According to some embodiments of the cover article 100 depicted in FIGS. 1-1B, the outermost capping layer 131 of the outer layered film 120 may not be exposed but instead have atop coating disposed thereon (not shown). According to some embodiments of the cover article 100 depicted in FIGS. 1C-1F, the outermost capping layer 131 of the outer layered film 120 may not be exposed but instead have a top coating 140 disposed thereon. In some implementations of the cover article 100, each high RI layer 130B of the outer film layer 120 comprises a nitride, a silicon-containing nitride (e.g., $SiN_y$, $Si_3N_4$), an oxynitride, or a silicon-containing oxynitride (e.g., $SiAl_xO_yN_z$ or $SiO_xN_y$). Further, according to some embodiments, each low RI layer 130A of the outer layered film 120 comprises an oxide or a silicon-containing oxide (e.g., $SiO_2$, $SiO_x$ or $SiO_2$ as doped with Al, N or F).

According to embodiments of the cover article 100, as depicted in exemplary form in FIGS. 1-1F, the cover article can achieve an excellent combination of low reflectance in the infrared spectrum or visible and infrared spectrum and high scratch resistance and/or hardness with certain structural features in the antireflective region 130 of the outer layered film 120. These structural features include a thicker than typical thickness of the capping layer 131; lower than typical combined thickness of the low refractive index layers; and/or a specified range of thickness for the antireflective region 130.

Accordingly, embodiments of the cover article 100, as depicted in exemplary form in FIGS. 1-1F, are configured such that the capping layer 131 has a thickness of at least 110 nm, 120 nm, 130 nm, 140 nm, or even 150 nm. In some embodiments of the cover article 100, the capping layer 131 has a thickness from about 110 nm to about 200 nm, from about 110 nm to about 175 nm, or from about 110 nm to about 150 nm. For example, the capping layer 131 can have a thickness of about 110 nm, 115 nm, 120 nm, 125 nm, 130 nm, 140 nm, 150 nm, 160 nm, 170 nm, 180 nm, 190 nm, 200 nm, and all thickness values between the foregoing ranges and sub-ranges. Alternatively, or in addition, the cover article 100 can be configured such that the low refractive index layers 130A of the antireflective region 130 have a combined thickness of less than 295 nm, 285 nm, 275 nm, 250 nm, 240 nm, 230 nm, 220 nm, or 210 nm. In some embodiments, the combined thickness of the low RI layers 130A in the antireflective region 130 can range from about 200 nm to about 295 nm, from about 200 nm to about 275 nm, or from about 200 nm to about 250 nm, and all combined thickness values between the foregoing ranges. Alternatively, or in addition, the cover article 100 can be configured with antireflective region 130 having a thickness that ranges from about 100 nm to about 525 nm, from about 150 nm to about 525 nm, or from about 200 nm to about 525 nm. In some embodiments of the cover article 100, the thickness of the antireflective region 130 can be about 100 nm, 125 nm, 150 nm, 175 nm, 200 nm, 225 nm, 250 nm, 275 nm, 300 nm, 325 nm, 350 nm, 375 nm, 400 nm, 425 nm, 450 nm, 475 nm, 500 nm, 525 nm, and all thickness values between the foregoing ranges and subs-ranges.

The outer layered film 120 and/or the cover article 100 may be described in terms of a hardness measured by the Berkovich Indenter Hardness Test. As noted earlier, the Berkovich Indenter Hardness Test includes indenting the outermost surface 122 of the cover article 100 (see FIGS. 1-1F) or the surface of any one or more of the layers in the outer layered film 120 with the diamond Berkovich indenter to form an indent to an indentation depth in the range from about 50 nm to about 1000 nm (or the entire thickness of the outer layered film 120 or layer thereof, whichever is less) and measuring the maximum hardness from this indentation along the entire indentation depth range or a segment of this indentation depth (e.g., in the range from about 100 nm to about 600 nm, e.g., at an indentation depth of 100 nm or greater, etc.).

In some embodiments, the cover article 100 (e.g., as depicted in FIGS. 1-1F) may exhibit a maximum hardness of about 8 GPa or greater, about 10 GPa or greater, about 11 GPa or greater, about 12 GPa or greater, about 13 GPa or greater, about 14 GPa or greater, about 16 GPa or greater, about 18 GPa or greater, or even about 20 GPa or greater, when measured at the outermost surface 122 by a Berkovich Indenter Hardness Test over an indentation depth from about 100 nm to about 500 nm, or over an indentation depth from about 100 nm to 900 nm. The hardness of the cover article 100 may even be up to about 20 GPa or 30 GPa. Such measured hardness values may be exhibited by the outer layered film 120 and/or the cover article 100 along an indentation depth of about 50 nm or greater, or about 100 nm or greater (e.g., from about 50 nm to about 300 nm, from about 50 nm to about 400 nm, from about 50 nm to about 500 nm, from about 50 nm to about 600 nm, from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm). Such hardness values can also be measured from the outermost surface 122 of the outer layered film 120 to a depth of 200 nm. In one or more embodiments, the cover article 100 exhibits a hardness that is greater than the hardness of the substrate 110 (which can be measured on the opposite surface from the outermost surface 122).

According to some embodiments of the cover article 100, the cover article 100 can exhibit a maximum hardness of 8 GPa, 9 GPa, 10 GPa, 11 GPa, 12 GPa, 13 GPa, 14 GPa, 15 GPa, 16 GPa, 17 GPa, 18 GPa, 19 GPa, 20 GPa, or greater, as measured from the outermost surface 122 of the outer layered film 120 by a Berkovich Indenter Hardness Test over an indentation depth from about 100 nm to about 500 nm. In some implementations, the maximum hardness of the cover article 100 is greater than 8 GPa, 9 GPa, 10 GPa, 11 GPa, 12 GPa, 13 GPa, 14 GPa, 15 GPa, 16 GPa, 17 GPa, 18 GPa, or 19 GPa, at an indentation depth of 100 nm. In some implementations, the maximum hardness of the cover article 100 is greater than 8 GPa, 9 GPa, 10 GPa, 11 GPa, 12 GPa, 13 GPa, 14 GPa, 16 GPa, 17 GPa, 18 GPa, or 19 GPa, at an indentation depth of 500 nm. Further, according to some implementations, the cover article 100 may exhibit a maximum hardness of about 8 GPa or greater, 10 GPa or greater, about 12 GPa or greater, or about 14 GPa or greater, 15 GPa or greater, 16 GPa or greater, 17 GPa or greater, or even 18 GPa or greater, as measured from the outermost surface 122 of the outer layered film 120 by a Berkovich Indenter Hardness Test over indentation depth ranges from about 100 nm to 500 nm, from about 100 nm to about 900 nm, or from about 200 nm to about 900 nm With further regard to the residual compressive stress and elastic modulus levels (along with hardness levels) of the outer layered film 120, these properties can be controlled through adjustments to the stoichiometry and/or thicknesses of the low RI layers 130A, high RI layers 130B, capping layer 131 and scratch resistant layer 150. In embodiments, the residual compressive stress (e.g., to greater than or equal to 700 MPa, 700 MPa to 1100 MPa, etc.) and elastic modulus levels (e.g., to greater than 140 GPa, 140 GPa to 200 GPa, 140 GPa to 180 GPa, etc.) (and hardness levels) exhibited by the outer layered film 120 can be controlled through adjustments to the processing conditions for sputtering the layers of the outer layered film 120, particularly its high RI layers 130B and scratch resistant layer 150. In some implementations, for example, a reactive sputtering process can be employed to deposit high RI layers 130B comprising a silicon-containing nitride or a silicon-containing oxynitride. Further, these high RI layers 130B can be deposited by applying power to a silicon sputter target in a reactive gaseous environment containing argon gas (e.g., at flow rates from 50 to 150 sccm), nitrogen gas (e.g., at flow rates from 200 to 250 sccm) and oxygen gas, with residual compressive stress and elastic modulus levels largely dictated by the selected oxygen gas flow rate. For example, a relatively low oxygen gas flow rate (e.g., 45 sccm) can be employed according to the foregoing argon and nitrogen gas flow conditions to produce high RI layers 130B with a $SiO_xN_y$ stoichiometry such that its outer layered film 120 exhibits a residual compressive stress of about 942 MPa, hardness of 17.8 GPa and an elastic modulus of 162.6 GPa. As another example, a relatively high oxygen gas flow rate (e.g., 65 sccm) can be employed according to the foregoing argon and nitrogen gas flow conditions to produce high RI layers 130B with a $SiO_xN_y$ stoichiometry such that the outer layered film 120 exhibits a residual compressive stress of about 913 MPa, hardness of 16.4 GPa and an elastic modulus of 148.4 GPa. Accordingly, the stoichiometry of the outer layered film 120, particularly its high RI layers 130B and scratch resistant layer 150, can be controlled to achieve targeted residual compressive stress and elastic modulus levels, which unexpectedly correlate to the advantageously high average failure stress levels in the cover articles 100 (e.g., greater than or equal to 700 MPa).

According to embodiments of the cover article 100 of the disclosure, as depicted in exemplary form in FIGS. 1-1F, the cover article 100 exhibits a first-surface average photopic reflectance of less than 2% at a near-normal angle of incidence of 8°. In embodiments, the cover article 100 can exhibit a first-surface average photopic reflectance of less than 2%, less than 1.75%, less than 1.5%, less than 1.25%, or even less than 1.2%, at a near-normal angle of incidence of 8°. For example, the cover article 100 can exhibit a first-surface average photopic reflectance of 1.9%, 1.8%, 1.7%, 1.6%, 1.5%, 1.4%, 1.3%, 1.2%, 1.1%, 1.0%, 0.9%, 0.8%, 0.7%, 0.6%, 0.5%, 0.4%, 0.3%, and all reflectance values between the foregoing ranges and sub-ranges, at a near-normal incidence angle of 8°.

According to embodiments of the cover article 100 of the disclosure, as depicted in exemplary form in FIGS. 1-1F, the cover article 100 exhibits a first-surface average reflectance for infrared wavelengths from 1000 to 1700 nm (or for visible wavelengths from 420 nm to 1000 nm, and these infrared wavelengths) of less than 10% at an angle of incidence from 8° to 40°, or from 8° to 60°. In embodiments, the cover article 100 can exhibit a first-surface average reflectance for infrared wavelengths from 1000 to 1700 nm (or for visible wavelengths from 420 nm to 1000 nm, and these infrared wavelengths) of less than 10%, less than 8%, less than 6%, less than 5%, or even less than 4.5%, at an angle of incidence from 8° to 40°, or from 8° to 60°. For example, the cover article 100 can exhibit a first-surface average reflectance for infrared wavelengths from 1000 to 1700 nm (or for visible wavelengths from 420 nm to 1000 nm, and these infrared wavelengths) of 9%, 8%, 7%, 6%, 5% 45%4%, 3.5%, 3% 2.5%, 2%, 1%, 0.5%, and all reflectance values between the foregoing ranges and sub-ranges, at an angle of incidence from 8° to 40°, or from 8° to 60°.

According to embodiments of the cover article 100 of the disclosure, as depicted in exemplary form in FIGS. 1-1F, the cover article 100 exhibits a first-surface average reflectance for infrared wavelengths from 1000 to 1700 nm of less than 15% at an angle of incidence of 60°. In embodiments, the cover article 100 can exhibit a first-surface average reflectance for infrared wavelengths from 1000 to 1700 nm of less than 15%, less than 12%, less than 10%, or even less than 9%, at an angle of incidence of 60°. For example, the cover article 100 can exhibit a first-surface average reflectance for infrared wavelengths from 1000 to 1700 nm of 14%, 13%, 12%, 11%, 10%, 9%, 8%, 7%, 6%, 5%, 2.5%, and all reflectance values between the foregoing ranges and sub-ranges, at an incidence angle of 60°.

According to embodiments of the cover article 100 of the disclosure, as depicted in exemplary form in FIGS. 1-1F, the cover article 100 exhibits a first-surface maximum reflectance for infrared wavelengths from 1000 to 1700 nm of less than 15% at a near-normal angle of incidence of 8°. In embodiments, the cover article 100 can exhibit a first-surface maximum reflectance for infrared wavelengths from 1000 to 1700 nm of less than 15%, less than 10%, less than 8%, less than 6%, or even less than 5%, at a near-normal angle of incidence of 8°. For example, the cover article 100 can exhibit a first-surface maximum reflectance for infrared wavelengths from 1000 to 1700 nm of 14%, 13%, 12%, 11%, 10%, 9%, 8%, 7%, 6%, 5%, 4%, 3%, 2.5%, 2%, and all maximum reflectance values between the foregoing ranges and sub-ranges, at a near-normal incidence angle of 8°.

According to embodiments of the cover article 100 of the disclosure, as depicted in exemplary form in FIGS. 1-1F, the cover article 100 exhibits a two-surface average photopic transmittance of greater than 94% at a near-normal angle of incidence of 8°. In embodiments, the cover article 100 can exhibit a two-surface average photopic transmittance of greater than 94%, greater than 94.5%, or even greater than 95% (recognizing that the maximum achievable is about 96% due to the influence of the uncoated surface of the substrate 110) at a near-normal angle of incidence of 8°. For example, the cover article 100 can exhibit a two-surface average photopic transmittance of about 94%, 94.25%, 94.5%, 94.75%, 95%, 95.25%, 95.5%, 95.75%, 96%, and all transmittance values between the foregoing ranges and sub-ranges, at a near-normal incidence angle of 8°.

According to embodiments of the cover article 100 of the disclosure, as depicted in exemplary form in FIGS. 1-1F, the cover article 100 exhibits a two-surface average transmittance for infrared wavelengths from 1000 to 1700 nm of greater than 85% at an angle of incidence from 0° to 30°, or from 0° to 40°. In embodiments, the cover article 100 can exhibit a two-surface average transmittance for infrared wavelengths from 1000 to 1700 nm of greater than 85%, greater than 88%, greater than 90%, greater than 910%, or even greater than 92%, at an angle of incidence from 0° to 30°, or from 0° to 40°. For example, the cover article 100 can exhibit a two-surface average transmittance for infrared wavelengths from 1000 to 1700 nm of about 85%, 86%, 87%, 88%, 89%, 90%, 91%, 92%, 93%, 94%, 95%, and all transmittance values between the foregoing ranges and sub-ranges, at an angle of incidence from 0° to 30°, or from 0° to 40°.

According to embodiments of the cover article 100 of the disclosure, as depicted in exemplary form in FIGS. 1-1F, the cover article 100 exhibits a two-surface average transmittance for infrared wavelengths from 1000 to 1700 nm of greater than 75% at an angle of incidence of about 60°. In embodiments, the cover article 100 can exhibit a two-surface average transmittance for infrared wavelengths from 1000 to 1700 nm of greater than 75%, greater than 80%, greater than 810%, greater than 82%, or even greater than 83%, at an angle of incidence of about 60°. For example, the cover article 100 can exhibit a two-surface average transmittance for infrared wavelengths from 1000 to 1700 nm of about 75%, 76%, 77%, 78%, 79%, 80%, 81%, 82%, 83%, 84%, 85%, and all transmittance values between the foregoing ranges and sub-ranges, at an angle of incidence of about 60°.

According to embodiments of the cover article 100 of the disclosure, as depicted in exemplary form in FIGS. 1-1F, the cover article 100 exhibits a two-surface minimum transmittance for infrared wavelengths from 1000 to 1700 nm of greater than 80% at a normal angle of incidence of about 0°. In embodiments, the cover article 100 can exhibit a two-surface minimum transmittance for infrared wavelengths from 1000 to 1700 nm of greater than 80%, greater than 85%, greater than 88%, greater than 90%, or even greater than 91%, at a normal angle of incidence of about 0°. For example, the cover article 100 can exhibit a two-surface minimum transmittance for infrared wavelengths from 1000 to 1700 nm of about 80%, 81%, 82%, 83%, 84%, 85%, 86%, 87%, 88%, 89%, 90%, 92%, 93%, 94%, 95%, and all minimum transmittance values between the foregoing ranges and sub-ranges, at a normal angle of incidence of about 0°.

According to embodiments of the cover article 100 of the disclosure, as depicted in exemplary form in FIGS. 1-1F, the cover article 100 exhibits a first-surface reflected color (CIE coordinates under illumination from a D65 illuminant) for all angles of incidence from 0° to 90° with a* from −10 to +10 and b* from −12 to +5. In some implementations of the cover article 100 of the disclosure, the first-surface reflected color for all angles of incidence from 00 to 90° is such that a* is from −4 to +4, or −3 to +3, or even −2 to +2; and that b* is from −8 to +3, or −7 to +2.5, or −6 to +2.

According to some implementations, the cover articles 100 depicted in FIGS. 1-1F may exhibit a first-surface (i.e., through one of the primary surfaces 112, 114 of the substrate 110), reflected color with a D65 illuminant, as given by I(a*2+b$^{*2}$), of less than 10, less than 8, less than 6, less than 4, less than 3, or even less than 2, as measured at normal incidence, from 0 to 10 degrees, or over all incidence angles from 0 to 90 degrees. For example, the cover articles 100 can exhibit a reflected color of less than 10, 9, 8, 7, 6, 5, 4, 3.75, 3.5, 3.25, 3, 2.75, 2.5, 2.25, 2, 1.9, 1.8, 1.7, 1.6, 1.5, 1.4, 1.3, 1.2, 1.1, 1, or even lower, as measured at normal incidence, from 0 to 10 degrees, or over all incidence angles from 0 to 90 degrees.

According to embodiments of the cover article 100 of the disclosure, as depicted in exemplary form in FIGS. 1-1F, the cover article 100 exhibits a two-surface transmitted color (CIE coordinates under illumination from a D65 illuminant) for all angles of incidence from 0° to 90° with a* from −4 to +4 and b* from −4 to +4. In some implementations of the cover article 100 of the disclosure, the two-surface transmitted color for all angles of incidence from 00 to 900 is such that a* is from −2 to +2, −1.5 to +1.5, or −1 to +1; and that b* is from −2 to +2, −1 to +2, or 0 to +2.

The substrate 110 may include an inorganic material and may include an amorphous substrate, a crystalline substrate, a glass-ceramic substrate, or a combination thereof. In some implementations, the substrate 110 may include an inorganic material with amorphous and crystalline portions. The substrate 110 may be formed from man-made materials and/or naturally occurring materials (e.g., quartz and polymers). For example, in some instances, the substrate 110 may be characterized as organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and poly ethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In some specific embodiments, the substrate 110 may specifically exclude polymeric, plastic and/or metal materials. The substrate 110 may be characterized as alkali-including substrates (i.e., the substrate includes one or more alkalis). In one or more embodiments, the substrate 110 exhibits a refractive index in the range from about 1.45 to about 1.55. In specific embodiments, the substrate 110 may exhibit an average strain-to-failure at a surface on one or more opposing primary surfaces that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, as measured using an ROR test using at least 5, at least 10, at least 15, or at least 20 samples to determine the average strain-to-failure value. In specific embodiments, the substrate 110 may exhibit an average strain-to-failure at its surface on one or more opposing primary surfaces of about 1.2%, about 1.4%, about 1.6%, about 1.8%, about 2.2%, about 2.4%, about 2.6%, about 2.8%, or about 3% or greater.

Suitable substrates 110 may exhibit an elastic modulus (or Young's modulus) in the range from about 30 GPa to about 120 GPa. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween. In some embodiments, substrates 110 may exhibit an elastic modulus of greater than 85 GPa.

In one or more embodiments, the amorphous substrate may include glass, which may be strengthened or non-strengthened. Examples of suitable glass include soda lime glass, alkali aluminosilicate glass, alkali containing borosilicate glass and alkali aluminoborosilicate glass. In some variants, the glass may be free of lithia. In one or more alternative embodiments, the substrate 110 may include crystalline substrates such as glass ceramic substrates (which may be strengthened or non-strengthened) or may include a single crystal structure, such as sapphire. In one or more specific embodiments, the substrate 110 includes an amorphous base (e.g., glass) and a crystalline cladding (e.g., sapphire layer, a polycrystalline alumina layer and/or or a spinel ($MgAl_2O_4$) layer).

In one or more embodiments, the substrate 110 includes one or more glass-ceramic materials and may be strengthened or non-strengthened. In one or more embodiments, the substrates 110 may comprise one or more crystalline phases such as lithium disilicate, lithium metasilicate, petalite, beta quartz, and/or beta spodumene, as potentially combined with residual glass in the structure. In an embodiment, the substrate 110 comprises a disilicate phase. In another implementation, the substrate 110 comprises a disilicate phase and a petalite phase. According to an embodiment, the substrate 110 has a crystallinity of at least 40% by weight. In some implementations, the substrate 110 has a crystallinity of at least about 40%, 45%, 50%, 55%, 60%, 65%, 70%, 75%, 80%, 85%, or greater (by weight), with the residual as a glass phase. Further, according to some embodiments, each of the crystalline phases of the substrate 110 has an average crystallite size of less than 100 nm, less than 75 nm, less than 50 nm, less than 40 nm, less than 30 nm, and all crystallite sizes within or less than these levels. According to one exemplary embodiment, the substrate 110 comprises lithium disilicate and petalite phases with 40 wt. % lithium disilicate, 45 wt. % petalite, and the remainder as residual glass (i.e., ~85% crystalline, ~15% residual amorphous/glass); each crystalline phase having a majority of crystals with an average crystallite size in the range of 10 nm to 50 nm.

The substrate 110 of one or more embodiments may have a hardness that is less than the hardness of the overall cover article 100 (as measured by the Berkovich Indenter Hardness Test described herein). The hardness of the substrate 110 may be measured using known methods in the art, including but not limited to the Berkovich Indenter Hardness Test or Vickers hardness test.

The substrate 110 may be substantially optically clear, transparent and free from light scattering elements. In such embodiments, the substrate may exhibit an average light transmittance over the optical wavelength regime of about 85% or greater, about 86% or greater, about 87% or greater, about 88% or greater, about 89% or greater, about 90% or greater, about 91% or greater, or about 92% or greater. In one or more alternative embodiments, the substrate 110 may be opaque or exhibit an average light transmittance over the optical wavelength regime of less than about 10%, less than about 9%, less than about 8%, less than about 7%, less than about 6%, less than about 5%, less than about 4%, less than about 3%, less than about 2%, less than about 1%, or less than about 0.5%. In some embodiments, these light reflectance and transmittance values may be a total reflectance or total transmittance (taking into account reflectance or transmittance on both primary surfaces of the substrate) or may be observed on a single side of the substrate (i.e., on the outermost surface 122 of the outer layered film 120 only, without taking into account the opposite surface). Unless otherwise specified, the average reflectance or transmittance of the substrate alone is measured at an incident illumination angle of 0 degrees relative to the substrate primary surface 112 (however, such measurements may be provided at incident illumination angles of 45 degrees or 60 degrees). The substrate 110 may optionally exhibit a color, such as white, black, red, blue, green, yellow, orange, etc.

Additionally or alternatively, the physical thickness of the substrate 110 may vary along one or more of its dimensions for aesthetic and/or functional reasons. For example, the edges of the substrate 110 may be thicker as compared to more central regions of the substrate 110. The length, width and physical thickness dimensions of the substrate 110 may also vary according to the application or use of the cover article 100.

The substrate 110 may be provided using a variety of different processes. For instance, where the substrate 110 includes an amorphous substrate such as glass, various forming methods can include float glass processes and down-draw processes such as fusion draw and slot draw.

Once formed, a substrate 110 may be strengthened to form a strengthened substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

Where the substrate 110 is chemically strengthened by an ion exchange process, the ions in the surface layer of the substrate are replaced by—or exchanged with—larger ions having the same valence or oxidation state. Ion exchange processes are typically carried out by immersing a substrate in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of layer DOL, or depth of compression DOC) of the substrate that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which substrates are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which substrates are strengthened by ion exchange in a first bath diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

The degree of chemical strengthening achieved by ion exchange may be quantified based on the parameters of central tension (CT), surface CS, and depth of compression (DOC) (i.e., the point in the substrate in which the stress state changes from compression to tension), and depth of layer of potassium ions (DOL). Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. Maximum CT values are measured using a scattered light polariscope (SCALP) technique known in the art. As used herein, DOC means the depth at which the stress in the chemically strengthened alkali aluminosilicate glass article described herein changes from compressive to tensile. DOC may be measured by FSM or SCALP depending on the ion exchange treatment. Where the stress in the cover article is generated by exchanging potassium ions into the glass article, FSM is used to measure DOC. Where the stress is generated by exchanging sodium ions into the article, SCALP is used to measure DOC. Where the stress in the article is generated by exchanging both potassium and sodium ions into the substrate, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

In one embodiment, a substrate 110 can have a surface CS (also referred to as "residual surface compressive stress") of 200 MPa or greater, 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. In another implementation, a strengthened substrate 110 can exhibit a surface compressive stress (CS) of from about 200 MPa to about 1200 MPa, from about 200 MPa to about 1000 MPa, from about 200 MPa to about 800 MPa, from about 200 MPa to about 600 MPa, from about 200 MPa to about 500 MPa, from about 200 MPa to about 400 MPa, from about 225 MPa to about 400 MPa, from about 250 MPa to about 400 MPa, and all CS sub-ranges and values in the foregoing ranges. The strengthened substrate 110 may have a DOC of 10 μm or greater, 15 μm or greater, 20 μm or greater, 25 μm or greater, or 50 μm or greater (e.g., 25 μm, 30 μm, 35 μm, 40 μm, 45 μm, 50 μm or greater; and from about 5 μm to about 150 m), a DOL of from about 1 m to 5 m, from 1 m to 10 m, or from 1 am to about 15 m, and/or a CT of 10 MPa or greater, 20 MPa or greater, 30 MPa or greater, 40 MPa or greater, 50 MPa or greater, 75 MPa or greater, 100 MPa or greater, 125 MPa or greater (e.g., 80 MPa, 90 MPa, or 100 MPa or greater; and 80 MPa to 200 MPa, etc.) but less than 250 MPa (e.g., 200 MPa or less, 175 MPa or less, 150 MPa or less, etc.). In such implementations of the cover articles 100 with substrates 110 having a CT from about 50 MPa to about 200 MPa or 80 MPa to about 200 MPa, the thickness of the substrate 110 should be limited to about 0.6 mm or less to ensure that the substrate is not frangible. For implementations employing thicker substrates, e.g., with a thickness up to 0.8 mm, 0.9 mm, 1.0 mm, 1.25 mm, or even up to about 1.5 mm, the upper limit of CT should be held to levels below 200 MPa to ensure that the substrate is not frangible (e.g., 150 MPa for a thickness of 0.8 mm).

The depth of compression (DOC) of the substrate 110 may be from 0.1•(thickness (t) of the substrate) to about 0.25•t, for example from about 0.15•tto about 0.25•t, from about 0.15•t to about 0.25•t, or from about 0.15•t to about 0.20•t, and all DOC values between the foregoing ranges. For example, the substrate 110 can have a DOC of 20% of the thickness of the substrate, as compared to 15% or less for ion-exchanged glass substrates. In embodiments, the depths of compression for the substrate materials can from ~8% to ~20% of the thickness of the substrate 110. Note that the foregoing DOC values are as measured from one of the primary surfaces 112 or 114 of the substrate 110. As such, for a substrate 110 with a thickness of 600 m, the DOC may be 20% of the thickness of the substrate, ~120 m from each of the primary surfaces 112, 114 of the substrate 110, or 240 μm in total for the entire substrate. In one or more specific embodiments, the strengthened substrate 110 can exhibit one or more of the following mechanical properties: a surface CS of from about 200 MPa to about 400 MPa, a DOL of greater than 30 μm, a DOC of from about 0.08•t to about 0.25•t, and a CT from about 80 MPa to about 200 MPa.

Example glasses that may be used in the substrate 110 may include alkali aluminosilicate glass compositions or alkali aluminoborosilicate glass compositions, though other glass compositions are contemplated. Such glass compositions are capable of being chemically strengthened by an ion exchange process. One example glass composition comprises $SiO_2$, $B_2O_3$ and $Na_2O$, where $(SiO_2+B_2O_3)\geq 66$ mol. %, and $Na_2O\geq 9$ mol. %. In an embodiment, the glass composition includes at least 6 wt. % aluminum oxide. In a further embodiment, the substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the substrate can comprise 61-75 mol. % SiO2; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrate 110 comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$;

less than 50 ppm $As_2O_3$; and less than 50 ppm $Sb_2O_3$; where 12 mol. %≤($Li_2O$+$Na_2O$+$K_2O$)≤20 mol. % and 0 mol. %≤(MgO+CaO)≤10 mol. %.

A still further example glass composition suitable for the substrate 110 comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. %≤($Li_2O$+$Na_2O$+$K_2O$)≤18 mol. % and 2 mol. %≤(MgO+CaO)≤7 mol. %.

In a particular embodiment, an alkali aluminosilicate glass composition suitable for the substrate 110 comprises alumina, at least one alkali metal and, in some embodiments, greater than 50 μmol. % $SiO_2$, in other embodiments at least 58 mol. % $SiO_2$, and in still other embodiments at least 60 mol. % $SiO_2$, wherein the ratio ($Al_2O_3$+$B_2O_3$)/Σmodifiers (i.e., sum of modifiers) is greater than 1, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio ($Al_2O_3$+$B_2O_3$)/Σmodifiers (i.e., sum of modifiers) is greater than 1.

In still another embodiment, the substrate 110 may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. %≤$SiO_2$+$B_2O_3$+CaO 69 mol. %; $Na_2O$+$K_2O$+$B_2O_3$+MgO+CaO+SrO>10 mol. %; 5 mol. %≤MgO+CaO+SrO≤8 mol. %; ($Na_2O$+$B_2O_3$)—$Al_2O_3$≤2 mol. %; 2 mol. %≤$Na_2O$—$Al_2O_3$≤6 mol. %; and 4 mol. %≤($Na_2O$+$K_2O$)—$Al_2O_3$≤10 mol. %.

In an alternative embodiment, the substrate 110 may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate 110 includes a crystalline substrate, the substrate may include a single crystal, which may include $Al_2O_3$. Such single crystal substrates are referred to as sapphire. Other suitable materials for a crystalline substrate include polycrystalline alumina layer and/or spinel ($MgAl_2O_4$).

Optionally, the substrate 110 may be crystalline and include a glass ceramic substrate, which may be strengthened or non-strengthened, and with a suitable composition to support strengthening. Examples of suitable glass ceramics may include $Li_2O$—$Al_2O_3$—$SiO_2$ system (i.e., LAS-System) glass ceramics, MgO—$Al_2O_3$—$SiO_2$ system (i.e., MAS-System) glass ceramics, and/or glass ceramics that include a predominant crystal phase including β-quartz solid solution, β-spodumene ss, cordierite, and lithium disilicate. The glass ceramic substrates may be strengthened using the chemical strengthening processes disclosed herein. In one or more embodiments, MAS-System glass ceramic substrates may be strengthened in $Li_2SO_4$ molten salt, whereby an exchange of $2Li^+$ for $Mg^{2+}$ can occur.

According to some embodiments of the cover article 100 of the disclosure, the substrate 110 may be a glass-ceramic material of an LAS system with the following composition: 70-80% $SiO_2$, 5-10% $Al_2O_3$, 10-15% $Li_2O$, 0.01-1% $Na_2O$, 0.01-1% $K_2O$, 0.1-5% $P_2O_5$ and 0.1-7% $ZrO_2$ (in wt. %, oxide basis). In some implementations of the cover article 100 of the disclosure, the substrate 110 may be an LAS system with the following composition: 70-80% $SiO_2$, 5-10% $Al_2O_3$, 10-15% $Li_2O$, 0.01-1% $Na_2O$, 0.01-1% $K_2O$, 0.1-5% $P_2O_5$ and 0.1-5% $ZrO_2$ (in wt. %, oxide basis). According to another embodiment, the substrate 110 may be an LAS system with the following composition: 70-75% $SiO_2$, 5-10% $Al_2O_3$, 10-15% $Li_2O$, 0.05-1% $Na_2O$, 0.1-1% $K_2O$, 1-5% $P_2O_5$, 2-7% $ZrO_2$ and 0.1-2% CaO (in wt. %, oxide basis). According to a further embodiment, the substrate 110 can have the following composition: 71-72% $SiO_2$, 6-8% $Al_2O_3$, 10-13% $Li_2O$, 0.05-0.5% $Na_2O$, 0.1-0.5% $K_2O$, 1.5-4% $P_2O_5$, 4-7% $ZrO_2$ and 0.5-1.5% CaO (in wt. %, oxide basis). More generally, these compositions of the substrate 110 are advantageous for the cover articles 100 of the disclosure because they exhibit low haze levels, high transparency, high fracture toughness (e.g., greater than 0.8 MPa m), and high elastic modulus, and are ion-exchangeable.

The substrate 110 according to one or more embodiments can have a physical thickness ranging from about 50 μm to about 5 mm in various portions of the substrate 110. Example substrate 110 physical thicknesses range from about 50 μm to about 500 μm (e.g., 50, 75, 100, 200, 300, 400 or 500 μm). Further example substrate 110 physical thicknesses range from about 50 μm to about 2000 μm (e.g., 50, 75, 100, 250, 500, 600, 700, 800, 900, 1000, 1250, 1500, 1750, or 2000 μm). The substrate 110 may have a physical thickness greater than about 1 mm (e.g., about 2, 3, 4, or 5 mm). In one or more specific embodiments, the substrate 110 may have a physical thickness of 2 mm or less, or less than 1 mm. The substrate 110 may be acid polished or otherwise treated to remove or reduce the effect of surface flaws.

Figure 2B:
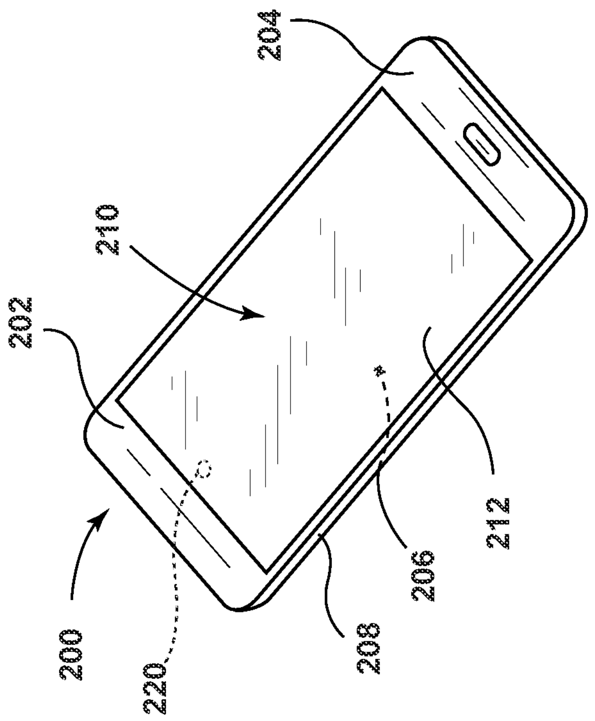
FIG. 2B is a perspective view of the exemplary electronic product of FIG. 2A.
Figure 2A:
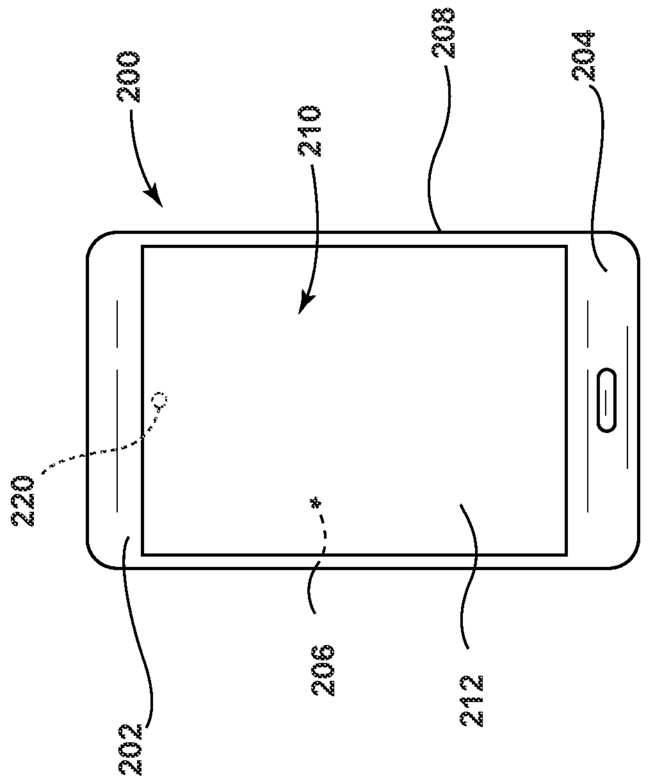
FIG. 2A is a plan view of an exemplary electronic product incorporating any of the cover articles disclosed herein.

The cover articles 100, as depicted in exemplary form in FIGS. 1-1F and disclosed herein, may be incorporated into a device article, for example, a device article with a display (or display articles) (e.g., consumer electronics, including mobile phones, tablets, computers, navigation systems, wearable devices (e.g., watches), and the like), augmented-reality displays, heads-up displays, glass-based displays, architectural device articles, transportation device articles (e.g., automotive, trains, aircraft, sea craft, etc.), appliance device articles, or any article that benefits from transparency, scratch-resistance, abrasion resistance, damage resistance, or a combination thereof. An exemplary article incorporating any of the cover articles disclosed herein is shown in FIGS. 2A and 2B. Specifically, FIGS. 2A and 2B show a consumer electronic product 200 including a housing 202 having a front surface 204, a back surface 206, and side surfaces 208; electronic components (not shown) that are at least partially inside or entirely within the housing 202 and including at least one of the display 210 and a sensor 220. Further, a display 210 is at or adjacent to the front surface 204 of the housing 202, and the sensor 220 is at or adjacent to the front surface 204 or the back surface 206 of the housing 202. In addition, a cover 212 is disposed at or over at least one of the display 210 and the sensor 220. In some embodiments, at least one of the cover 212 or a portion of housing 202 may include any of the cover articles 100 disclosed herein.

EXAMPLES

Various embodiments will be further clarified by the following modeled examples (Exs. 1-10). The optical properties (e.g., photopic reflectance and transmittance) of the examples were modeled using computational techniques, particularly transfer matrix modeling techniques to model thin film performance as understood by those of skill in the field of this disclosure. Thin film properties (e.g., refractive index values) obtained from prior thin film reactive sputtering of films (e.g., high RI layers of $SiN_x$), lab experiments, and higher volume sputter manufacturing, were used in the modeling.

The refractive indices (as a function of wavelength) of each of the formed layers and the glass substrate were measured using spectroscopic ellipsometry in prior experiments. The refractive indices thus measured were then used to calculate reflectance spectra for the examples. The examples use a single refractive index value in their descriptive tables for convenience, which corresponds to a point selected from the dispersion curves at about 550 nm wavelength.

Comparative, modeled examples (i.e., Comp. Ex. 1 and Comp. Ex. 2) are also supplied as a comparison to the performance of the cover articles of the disclosure, and these comparative examples may have inferior optical performance when deposited on a substrate. In many of the examples described herein, the substrate used was Gorilla® Glass 3 (commercially available from Corning, Inc.). Examples of Gorilla® Glass 3 compositions are described in U.S. Pat. Nos. 7,666,511, 4,483,700, and 5,674,790, the salient contents of which are hereby incorporated by reference in this disclosure.

In the following example cover articles, total thickness of the outer layered film 120 is significantly dependent on the thickness of the thickest hard-coat layer (e.g., the thickest scratch resistant layer 150). This thickest layer in each design can have its thickness varied in a range from about 200 nm to 10,000+ nm with minimal change to optical performance. In general, a thicker scratch resistant layer 150 will lead to higher scratch or damage resistance. The thickness of the scratch resistant layer chosen here for these designs, around 500-2000 nm, has been chosen as a preferred combination for manufacturability as well as high scratch resistance for consumer electronics applications. In some cases, it is desirable to minimize the thickness of the layers of the antireflective region 130 above the thickest scratch resistant layer 150, to optimize hardness and scratch resistance. This can be a challenge for optical coatings having extended bandwidth, as extended bandwidth of antireflective coatings is typically associated with thicker antireflective coating layer stacks. It also can be particularly desirable to minimize the total combined thickness of low RI material (having RI less than 1.55 or less than 1.5 at 550 nm wavelength, e.g., $SiO_2$ in Examples) in the antireflective region 130 above the thickest scratch resistant layer 150, for example to less than 280 nm, or in a range from 80-280 nm. Here, the following cover article designs exhibit optimized combinations of low visible reflectance, high visible transmittance, extended infrared bandwidths of low reflectance and high transmittance, while also optimizing for visible color, achievable hardness, and relatively low antireflective region stack thickness.

Comparative Example 1

A strengthened glass substrate was coated with the comparative outer layered film of Table 1 below, designated Comp. Ex. 1. In particular, the outer layered film of Comp. Ex. 1 has 19 layers with layer 10 being the thickest (500 nm).

Figure 3A:
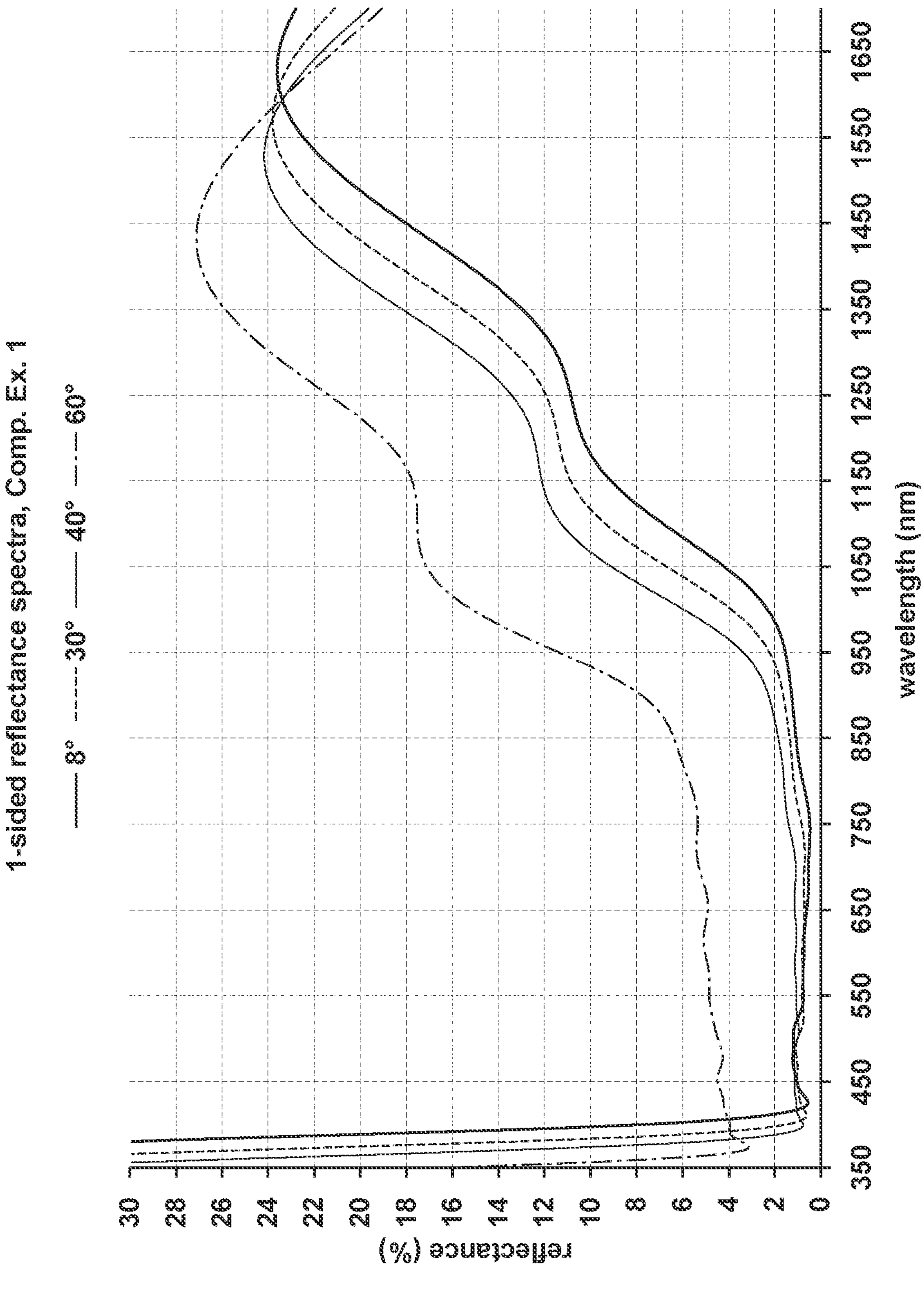
FIG. 3A is a plot of first-surface reflectance v. wavelength at incident angles of 8°, 30°, 40° and 60° for a comparative cover article.
Figure 3B:
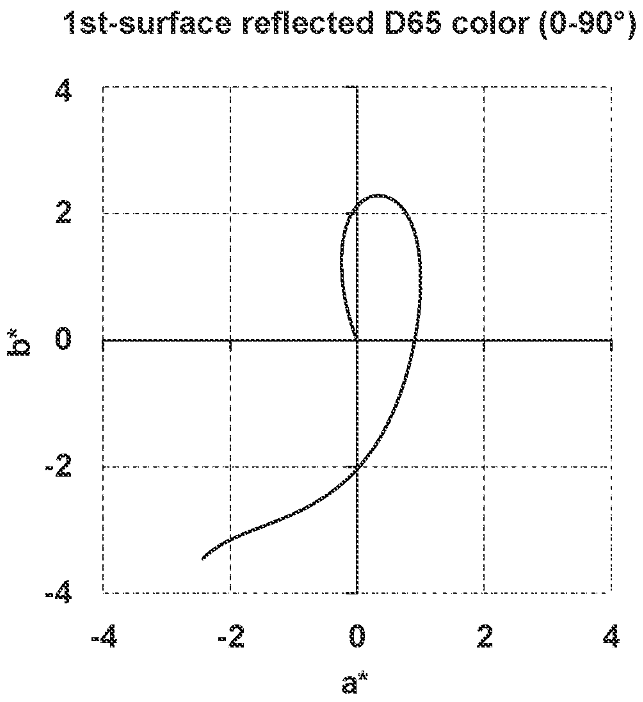
FIG. 3B is a plot of first-surface reflected color with a D65 illuminant for all viewing angles from 0 to 90 degrees for the comparative cover article of FIG. 3A.
Figure 3C:
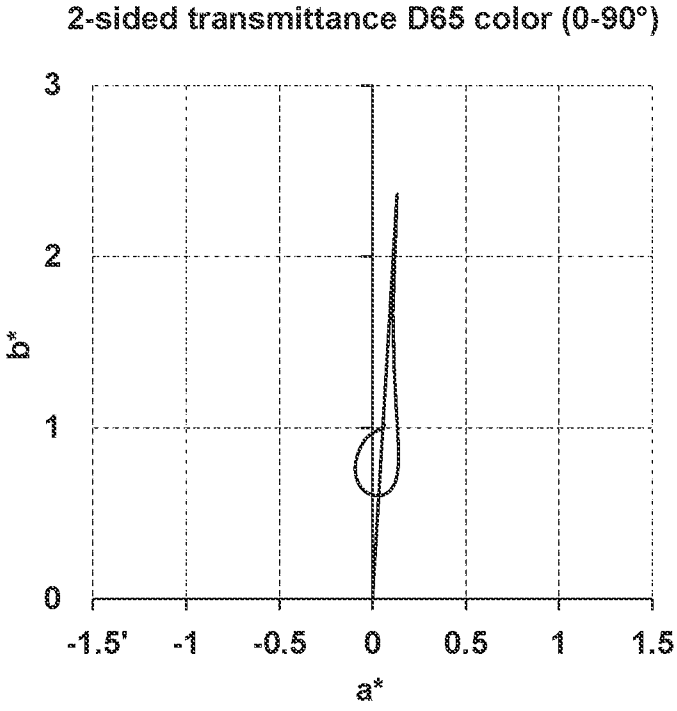
FIG. 3C is a plot of two-surface transmitted color with a D65 illuminant for all viewing angles from 0 to 90 degrees for the comparative cover article of FIG. 3A.

Optical properties of Comp. Ex. 1 are shown in FIGS. 3A-3C. In particular, FIG. 3A is a plot of first-surface reflectance v. wavelength at incident angles of 8°, 30°, 40° and 60° for this comparative cover article. Comp. Ex. 1 has an antireflective (AR) bandwidth (defined here as <3% $1^{st}$-surface or 1-sided reflectance) of ~410-1010 nm. However, as shown in the figure, the first-surface reflectance at near-normal (8 degrees) incidence rises rapidly above 4%≤ (which is the approximate reflectance of an uncoated glass surface) at wavelengths from −1050-1700 nm, rises above 6% at wavelengths from ~1100-1700 nm, and even exceeds 22% at 1550 nm. At higher angles of incidence, such as 60 degrees incidence, the reflectance is even higher, peaking around 27% near 1450 nm.

FIG. 3B is a plot of first-surface reflected color with a D65 illuminant for all viewing angles from 0 to 90 degrees for this comparative cover article. As is evident from FIG. 3B, the reflected color of this comparative example ranges from about −2.4 to +1 in a* and about −3.5 to +2.3 in b*.

Further, FIG. 3C is a plot of two-surface transmitted color with a D65 illuminant for all viewing angles from 0 to 90 degrees for this comparative cover article. The results displayed in FIG. 3C are from modeling of this comparative cover article with an outer layered film on one primary surface of the glass substrate, and an uncoated glass substrate forming the second primary surface. As shown in FIG. 3C, the transmitted color ranges from about −0.2 to +0.2 in a* and about −0 to +2.5 in b*.

TABLE 1

Comparative Ex. 1, Optical Film over Strengthened Glass Article

| Layer | Material | Refractive index @ 550 nm | Layer thickness (nm) |
|---|---|---|---|
| N/A | Air | 1 | N/A |
| 1 | SiO2 | 1.475 | 101.5 |
| 2 | SiNx | 2.029 | 154.4 |
| 3 | SiO2 | 1.475 | 45.1 |
| 4 | SiNx | 2.029 | 26 |
| 5 | SiO2 | 1.475 | 85.6 |
| 6 | SiNx | 2.029 | 25.2 |
| 7 | SiO2 | 1.475 | 50.4 |
| 8 | SiNx | 2.029 | 39.4 |
| 9 | SiO2 | 1.475 | 16 |
| 10 | SiOxNy | 1.957 | 500 |
| 11 | SiO2 | 1.467 | 8 |
| 12 | SiOxNy | 1.964 | 50.6 |
| 13 | SiO2 | 1.467 | 26.4 |
| 14 | SiOxNy | 1.964 | 35.9 |
| 15 | SiO2 | 1.467 | 49.2 |
| 16 | SiOxNy | 1.964 | 20 |
| 17 | SiO2 | 1.467 | 64 |
| 18 | SiOxNy | 1.964 | 8 |
| 19 | SiO2 | 1.467 | 20 |
| Substrate | Glass - Corning ® Gorilla ® Glass 3 | 1.507 | 0.3 mm |
| | Total thickness | | 1325.7 nm |
| | AR region thickness | | 543.6 nm |
| | volume of high RI material in AR region | | 45.1% |
| | total thickness of low RI layers in AR region | | 298.6 nm |

Example 1

A strengthened glass substrate was coated with the outer layered film of Table 2 below, designated Ex. 1. In particular, the outer layered film of Ex. 1 has 21 layers with layer 8 being the thickest (500 nm). Note that the thickness of layer 8 can be adjusted from about 200-10,000+ nm without substantially changing the optical performance. Also, the thickness of the substrate can be varied, for example from about 0.05 mm to about 5 mm, without departing from the spirit of the disclosure. For first-surface modeling calculations, the emergent air medium is not included.

Figure 4A:
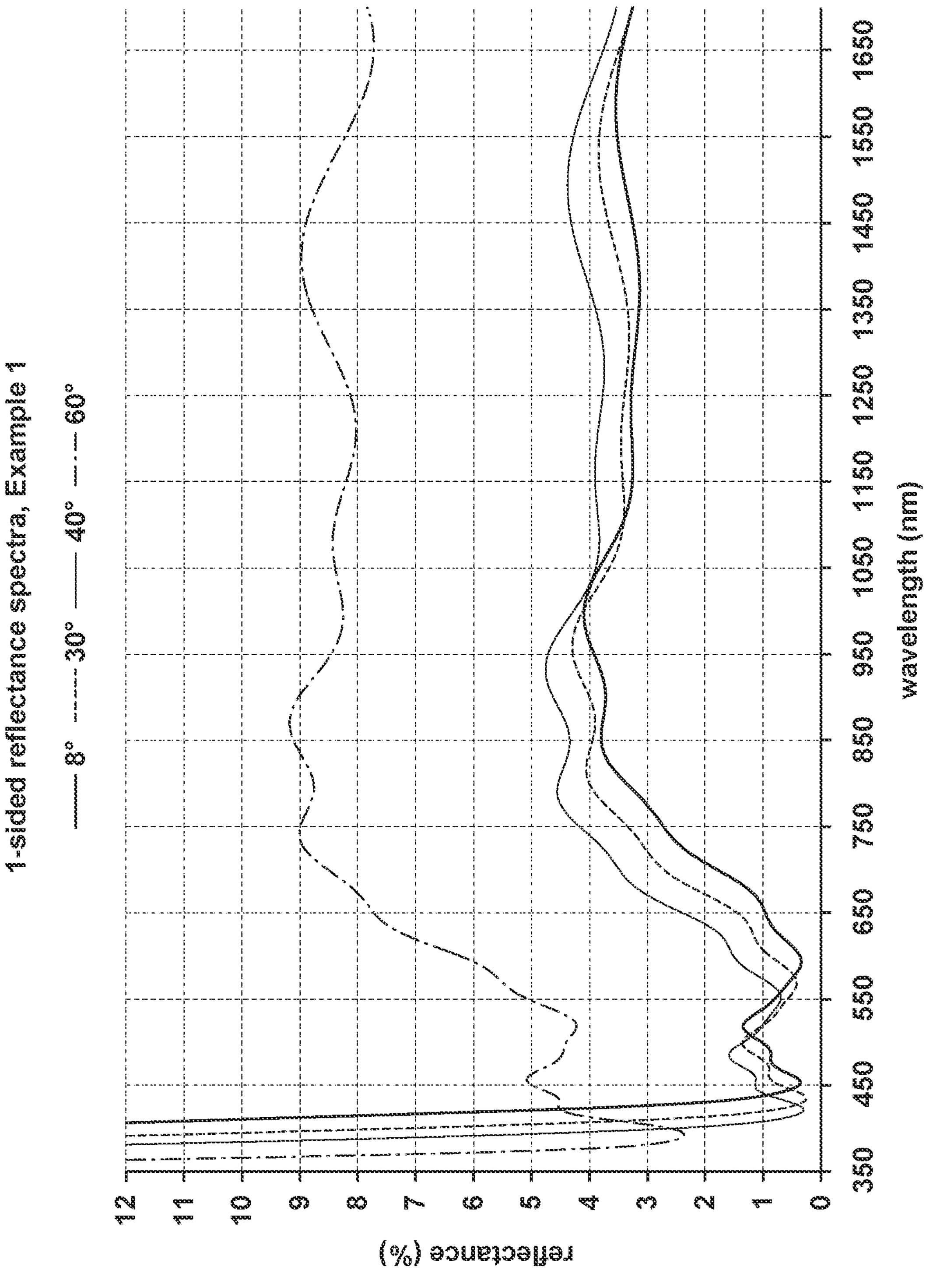
FIG. 4A is a plot of first-surface reflectance v. wavelength at incident angles of 8°, 30°, 40° and 60° for an exemplary cover article of the disclosure.
Figure 4B:
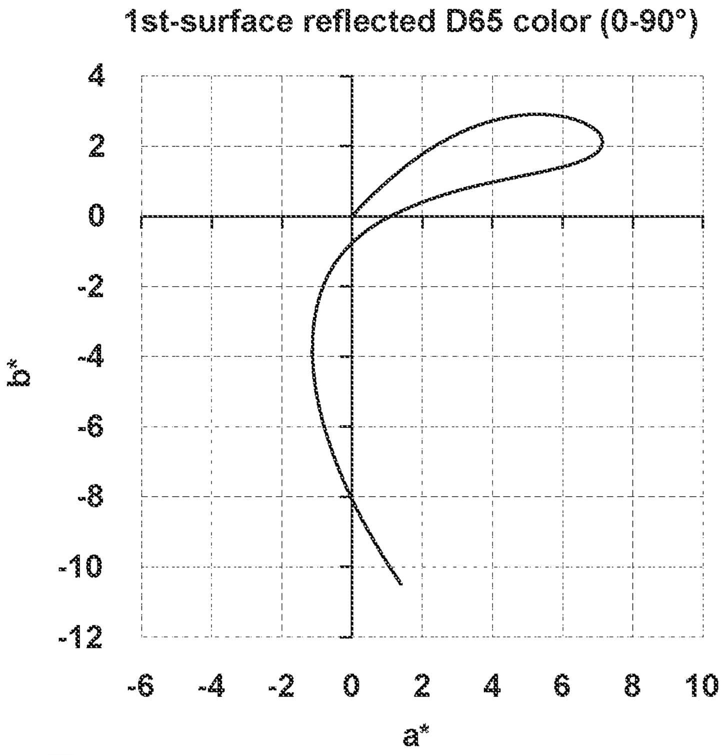
FIG. 4B is a plot of first-surface reflected color with a D65 illuminant for all viewing angles from 0 to 90 degrees for the exemplary cover article of FIG. 4A.
Figure 4C:
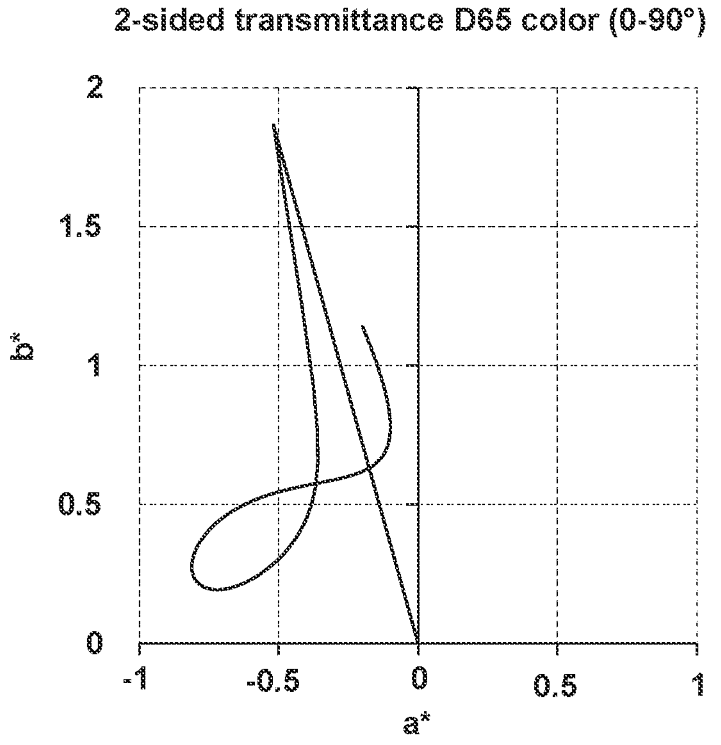
FIG. 4C is a plot of two-surface transmitted color with a D65 illuminant for all viewing angles from 0 to 90 degrees for the exemplary cover article of FIG. 4A.

Optical properties of Ex. 1 are shown in FIGS. 4A-4C. In particular, FIG. 4A is a plot of first-surface reflectance v. wavelength at incident angles of 8°, 30°, 40° and 60° for this example cover article. Ex. 1 has a first-surface reflectance that remains below 5% over an extended IR bandwidth from 800-1700 nm for viewing (light incidence) angles from 0-40 degrees, and remains below 9.5% from 800-1700 nm at 60 degrees incidence.

FIG. 4B is a plot of first-surface reflected color with a D65 illuminant for all viewing angles from 0 to 90 degrees for this example cover article. As is evident from FIG. 4B, the reflected color ranges from about −1.1 to +7.1 in a* and about −10.5 to +2.9 in b*.

Further, FIG. 4C is a plot of two-surface transmitted color with a D65 illuminant for all viewing angles from 0 to 90 degrees for this example cover article. The results displayed in FIG. 4C are from modeling of this cover article with an outer layered film on one primary surface of the glass substrate, and an uncoated glass substrate forming the second primary surface. As shown in FIG. 4C, the transmitted color ranges from about −0.8 to +0 in a* and about −0 to +1.9 in b*.

TABLE 2

Ex. 1, Cover Article for Sensor

| Layer | Material | Refractive index @ 550 nm | Layer thickness (nm) |
|---|---|---|---|
| N/A | Air | 1 | N/A |
| 1 | SiO2 | 1.465 | 125.0 |
| 2 | SiNx | 2.043 | 34.1 |
| 3 | SiO2 | 1.465 | 54.0 |
| 4 | SiNx | 2.043 | 43.0 |
| 5 | SiO2 | 1.465 | 34.2 |
| 6 | SiNx | 2.043 | 58.2 |
| 7 | SiO2 | 1.465 | 8.0 |
| 8 | SiOxNy | 1.943 | 500.0 |
| 9 | SiO2 | 1.465 | 9.4 |
| 10 | SiNx | 2.043 | 48.1 |
| 11 | SiO2 | 1.465 | 24.5 |
| 12 | SiNx | 2.043 | 47.9 |
| 13 | SiO2 | 1.465 | 38.8 |
| 14 | SiNx | 2.043 | 38.0 |
| 15 | SiO2 | 1.465 | 55.3 |
| 16 | SiNx | 2.043 | 26.6 |
| 17 | SiO2 | 1.465 | 70.6 |
| 18 | SiNx | 2.043 | 16.5 |
| 19 | SiO2 | 1.465 | 76.4 |
| 20 | SiNx | 2.043 | 8.0 |
| 21 | SiO2 | 1.465 | 25 |
| Substrate | Glass - Corning ® Gorilla ® Glass 3 | 1.507 | 0.3 mm |
| Total thickness | | | 1341.4 nm |
| AR region thickness | | | 356.4 nm |
| volume of high RI material in AR region | | | 37.9% |
| total thickness of low RI layers in AR region | | | 221.2 nm |

Example 2

A strengthened glass substrate was coated with the outer layered film of Table 3 below, designated Ex. 2. In particular, the outer layered film of Ex. 2 has 19 layers with layer 8 being the thickest (600 nm). Note that the thickness of layer 8 can be adjusted from about 200-10,000+ nm without substantially changing the optical performance. Also, the thickness of the substrate can be varied, for example from about 0.05 mm to about 5 mm, without departing from the spirit of the disclosure. For first-surface modeling calculations, the emergent air medium is not included.

Figure 5A:
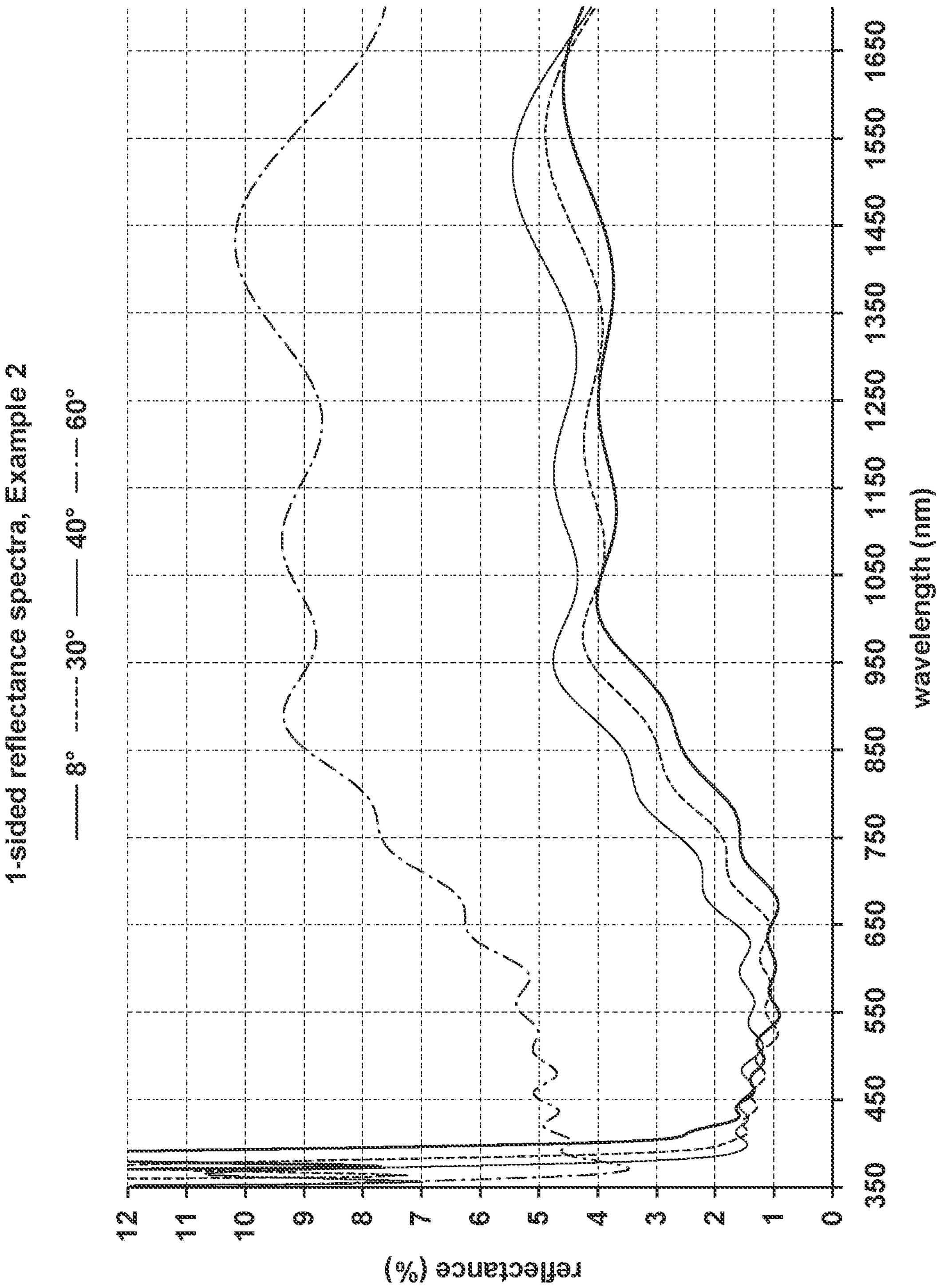
FIG. 5A is a plot of first-surface reflectance v. wavelength at incident angles of 8°, 30°, 40° and 60° for an exemplary cover article of the disclosure.
Figure 5B:
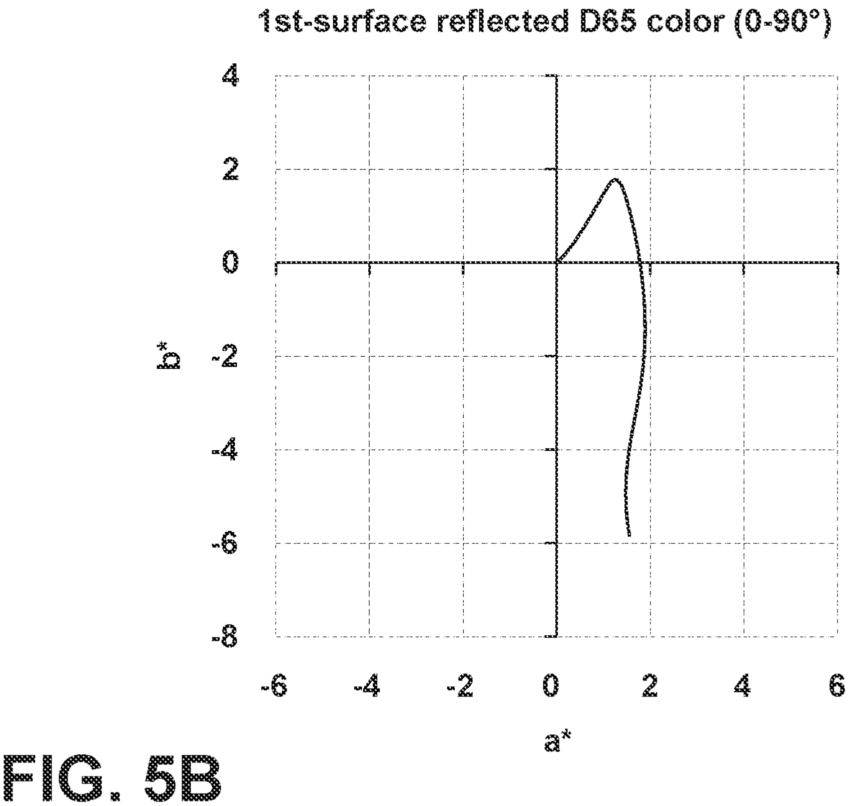
FIG. 5B is a plot of first-surface reflected color with a D65 illuminant for all viewing angles from 0 to 90 degrees for the exemplary cover article of FIG. 5A.
Figure 5C:
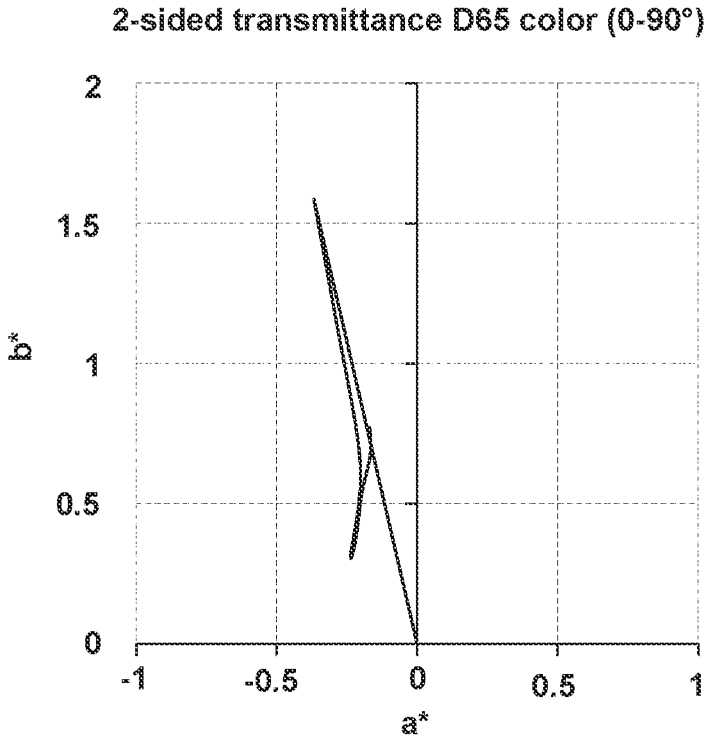
FIG. 5C is a plot of two-surface transmitted color with a D65 illuminant for all viewing angles from 0 to 90 degrees for the exemplary cover article of FIG. 5A.

Optical properties of Ex. 2 are shown in FIGS. 5A-5C. In particular, FIG. 5A is a plot of first-surface reflectance v. wavelength at incident angles of 8°, 30°, 40° and 60° for this example cover article. Ex. 2 has a first-surface reflectance in the visible range of 450-750 nm of below 2% at near-normal (8 degrees) incidence. Further, first-surface reflectance remains below 5% over an extended IR bandwidth from 800-1700 nm for viewing (light incidence) angles from 0-30 degrees, remains below 6% from 0-40 degrees incidence angles, and remains below 10.5% at 60 degrees incidence.

FIG. 5B is a plot of first-surface reflected color with a D65 illuminant for all viewing angles from 0 to 90 degrees for this example cover article. As is evident from FIG. 5B, the reflected color ranges from about −0 to +1.9 in a* and about −5.8 to +1.8 in b*.

Further, FIG. 5C is a plot of two-surface transmitted color with a D65 illuminant for all viewing angles from 0 to 90 degrees for this example cover article. The results displayed in FIG. 5C are from modeling of this cover article with an outer layered film on one primary surface of the glass substrate, and an uncoated glass substrate forming the second primary surface. As shown in FIG. 5C, the transmitted color ranges from about −0.4 to +0 in a* and about −0 to +1.7 in b*.

TABLE 3

Ex. 2, Cover Article for Sensor

| Layer | Material | Refractive index @ 550 nm | Layer thickness (nm) |
|---|---|---|---|
| N/A | Air | 1 | N/A |
| 1 | SiO2 | 1.465 | 123.7 |
| 2 | SiNx | 2.043 | 33.0 |
| 3 | SiO2 | 1.465 | 45.5 |
| 4 | SiNx | 2.043 | 42.2 |
| 5 | SiO2 | 1.465 | 35.3 |
| 6 | SiNx | 2.043 | 43.1 |
| 7 | SiO2 | 1.465 | 13.4 |
| 8 | SiOxNy | 1.943 | 600.0 |
| 9 | SiO2 | 1.465 | 6.4 |
| 10 | SiOxNy | 1.943 | 64.9 |
| 11 | SiO2 | 1.465 | 20.3 |
| 12 | SiOxNy | 1.943 | 52.6 |
| 13 | SiO2 | 1.465 | 39.6 |
| 14 | SiOxNy | 1.943 | 37.4 |
| 15 | SiO2 | 1.465 | 59.4 |
| 16 | SiOxNy | 1.943 | 23.0 |
| 17 | SiO2 | 1.465 | 70.4 |
| 18 | SiOxNy | 1.943 | 10.8 |
| 19 | SiO2 | 1.465 | 25 |
| Substrate | Glass - Corning ® Gorilla ® Glass 3 | 1.507 | 0.3 mm |
| Total thickness | | | 1346.1 nm |
| AR region thickness | | | 336.2 nm |
| volume of high RI material in AR region | | | 35.2% |
| total thickness of low RI layers in AR region | | | 217.9 nm |

Example 3

A strengthened glass substrate was coated with the outer layered film of Table 4 below, designated Ex. 3. In particular, the outer layered film of Ex. 3 has 21 layers with layer 8 being the thickest (500 nm). Note that the thickness of layer 8 can be adjusted from about 200-10,000+ nm without substantially changing the optical performance. Also, the thickness of the substrate can be varied, for example from about 0.05 mm to about 5 mm, without departing from the spirit of the disclosure. For first-surface modeling calculations, the emergent air medium is not included.

Figure 6A:
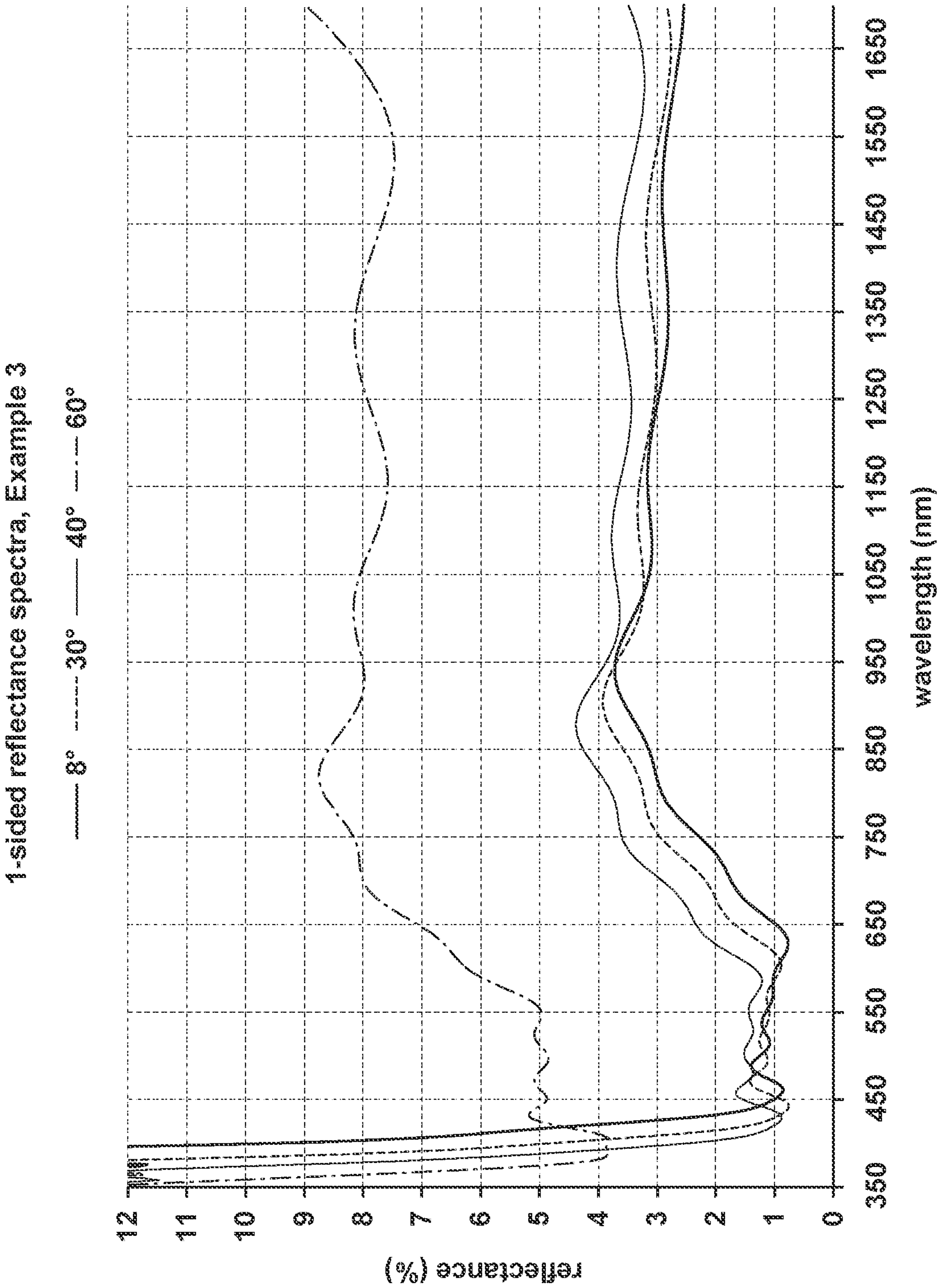
FIG. 6A is a plot of first-surface reflectance v. wavelength at incident angles of 8°, 30°, 40° and 60° for an exemplary cover article of the disclosure.
Figure 6B:
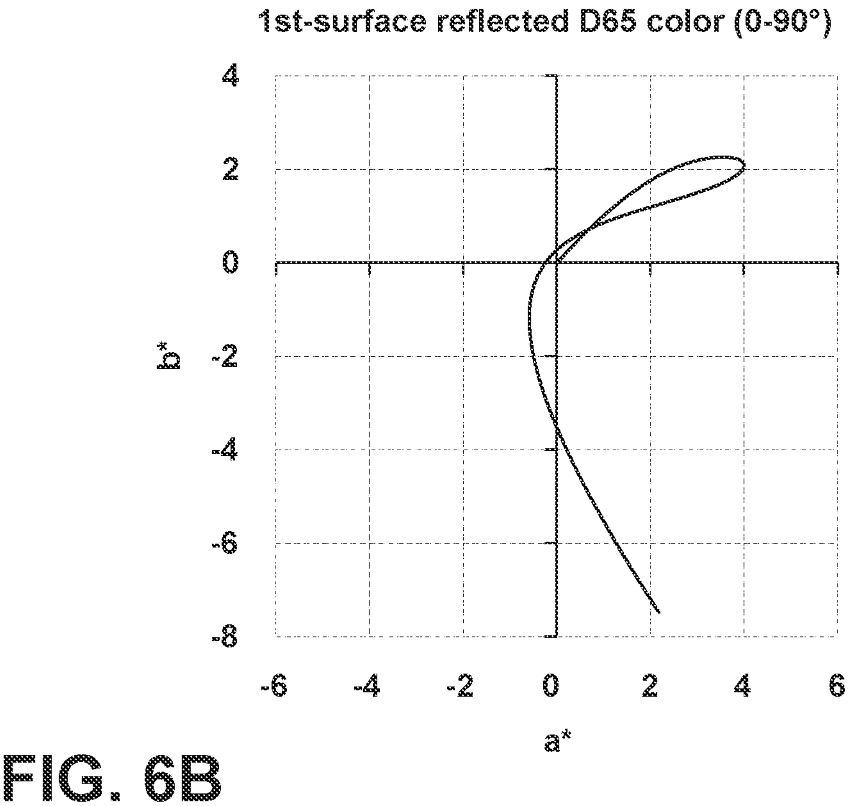
FIG. 6B is a plot of first-surface reflected color with a D65 illuminant for all viewing angles from 0 to 90 degrees for the exemplary cover article of FIG. 6A.
Figure 6C:
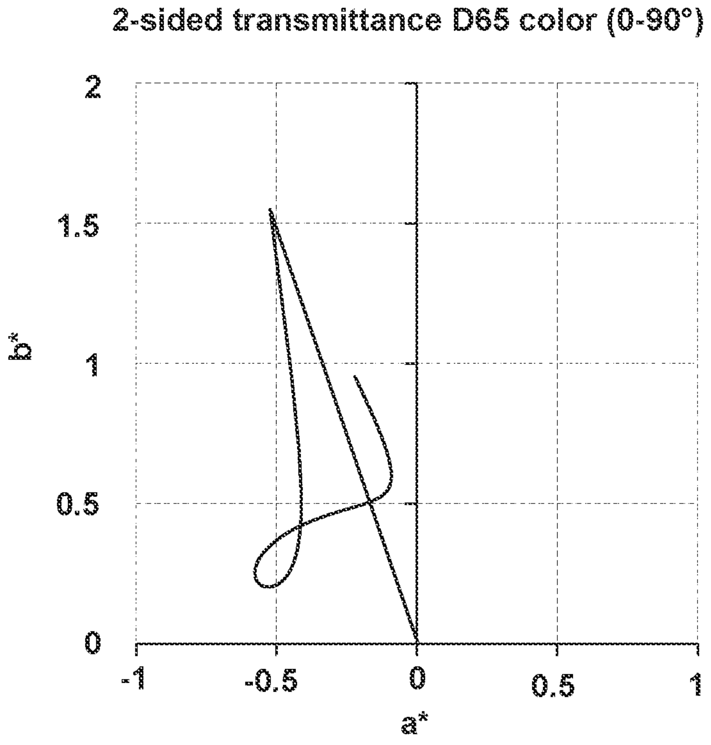
FIG. 6C is a plot of two-surface transmitted color with a D65 illuminant for all viewing angles from 0 to 90 degrees for the exemplary cover article of FIG. 6A.

Optical properties of Ex. 3 are shown in FIGS. 6A-6C. In particular, FIG. 6A is a plot of first-surface reflectance v. wavelength at incident angles of 8°, 30°, 40° and 60° for this example cover article. Ex. 3 has a first-surface reflectance in the visible range of 450-700 nm that is below 2% at near-normal (8 degrees) incidence. Further, the first-surface reflectance remains below 4% over an extended IR bandwidth from 800-1700 nm for viewing (light incidence) angles from 0-30 degrees, remains below 5% from 0-40 degrees angles of incidence, and remains below 9% at 60 degrees incidence.

FIG. 6B is a plot of first-surface reflected color with a D65 illuminant for all viewing angles from 0 to 90 degrees for this example cover article. As is evident from FIG. 6B, the reflected color ranges from about −0.6 to +4.0 in a* and about −7.5 to +2.3 in b*.

Further, FIG. 6C is a plot of two-surface transmitted color with a D65 illuminant for all viewing angles from 0 to 90 degrees for this example cover article. The results displayed in FIG. 6C are from modeling of this cover article with an outer layered film on one primary surface of the glass substrate, and an uncoated glass substrate forming the second primary surface. As shown in FIG. 6C, the transmitted color ranges from about −0.6 to +0 in a* and about −0 to +1.6 in b*.

TABLE 4

Ex. 3, Cover Article for Sensor

| Layer | Material | Refractive index @ 550 nm | Layer thickness (nm) |
|---|---|---|---|
| N/A | Air | 1 | N/A |
| 1 | SiO2 | 1.465 | 126.1 |
| 2 | SiN*x* | 2.043 | 20.0 |
| 3 | SiO2 | 1.465 | 8.0 |
| 4 | SiN*x* | 2.043 | 11.3 |
| 5 | SiO2 | 1.465 | 46.6 |
| 6 | SiN*x* | 2.043 | 38.0 |
| 7 | SiO2 | 1.465 | 24.9 |
| 8 | SiO*x*N*y* | 1.943 | 500.0 |
| 9 | SiO2 | 1.465 | 9.4 |
| 10 | SiN*x* | 2.043 | 48.1 |
| 11 | SiO2 | 1.465 | 24.5 |
| 12 | SiN*x* | 2.043 | 47.9 |
| 13 | SiO2 | 1.465 | 38.8 |
| 14 | SiN*x* | 2.043 | 38.0 |
| 15 | SiO2 | 1.465 | 55.3 |
| 16 | SiN*x* | 2.043 | 26.6 |
| 17 | SiO2 | 1.465 | 70.6 |
| 18 | SiN*x* | 2.043 | 16.5 |
| 19 | SiO2 | 1.465 | 76.4 |
| 20 | SiN*x* | 2.043 | 8.0 |
| 21 | SiO2 | 1.465 | 25.0 |
| Substrate | Glass - Corning ® Gorilla ® Glass 3 | 1.507 | 0.3 mm |
| Total thickness | | | 1259.7 nm |
| AR region thickness | | | 274.8 nm |
| volume of high RI material in AR region | | | 25.2% |
| total thickness of low RI layers in AR region | | | 205.5 nm |

Example 4

A strengthened glass substrate was coated with the outer layered film of Table 5 below, designated Ex. 4. In particular, the outer layered film of Ex. 4 has 19 layers with layer 8 being the thickest (600 nm). Note that the thickness of layer 8 can be adjusted from about 200-10,000+ nm without substantially changing the optical performance. Also, the thickness of the substrate can be varied, for example from about 0.05 mm to about 5 mm, without departing from the spirit of the disclosure. For first-surface modeling calculations, the emergent air medium is not included.

Figure 7A:
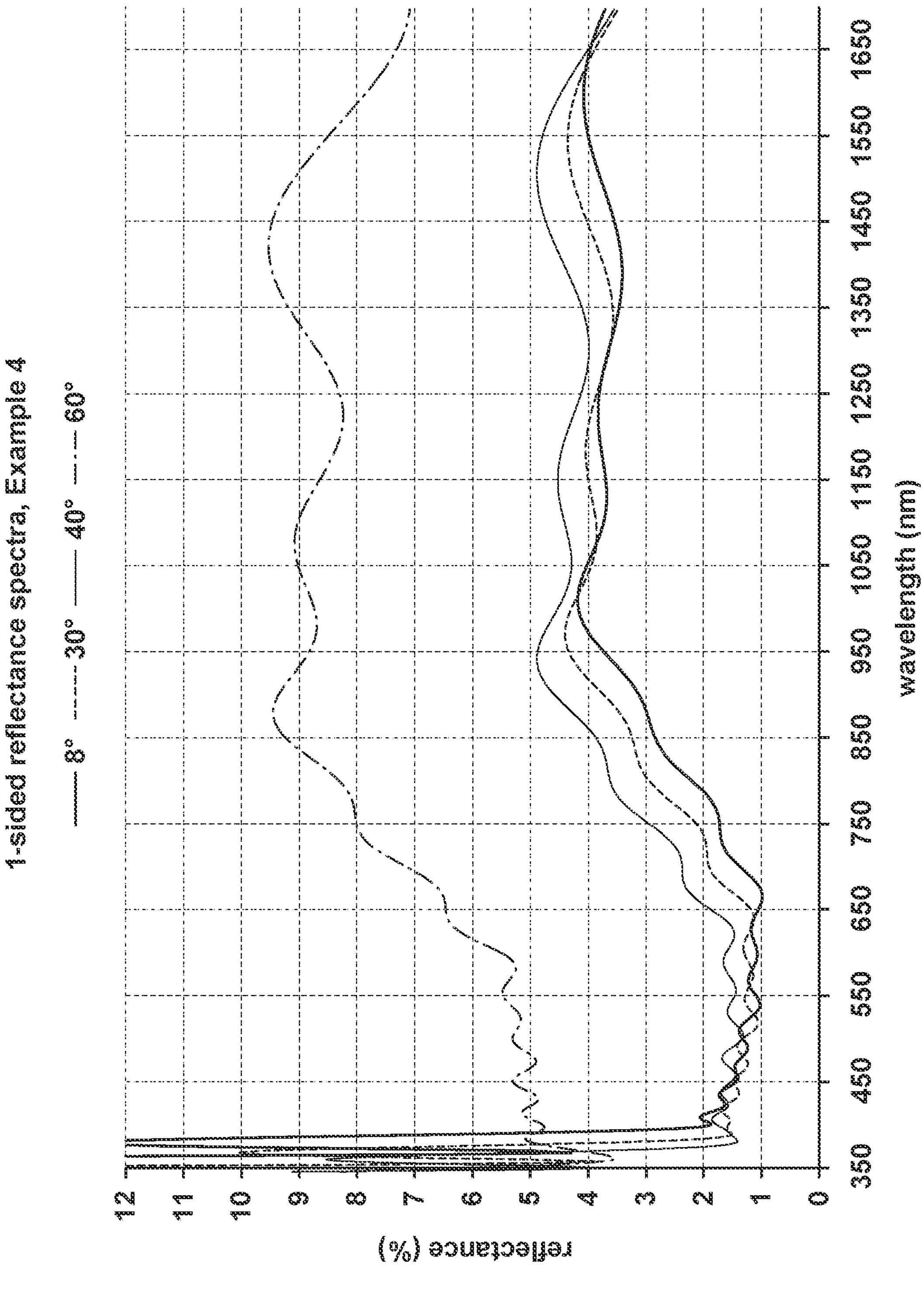
FIG. 7A is a plot of first-surface reflectance v. wavelength at incident angles of 8°, 30°, 40° and 60° for an exemplary cover article of the disclosure.
Figure 7B:
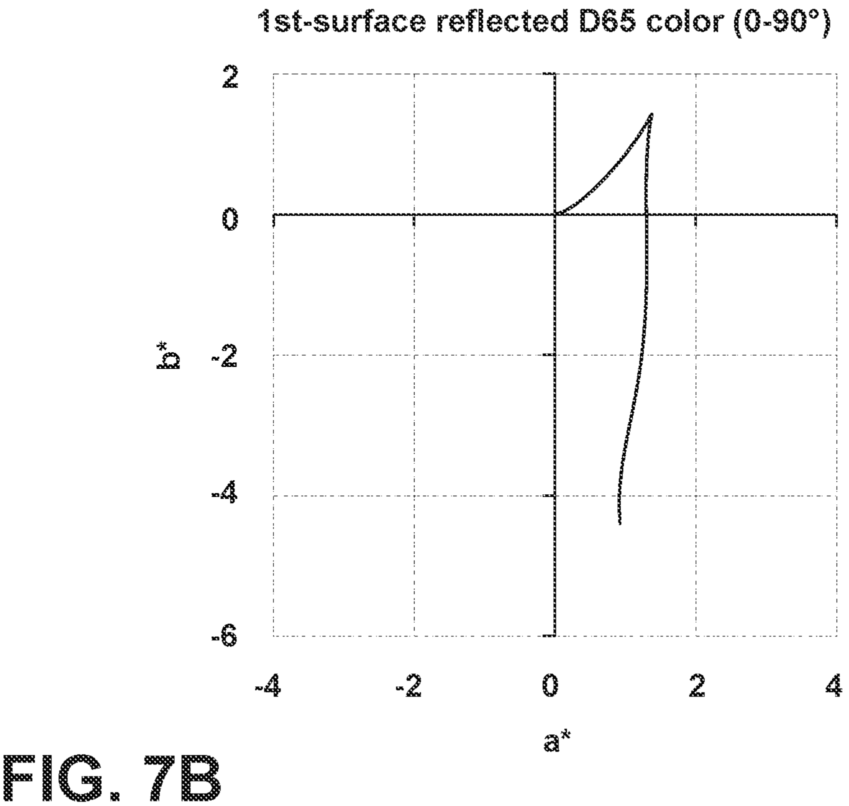
FIG. 7B is a plot of first-surface reflected color with a D65 illuminant for all viewing angles from 0 to 90 degrees for the exemplary cover article of FIG. 7A.
Figure 7C:
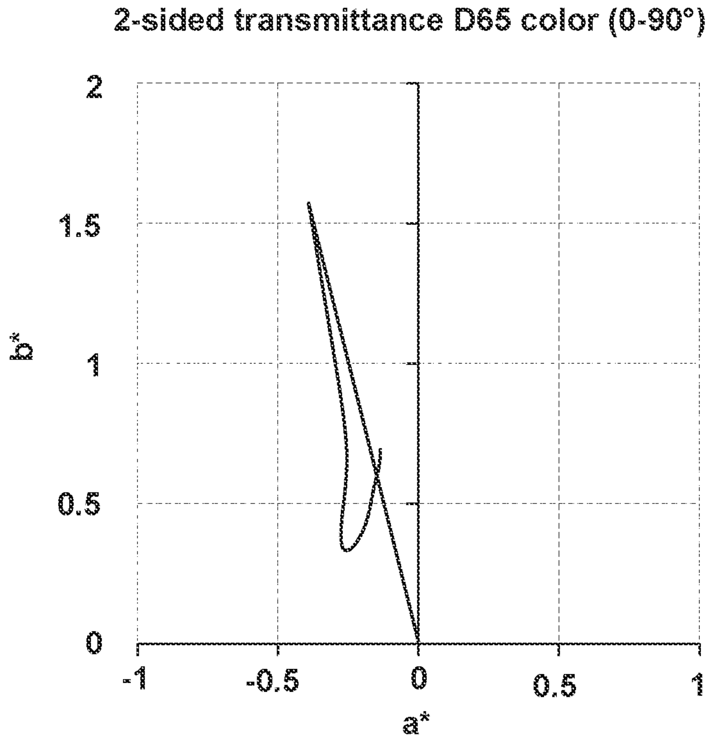
FIG. 7C is a plot of two-surface transmitted color with a D65 illuminant for all viewing angles from 0 to 90 degrees for the exemplary cover article of FIG. 7A.

Optical properties of Ex. 4 are shown in FIGS. 7A-7C. In particular, FIG. 7A is a plot of first-surface reflectance v. wavelength at incident angles of 8°, 30°, 40° and 60° for this example cover article. Ex. 4 has a first-surface reflectance in the visible range of 450-700 nm that is below 2% at near-normal (8 degrees) incidence. Further, the first-surface reflectance remains below 4.5% over an extended IR bandwidth from 800-1700 nm for viewing (light incidence) angles from 0-30 degrees, remains below 5% from 0-40 degrees from 800-1700 nm, and remains below 10% from 800-1700 nm at 60 degrees incidence.

FIG. 7B is a plot of first-surface reflected color with a D65 illuminant for all viewing angles from 0 to 90 degrees for this example cover article. As is evident from FIG. 7B, the reflected color ranges from about −0 to +1.4 in a* and about −4.4 to +1.4 in b*.

Further, FIG. 7C is a plot of two-surface transmitted color with a D65 illuminant for all viewing angles from 0 to 90 degrees for this example cover article. The results displayed in FIG. 7C are from modeling of this cover article with an outer layered film on one primary surface of the glass substrate, and an uncoated glass substrate forming the second primary surface. As shown in FIG. 7C, the transmitted color ranges from about −0.4 to +0 in a* and about −0 to +1.6 in b*.

TABLE 5

Ex. 4, Cover Article for Sensor

| Layer | Material | Refractive index @ 550 nm | Layer thickness (nm) |
|---|---|---|---|
| N/A | Air | 1 | N/A |
| 1 | SiO2 | 1.465 | 124.3 |
| 2 | SiN*x* | 2.043 | 29.4 |
| 3 | SiO2 | 1.465 | 49.4 |
| 4 | SiN*x* | 2.043 | 37.6 |
| 5 | SiO2 | 1.465 | 38.2 |
| 6 | SiN*x* | 2.043 | 40.3 |
| 7 | SiO2 | 1.465 | 14.2 |
| 8 | SiO*x*N*y* | 1.943 | 600.0 |
| 9 | SiO2 | 1.465 | 6.4 |
| 10 | SiO*x*N*y* | 1.943 | 64.9 |
| 11 | SiO2 | 1.465 | 20.3 |
| 12 | SiO*x*N*y* | 1.943 | 52.6 |
| 13 | SiO2 | 1.465 | 39.6 |
| 14 | SiO*x*N*y* | 1.943 | 37.4 |
| 15 | SiO2 | 1.465 | 59.4 |
| 16 | SiO*x*N*y* | 1.943 | 23.0 |
| 17 | SiO2 | 1.465 | 70.4 |
| 18 | SiO*x*N*y* | 1.943 | 10.8 |
| 19 | SiO2 | 1.465 | 25.0 |
| Substrate | Glass - Corning ® Gorilla ® Glass 3 | 1.507 | 0.3 mm |
| Total thickness | | | 1343.4 nm |
| AR region thickness | | | 333.5 nm |
| volume of high RI material in AR region | | | 32.2% |
| total thickness of low RI layers in AR region | | | 226.1 nm |

Example 5

A strengthened glass substrate was coated with the outer layered film of Table 6 below, designated Ex. 5. In particular, the outer layered film of Ex. 5 has 22 layers with layer 11 being the thickest (1960 nm). Note that the thickness of layer 11 can be adjusted from about 200-10,000+ nm without substantially changing the optical performance. Also, the thickness of the substrate can be varied, for example from about 0.05 mm to about 5 mm, without departing from the spirit of the disclosure. For first-surface modeling calculations, the emergent air medium is not included.

Ex. 5 uses a different $SiO_xN_y$ material (as compared to Exs. 1-4) for the impedance matching and thickest layer of the antireflective region of the outer layered film. This $SiO_xN_y$ material has a refractive index of 1.829, an elastic modulus of ~160 GPa, a compressive stress of ~−940 MPa, and a hardness of ~17.8 GPa. This combination of hardness, modulus, and compressive stress has been shown to improve or optimize the combined scratch resistance and flexural strength of this cover article, which includes a chemically strengthened glass substrate.

Figure 8A:
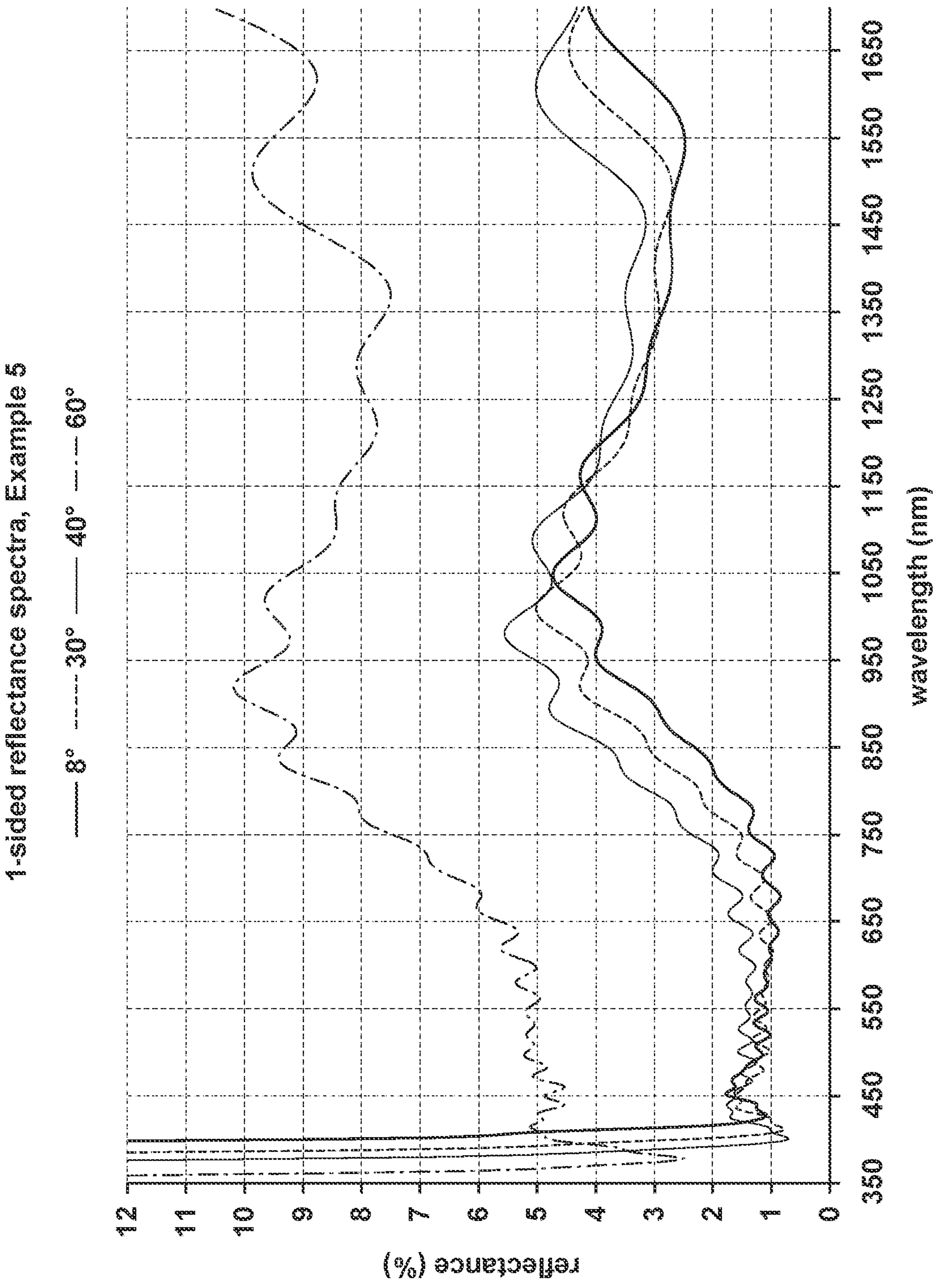
FIG. 8A is a plot of first-surface reflectance v. wavelength at incident angles of 8°, 30°, 40° and 60° for an exemplary cover article of the disclosure.
Figure 8B:
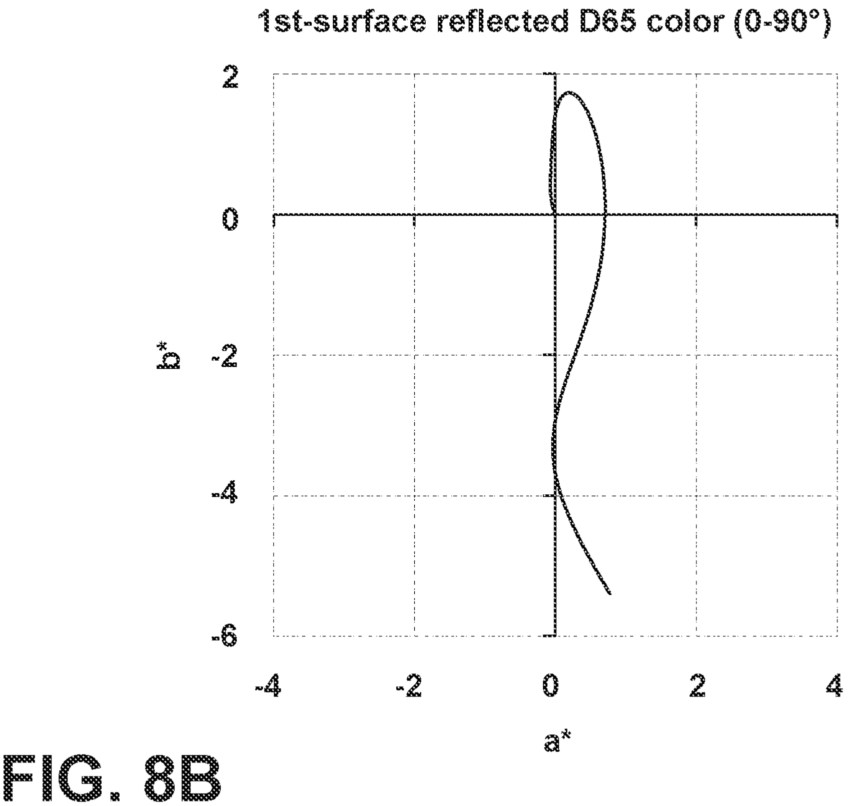
FIG. 8B is a plot of first-surface reflected color with a D65 illuminant for all viewing angles from 0 to 90 degrees for the exemplary cover article of FIG. 8A.
Figure 8C:
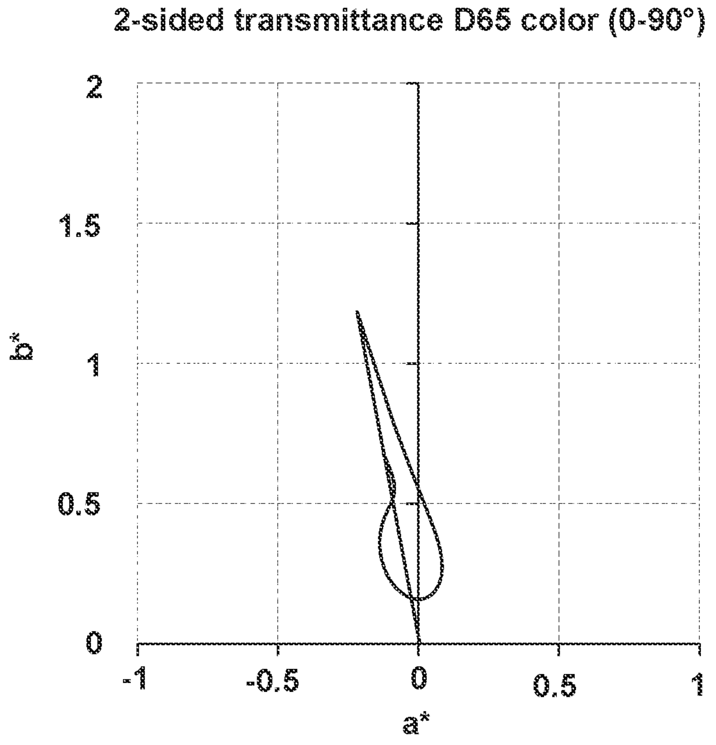
FIG. 8C is a plot of two-surface transmitted color with a D65 illuminant for all viewing angles from 0 to 90 degrees for the exemplary cover article of FIG. 8A.

Optical properties of Ex. 5 are shown in FIGS. 8A-8C. In particular, FIG. 8A is a plot of first-surface reflectance v. wavelength at incident angles of 8°, 30°, 40° and 60° for this example cover article. Ex. 5 has a first-surface reflectance in the visible range of 450-700 nm that is below 2% at near-normal (8 degrees) incidence. Further, the first-surface reflectance remains below 5.10% over an extended IR bandwidth from 800-1700 nm for viewing (light incidence) angles from 0-30 degrees, remains below 6% from 0-40 degrees from 800-1700 nm, and remains below 110% from 800-1700 nm at 60 degrees incidence.

FIG. 8B is a plot of first-surface reflected color with a D65 illuminant for all viewing angles from 0 to 90 degrees for this example cover article. As is evident from FIG. 8B, the reflected color ranges from about −0.1 to +0.8 in a* and about −5.4 to +1.7 in b*.

Further, FIG. 8C is a plot of two-surface transmitted color with a D65 illuminant for all viewing angles from 0 to 90 degrees for this example cover article. The results displayed in FIG. 8C are from modeling of this cover article with an outer layered film on one primary surface of the glass substrate, and an uncoated glass substrate forming the second primary surface. As shown in FIG. 8C, the transmitted color ranges from about −0.25 to +0.1 in a* and about −0 to +1.2 in b*.

TABLE 6

Ex. 5, Cover Article for Sensor

| Layer | Material | Refractive index @ 550 nm | Layer thickness (nm) |
|---|---|---|---|
| N/A | Air | 1 | N/A |
| 1 | SiO2 | 1.476 | 121.5 |
| 2 | SiNx | 2.043 | 39.2 |
| 3 | SiO2 | 1.476 | 35.2 |
| 4 | SiNx | 2.043 | 57.4 |
| 5 | SiO2 | 1.476 | 21.3 |
| 6 | SiNx | 2.043 | 85.5 |
| 7 | SiO2 | 1.476 | 8.0 |
| 8 | SiNx | 2.043 | 75.1 |
| 9 | SiO2 | 1.476 | 17.1 |
| 10 | SiNx | 2.043 | 27.7 |
| 11 | SiOxNy | 1.829 | 1960.0 |
| 12 | SiO2 | 1.476 | 6.8 |
| 13 | SiOxNy | 1.829 | 69.3 |
| 14 | SiO2 | 1.476 | 20.8 |
| 15 | SiOxNy | 1.829 | 56.6 |
| 16 | SiO2 | 1.476 | 39.8 |
| 17 | SiOxNy | 1.829 | 40.6 |
| 18 | SiO2 | 1.476 | 59.0 |
| 19 | SiOxNy | 1.829 | 25.2 |
| 20 | SiO2 | 1.476 | 69.1 |
| 21 | SiOxNy | 1.829 | 11.5 |
| 22 | SiO2 | 1.476 | 20.0 |
| Substrate | Glass - Corning ® Gorilla ® Glass 3 | 1.507 | 0.5 mm |
| Total thickness | | | 2866.6 nm |
| AR region thickness | | | 488.0 nm |
| volume of high RI material in AR region | | | 58.4% |
| total thickness of low RI layers in AR region | | | 203.1 nm |

Example 6

A strengthened glass-ceramic substrate was coated with the outer layered film of Table 7 below, designated Ex. 6. In particular, the outer layered film of Ex. 6 has 22 layers with layer 11 being the thickest (1960 nm). Note that the thickness of layer 11 can be adjusted from about 200-10,000+ nm without substantially changing the optical performance. Also, the thickness of the substrate can be varied, for example from about 0.05 mm to about 5 mm, without departing from the spirit of the disclosure. For first-surface modeling calculations, the emergent air medium is not included.

Ex. 6 is a similar design to Ex. 5, with the substrate being changed to a chemically strengthened glass-ceramic composition. Also, the impedance matching layers (i.e., the layers between the substrate and the scratch resistant layer, layer 11) have been modified to account for the differing refractive index of the glass-ceramic substrate. Ex. 6 also uses the same optimized $SiO_xN_y$ material as Ex. 5 for the impedance matching and thickest scratch resistant layer. This $SiO_xN_y$ material has a refractive index of 1.829, an elastic modulus of ~160 GPa, a compressive stress of ~−940 MPa, and a hardness of ~17.8 GPa. This combination of hardness, modulus, and compressive stress has been shown to improve or optimize the combined scratch resistance and flexural strength of this cover article.

Figure 9A:
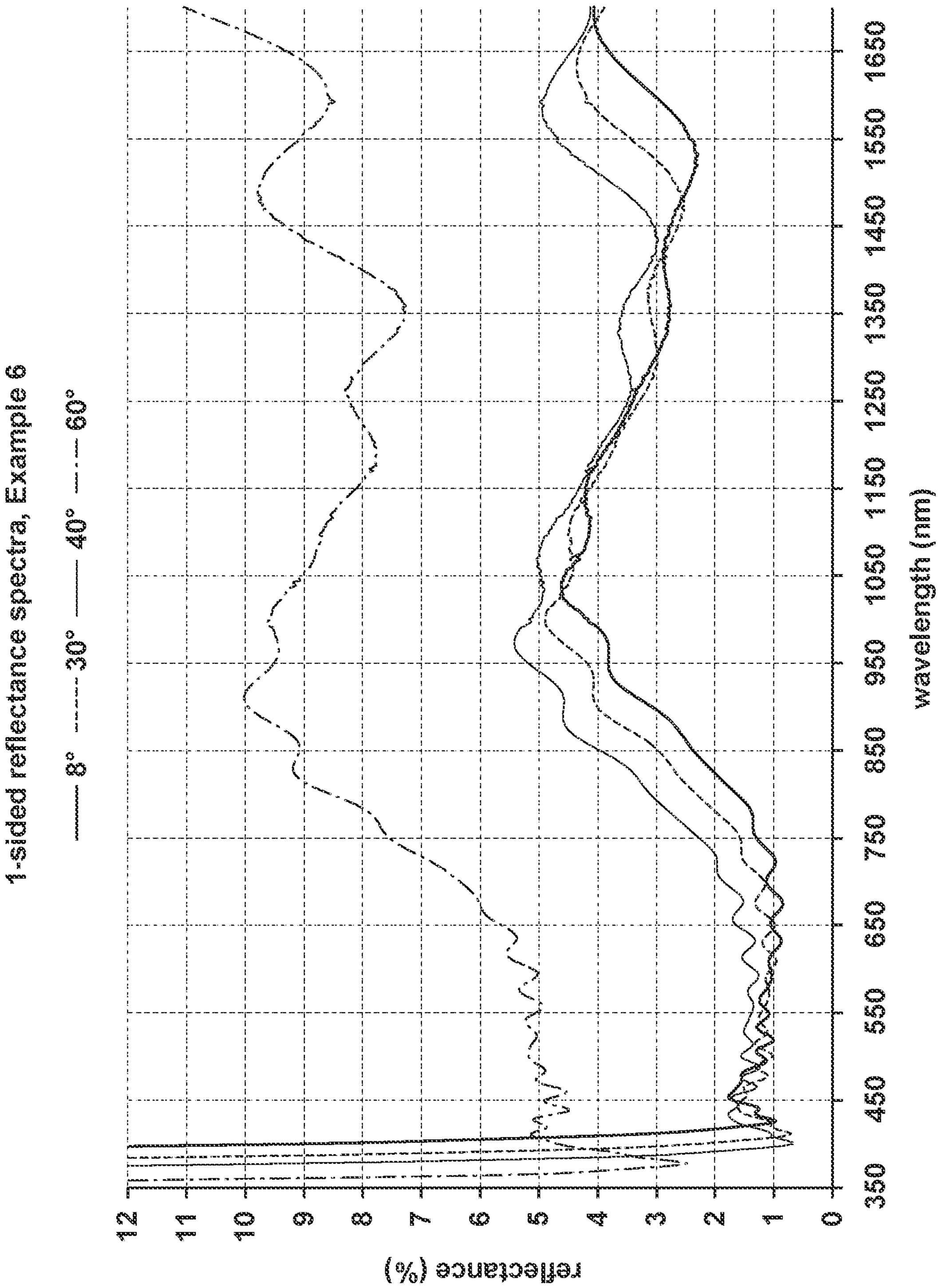
FIG. 9A is a plot of first-surface reflectance v. wavelength at incident angles of 8°, 30°, 40° and 60° for an exemplary cover article of the disclosure.
Figure 9B:
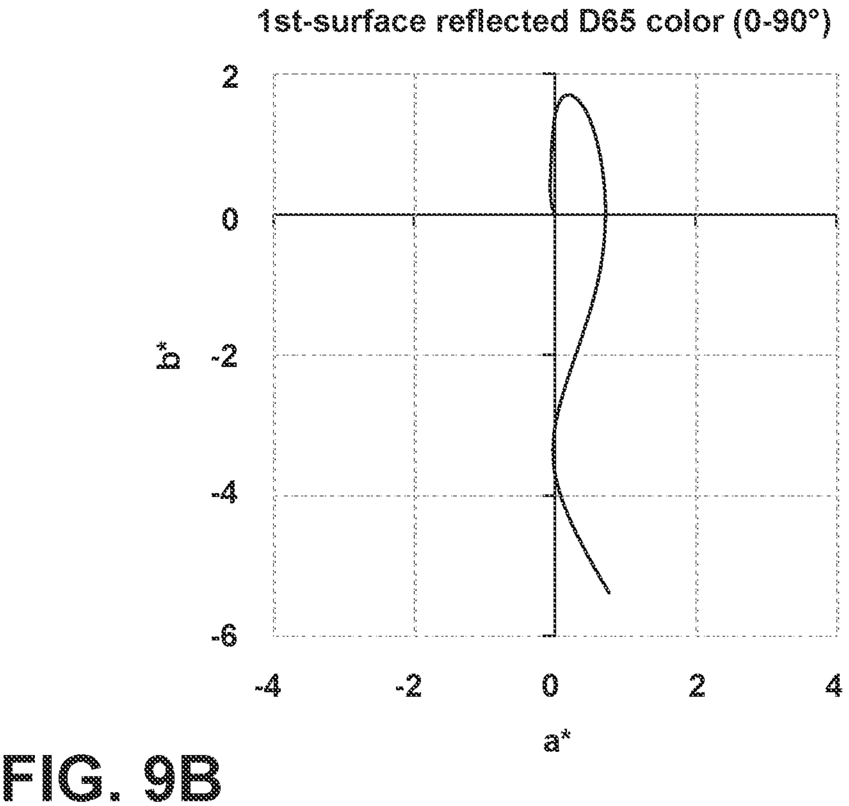
FIG. 9B is a plot of first-surface reflected color with a D65 illuminant for all viewing angles from 0 to 90 degrees for the exemplary cover article of FIG. 9A.
Figure 9C:
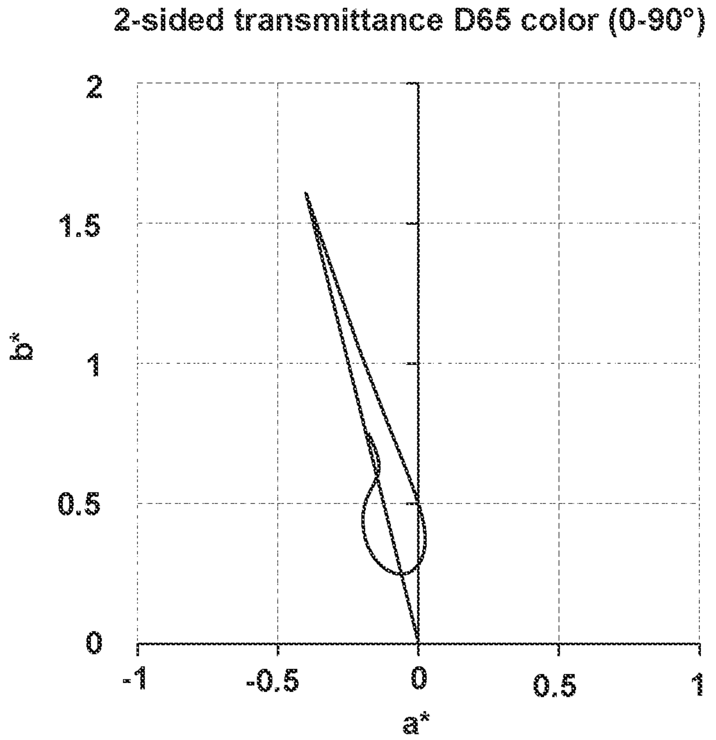
FIG. 9C is a plot of two-surface transmitted color with a D65 illuminant for all viewing angles from 0 to 90 degrees for the exemplary cover article of FIG. 9A.

Optical properties of Ex. 6 are shown in FIGS. 9A-9C. In particular, FIG. 9A is a plot of first-surface reflectance v. wavelength at incident angles of 8°, 30°, 40° and 60° for this example cover article. Ex. 6 has a first-surface reflectance in the visible range of 450-700 nm that is below 2% at near-normal (8 degrees) incidence. Further, the first-surface reflectance remains below 5% over an extended IR bandwidth from 800-1700 nm for viewing (light incidence) angles from 0-30 degrees, remains below 5.5% from 0-40 degrees from 800-1700 nm, remains below 10.1% from 800-1670 nm at 60 degrees incidence, and remains below 11.5% from 800-1700 nm at 60 degrees incidence.

FIG. 9B is a plot of first-surface reflected color with a D65 illuminant for all viewing angles from 0 to 90 degrees for this example cover article. As is evident from FIG. 9B, the reflected color ranges from about −0.1 to +0.8 in a* and about −5.4 to +1.7 in b*.

Further, FIG. 9C is a plot of two-surface transmitted color with a D65 illuminant for all viewing angles from 0 to 90 degrees for this example cover article. The results displayed in FIG. 9C are from modeling of this cover article with an outer layered film on one primary surface of the glass-ceramic substrate, and an uncoated glass-ceramic substrate forming the second primary surface. As shown in FIG. 9C, the transmitted color ranges from about −0.4 to +0.1 in a* and about −0 to +1.6 in b*.

TABLE 7

Ex. 6, Cover Article for Sensor

| Layer | Material | Refractive index @ 550 nm | Layer thickness (nm) |
|---|---|---|---|
| N/A | Air | 1 | N/A |
| 1 | SiO2 | 1.476 | 121.5 |
| 2 | SiNx | 2.043 | 39.2 |
| 3 | SiO2 | 1.476 | 35.2 |
| 4 | SiNx | 2.043 | 57.4 |
| 5 | SiO2 | 1.476 | 21.3 |
| 6 | SiNx | 2.043 | 85.5 |
| 7 | SiO2 | 1.476 | 8.0 |
| 8 | SiNx | 2.043 | 75.1 |
| 9 | SiO2 | 1.476 | 17.1 |
| 10 | SiNx | 2.043 | 27.7 |
| 11 | SiOxNy | 1.829 | 1960.0 |
| 12 | SiO2 | 1.476 | 8.0 |
| 13 | SiOxNy | 1.829 | 66.0 |
| 14 | SiO2 | 1.476 | 22.2 |
| 15 | SiOxNy | 1.829 | 53.6 |
| 16 | SiO2 | 1.476 | 40.9 |
| 17 | SiOxNy | 1.829 | 38.6 |
| 18 | SiO2 | 1.476 | 58.9 |
| 19 | SiOxNy | 1.829 | 25.4 |
| 20 | SiO2 | 1.476 | 66.0 |
| 21 | SiOxNy | 1.829 | 13.7 |
| 22 | SiO2 | 1.476 | 25.0 |
| Substrate | Strengthened Glass-Ceramic | 1.533 | 0.5 mm |
| Total thickness | | | 2866.1 nm |
| AR region thickness | | | 488.0 nm |
| volume of high RI material in AR region | | | 58.4% |
| total thickness of low RI layers in AR region | | | 203.1 nm |

Example 7

A strengthened glass substrate was coated with the outer layered film of Table 8 below, designated Ex. 7. In particular, the outer layered film of Ex. 7 has 22 layers with layer 11 being the thickest (600 nm). Note that the thickness of layer 11 can be adjusted from about 200-10,000+ nm without substantially changing the optical performance. Also, the thickness of the substrate can be varied, for example from about 0.05 mm to about 5 mm, without departing from the spirit of the disclosure. For first-surface modeling calculations, the emergent air medium is not included.

Figure 10A:
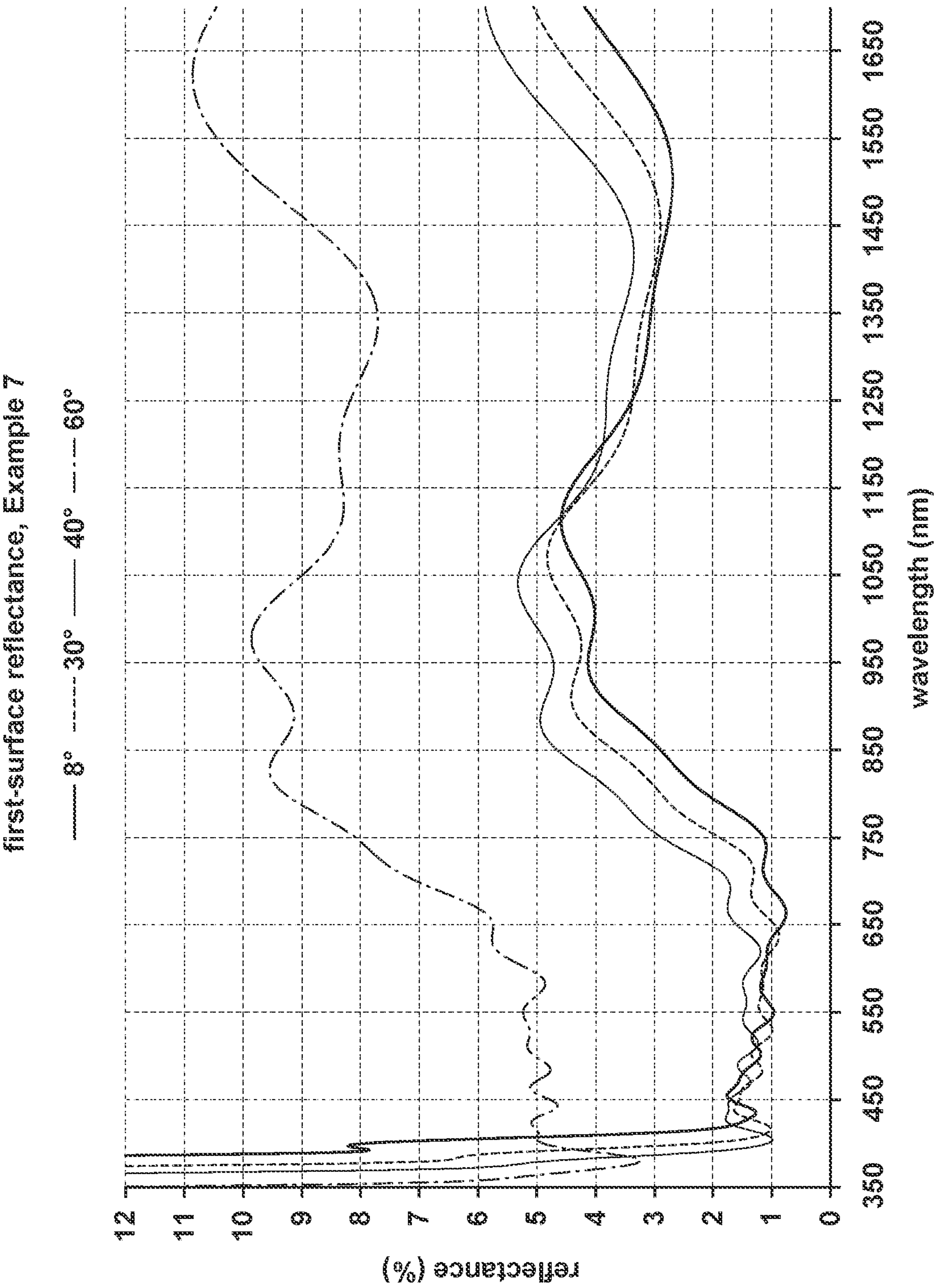
FIG. 10A is a plot of first-surface reflectance v. wavelength at incident angles of 8°, 30°, 40° and 60° for an exemplary cover article of the disclosure.
Figure 10B:
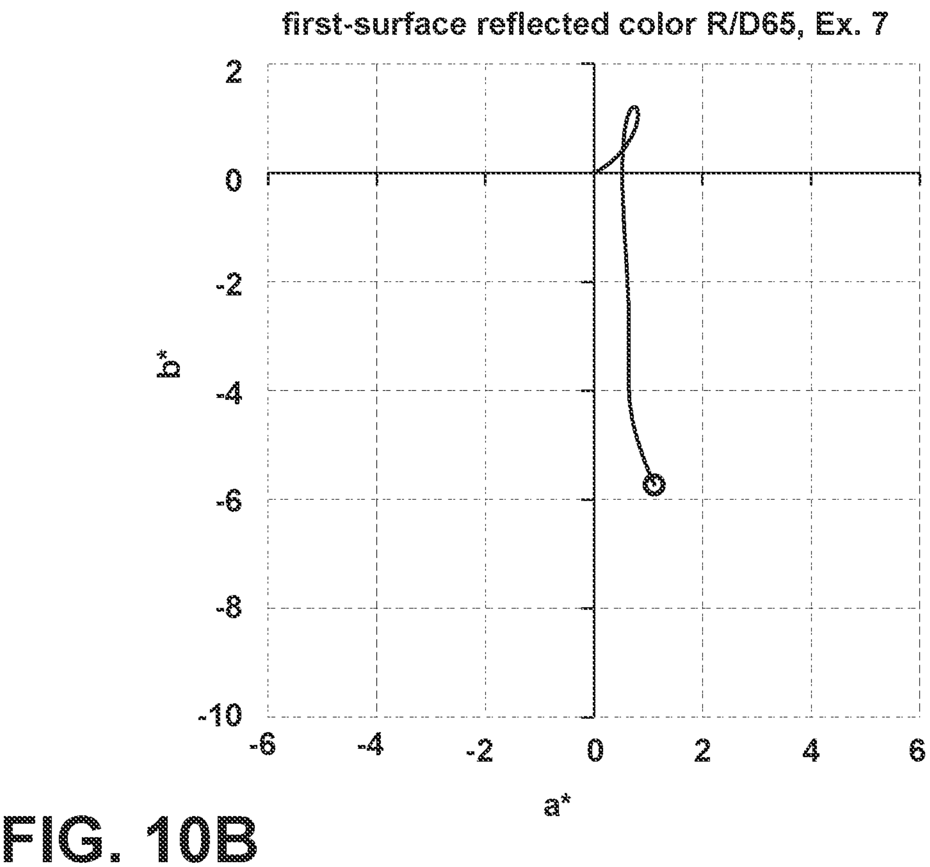
FIG. 10B is a plot of first-surface reflected color with a D65 illuminant for all viewing angles from 0 to 90 degrees for the exemplary cover article of FIG. 10A.
Figure 10C:
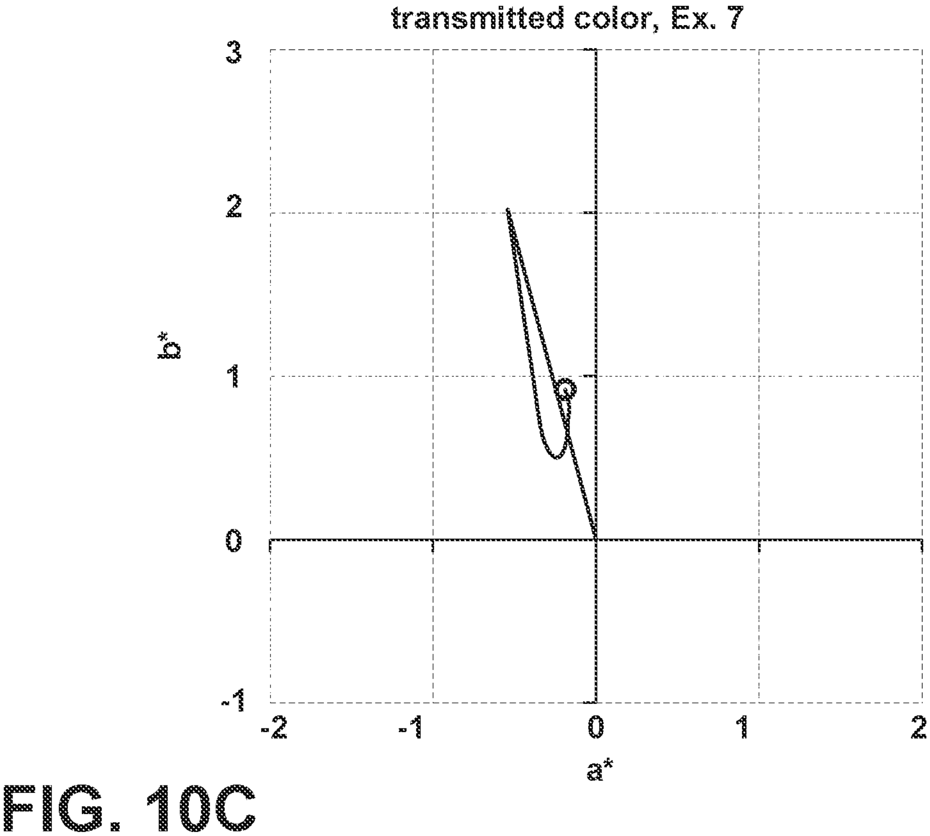
FIG. 10C is a plot of two-surface transmitted color with a D65 illuminant for all viewing angles from 0 to 90 degrees for the exemplary cover article of FIG. 10A.

Optical properties of Ex. 7 are shown in FIGS. 10A-10C. In particular, FIG. 10A is a plot of first-surface reflectance v. wavelength at incident angles of 8°, 30°, 40° and 60° for this example cover article. Ex. 7 has a first-surface reflectance in the visible range of 450-700 nm that is below 2% at near-normal (8 degrees) incidence. Further, the first-surface reflectance remains below 5.5% over an extended IR bandwidth from 800-1700 nm for viewing (light incidence) angles from 0-30 degrees, remains below 6% from 0-40 degrees from 800-1700 nm, and remains below 11% from 800-1700 nm at 60 degrees incidence.

FIG. 10B is a plot of first-surface reflected color with a D65 illuminant for all viewing angles from 0 to 90 degrees for this example cover article. As is evident from FIG. 10B, the reflected color ranges from about −0 to +1.1 in a* and about −5.7 to +1.2 in b*.

Further, FIG. 10C is a plot of two-surface transmitted color with a D65 illuminant for all viewing angles from 0 to 90 degrees for this example cover article. The results displayed in FIG. 10C are from modeling of this cover article with an outer layered film on one primary surface of the glass substrate, and an uncoated glass substrate forming the second primary surface. As shown in FIG. 10C, the transmitted color ranges from about −0.5 to +0 in a* and about −0 to +2.0 in b*.

TABLE 8

Ex. 7, Cover Article for Sensor

| Layer | Material | Refractive index @ 550 nm | Layer thickness (nm) |
|---|---|---|---|
| N/A | Air | 1 | N/A |
| 1 | SiO2 | 1.476 | 122.5 |
| 2 | SiNx | 2.043 | 36.8 |
| 3 | SiO2 | 1.476 | 40.3 |
| 4 | SiNx | 2.043 | 50.0 |
| 5 | SiO2 | 1.476 | 27.1 |
| 6 | SiNx | 2.043 | 68.6 |
| 7 | SiO2 | 1.476 | 8.0 |
| 8 | SiNx | 2.043 | 82.4 |
| 9 | SiO2 | 1.476 | 8.0 |
| 10 | SiNx | 2.043 | 23.4 |
| 11 | SiOxNy | 1.943 | 600.0 |
| 12 | SiO2 | 1.476 | 8.0 |
| 13 | SiOxNy | 1.943 | 63.2 |
| 14 | SiO2 | 1.476 | 23.0 |
| 15 | SiOxNy | 1.943 | 50.9 |
| 16 | SiO2 | 1.476 | 42.5 |
| 17 | SiOxNy | 1.943 | 35.6 |
| 18 | SiO2 | 1.476 | 62.0 |
| 19 | SiOxNy | 1.943 | 21.2 |
| 20 | SiO2 | 1.476 | 72.5 |
| 21 | SiOxNy | 1.943 | 9.1 |
| 22 | SiO2 | 1.476 | 20.0 |
| Substrate | Glass - Corning ® Gorilla ® Glass 3 | 1.507 | 0.5 mm |
| Total thickness | | | 1474.9 nm |
| AR region thickness | | | 467.1 nm |
| volume of high RI material in AR region | | | 55.9% |
| Total low RI layers thickness in AR region | | | 205.9 nm |

Table 9 below provides a summary of selected attributes from the comparative example (Comp. Ex. 1) and examples of the disclosure (Exs. 1-7). Reflection and transmission at infrared wavelengths from 1000-1700 nm at various light angles of incidence (AOI) significantly distinguish between the comparative and inventive examples (Ex. 1-7). Bolded values in Table 9 highlight these ranges where the performance of Comp. Ex. 1 is inferior to the inventive Examples, Exs. 1-7. Visible light metrics (photopic reflectance and transmittance, color metrics a* and b*) and hardness are also important for the intended applications. Hardness is estimated based on an empirical model derived from experimental multilayer films, starting from individual layers of $SiO_2$, $SiN_x$, and $SiO_xN_y$ with experimentally measured hardness values.

TABLE 9

| Summary of Attributes of Cover Articles for Sensor (Exs. 1-7, Comp. Ex. 1) | | | | | | | | |
|---|---|---|---|---|---|---|---|---|
| ID Example | Comp. Ex. 1 | Ex. 1 | Ex. 2 | Ex. 3 | Ex. 4 | Ex. 5 | Ex. 6 | Ex. 7 |
| Total thickness (nm) | 1326.0 | 1341.4 | 1346.1 | 1259.7 | 1343.4 | 2866.6 | 2866.1 | 1474.9 |
| 1st surface photopic avg. % Reflectance, 8 deg. AOI | 0.86 | 0.82 | 1.08 | 1.11 | 1.21 | 1.16 | 1.16 | 1.17 |
| 2-surface photopic avg. % Transmittance, 8 deg. AOI | 94.0 | 94.98 | 94.77 | 94.74 | 94.65 | 94.7 | 94.4 | 94.6 |
| 1st surface % Refl., 800-1000 nm avg., 8 deg. AOI | 1.33 | 3.81 | 2.94 | 3.41 | 3.22 | 3.04 | 3.03 | 3.48 |
| 1st surface % Refl., 800-1000 nm avg., 60 deg. AOI | 8.97 | 8.77 | 8.91 | 8.29 | 9.00 | 9.43 | 9.45 | 9.49 |
| 1st surface % Refl., 1000-1700 nm avg., 8 deg. AOI | **14.42** | 3.39 | 4.03 | 2.93 | 3.81 | 3.37 | 3.39 | 3.49 |
| 1st surface % Refl., 1000-1700 nm avg., 30 deg. AOI | **16.01** | 3.55 | 4.28 | 3.10 | 3.97 | 3.64 | 3.63 | 3.78 |
| 1st surface % Refl., 1000-1700 nm avg., 40 deg. AOI | **17.28** | 3.98 | 4.75 | 3.54 | 4.39 | 4.11 | 4.09 | 4.33 |
| 1st surface % Refl., 1000-1700 nm avg., 60 deg. AOI | **22.12** | 8.33 | 9.15 | 7.89 | 8.65 | 8.67 | 8.66 | 9.04 |
| 1st surface % Refl., 1000-1700 nm MAX., 8 deg. AOI | **23.60** | 4.09 | 4.59 | 3.43 | 4.20 | 4.72 | 4.62 | 4.59 |
| 2-surface % Trans., 800-1000 nm avg., 0 deg. AOI | 94.46 | 92.36 | 93.22 | 92.73 | 92.95 | 93.00 | 92.77 | 92.66 |
| 2-surface % Trans., 800-1000 nm avg., 60 deg. AOI | 83.12 | 83.83 | 83.70 | 84.22 | 83.63 | 83.14 | 82.87 | 83.23 |
| 2-surface % Trans., 1000-1700 nm avg., 0 deg. AOI | **82.13** | 92.75 | 92.14 | 93.19 | 92.35 | 92.66 | 92.35 | 92.66 |
| 2-surface % Trans., 1000-1700 nm avg., 30 deg. AOI | **80.41** | 92.47 | 91.78 | 92.90 | 92.07 | 92.26 | 91.98 | 92.25 |
| 2-surface % Trans., 1000-1700 nm avg., 40 deg. AOI | **79.01** | 91.72 | 90.99 | 92.13 | 91.33 | 91.47 | 91.19 | 91.39 |
| 2-surface % Trans., 1000-1700 nm avg., 60 deg. AOI | **72.45** | 84.18 | 83.52 | 84.54 | 83.93 | 83.76 | 83.44 | 83.59 |
| 2-surface % Trans., 1000-1700 nm MIN., 0 deg. AOI | **73.24** | 92.07 | 91.61 | 92.69 | 91.97 | 91.36 | 91.16 | 91.60 |
| a* range (1st surface % R), D65, all AOI = 0-90 | (−2.4, 1.0) | (−1.1, 7.1) | (0, 1.9) | (−0.6, 4.0) | (0, 1.4) | (−0.1, 0.8) | (−0.1, 0.8) | (0, 1.1) |
| b* range (1st surface % R), D65, all AOI = 0-90 | (−3.5, 2.3) | (−10.5, 2.9) | (−5.8, 1.8) | (−7.5, 2.3) | (−4.4, 1.4) | (−5.4, 1.7) | (−5.4, 1.7) | (−5.7, 1.2) |
| a* range (2-surface % T), D65, all AOI = 0-90 | (−0.2, 0.2) | (−0.8, 0) | (−0.4, 0) | (−0.6, 0) | (−0.4, 0) | (−0.25, 0.1) | (−0.4, 0.1) | (−0.5, 0) |
| b* range (2-surface % T), D65, all AOI = 0-90 | (0, 2.5) | (0, 1.9) | (0, 1.7) | (0, 1.6) | (0, 1.6) | (0, 1.2) | (0, 1.6) | (0, 2) |
| Model hardness @ 100 nm depth (GPa) | 12.6 | 9.6 | 9.7 | 9.6 | 9.6 | 11.5 | 11.5 | 11.2 |
| Model maximum hardness from 0-500 nm depth | 13.0 | 12.8 | 13.2 | 12.9 | 13.2 | 15.8 | 15.8 | 14.4 |

Example 8

A cover article including a strengthened glass-ceramic substrate was prepared for this example with the structure delineated below in Table 10, and as described in U.S. Provisional Application 63/337,846, filed on May 3, 2022, entitled "Transparent glass-ceramic articles with high shallow hardness and display devices with the same," and incorporated herein by reference in its entirety. The glass-ceramic substrate is an ion-exchanged, LAS glass-ceramic substrate having a thickness of 600 m and a refractive index of 1.533. Further, the glass-ceramic substrate has the following composition: 74.5% $SiO_2$; 7.53% $Al_2O_3$; 2.1% $P_2O_5$; 11.3% $Li_2O$; 0.06% $Na_2O$; 0.12% $K_2O$; 4.31% $ZrO_2$; 0.06% $Fe_2O_3$; and 0.02% $SnO_2$ (wt %, on an oxide basis). In addition, the glass-ceramic substrate was cerammed according to the following schedule: (a) ramp from room temperature to 580° C. at 5° C./min; (b) hold at 580° C. for 2.75 hours; (c) ramp to 755° C. at 2.5° C./min; (d) hold at 755° C. for 0.75 hours; and (e) cool at a furnace rate to room temperature. After ceramming, the glass-ceramic substrate was ion-exchange strengthened in a molten salt bath of 60% $KNO_3$/40% $NaNO_3$+0.12% $LiNO_3$ (wt. %) at 500° C. for 6 hours. Further, the layers of the outer layered film were deposited according to vapor deposition conditions set forth in U.S. Patent Application Publication No. 2020/0158916, the salient portions of which are incorporated herein by reference.

Referring again to the cover article of this example, the layers (e.g., layers 17-23 in Table 10) of the outer layered film above the scratch-resistant layer (e.g., layer 16 in Table 10) are configured to achieve high shallow hardness while not negatively affecting the optical properties of the article, including reflectance in the visible, IR, and near-IR spectra. As is evident from the outer layered film design of Table 10, medium index layers ($SiO_xN_y$ layers 18, 20 and 22) are disposed adjacent to high index layers ($SiN_y$ layers 17, 19 and 21), which drive shallow high hardness levels in the article. Similarly, as is evident in Table 10, the total thickness of the low refractive index layers (e.g., $SiO_2$ layer 23) in the outer structure of the outer layered film above the scratch-resistant layer is minimized to a level that is less than 25 nm, which also helps drive shallow high hardness levels in the article. In at least some embodiments, this shallow high hardness level as described above can be appreciated with the cover article having a hardness greater than 15 GPa, or greater than 17 GPa as measured by a Berkovich Hardness Test at an indentation depth of 125 nm (e.g., see FIGS. 15B and 15C).

Figure 11A:
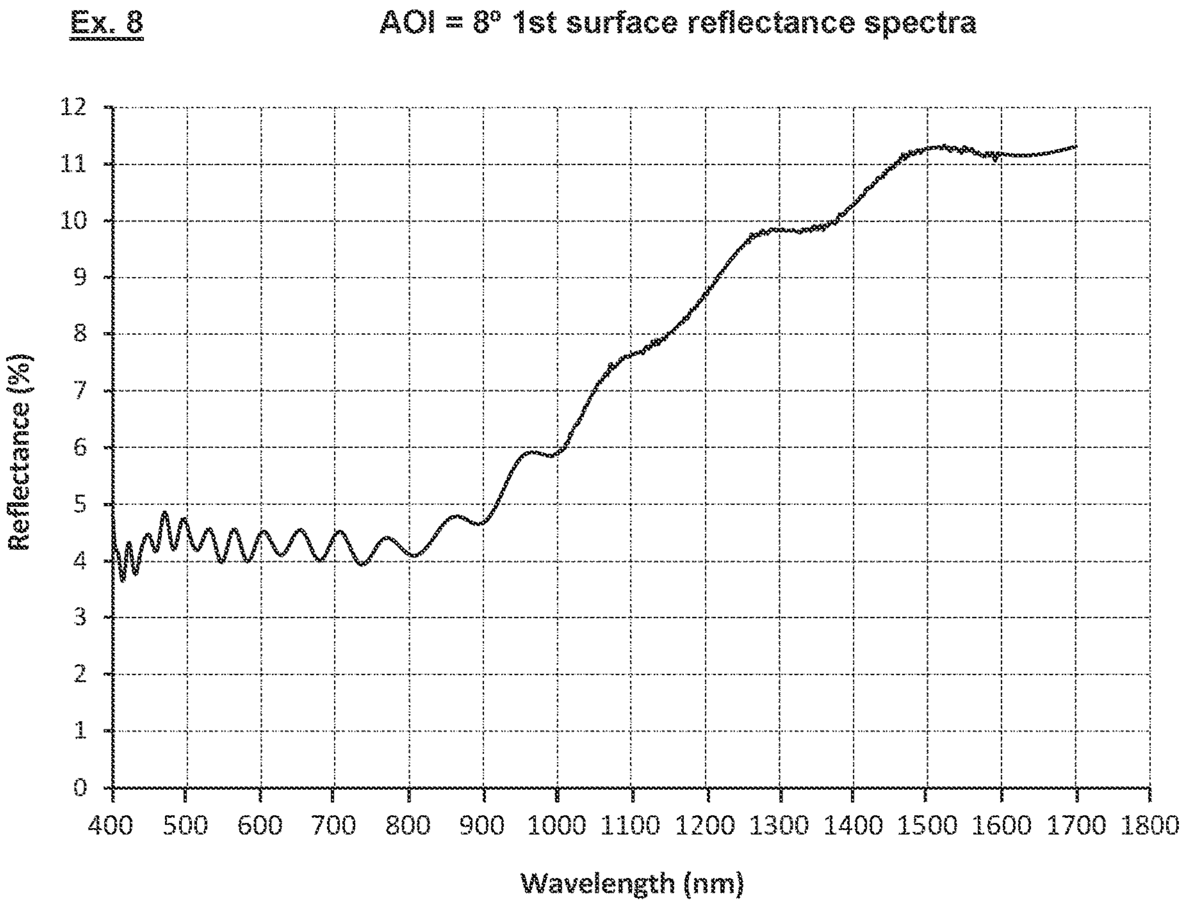
FIG. 11A is a plot of first-surface reflectance v. wavelength at incident angles of 8° for an exemplary cover article of the disclosure.

Referring to FIG. 11A, a plot is provided of first-surface reflectance vs. wavelength for this inventive example, as measured at a near-normal incident angle of 80. Notably, this example exhibits low maximum and minimum reflectance oscillations in the 1000 to 1700 nm wavelength band of less than 6%. It is also evident from FIG. 11A that this example exhibits a maximum reflectance of less than 12% in the near-infrared spectrum from 1000 to 1700 nm.

Figure 11B:
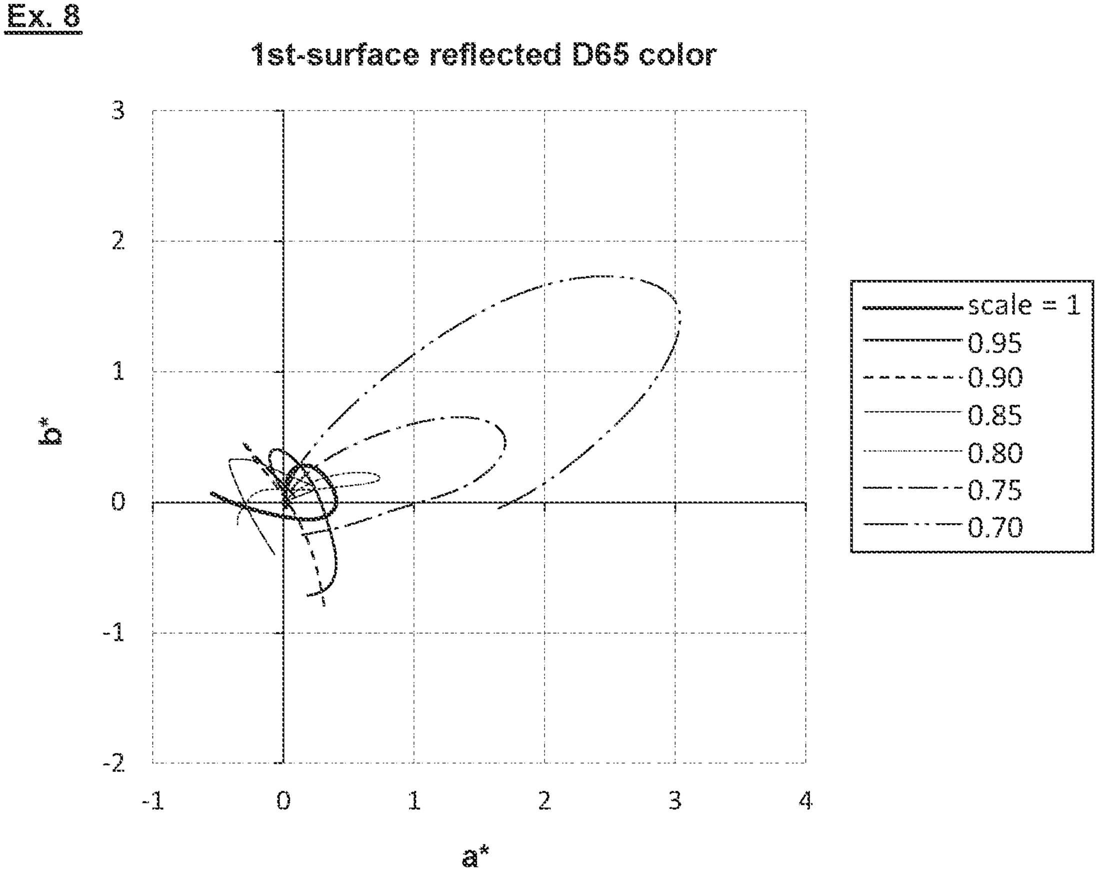
FIG. 11B is a plot of first-surface reflected color, as measured at incident angles from 0° to 90° with various optical film structure thickness scaling factors, for the exemplary cover article FIG. 11A.

Referring to FIG. 11B, a plot is provided of single-sided, reflected color for this inventive example, as measured at incident angles from 0° to 90° with various outer layered film thickness scaling factors. As is evident from FIG. 11B, the color shift exhibited by this inventive example is fairly consistent and less than 4 for a wide range of outer layered film thickness scaling factors from about 70 to 100%.

TABLE 10

Ex. 8 cover article design with strengthened glass-ceramic substrate

| Layer | Material | thickness (nm) | Index (550 nm) |
|---|---|---|---|
| | Glass-Ceramic | Substrate | 1.533 |
| 1 | SiO2 | 25 | 1.476 |
| 2 | SiOxNy | 12.54 | 1.829 |
| 3 | SiO2 | 71.63 | 1.476 |
| 4 | SiOxNy | 21.03 | 1.829 |
| 5 | SiO2 | 73.87 | 1.476 |
| 6 | SiOxNy | 29.33 | 1.829 |
| 7 | SiO2 | 63.3 | 1.476 |
| 8 | SiOxNy | 40.23 | 1.829 |
| 9 | SiO2 | 48.18 | 1.476 |
| 10 | SiOxNy | 52.74 | 1.829 |
| 11 | SiO2 | 32.29 | 1.476 |
| 12 | SiOxNy | 64.81 | 1.829 |
| 13 | SiO2 | 18.38 | 1.476 |
| 14 | SiOxNy | 72.37 | 1.829 |
| 15 | SiO2 | 8 | 1.476 |
| 16 | SiOxNy | 2000 | 1.829 |
| 17 | SiNy | 19.48 | 2.058 |
| 18 | SiOxNy | 26.77 | 1.744 |
| 19 | SiNy | 63.87 | 2.058 |
| 20 | SiOxNy | 8 | 1.744 |
| 21 | SiNy | 61.67 | 2.058 |
| 22 | SiOxNy | 76.23 | 1.744 |
| 23 | SiO2 | 14 | 1.476 |
| | Medium | Air | 1 |
| | Total thickness (nm): | | 2903.7 |
| | AR layers thickness (nm): | | 270.0 |
| | Low-RI in AR thickness (nm): | | 14 |

Example 9

A cover article including a strengthened glass-ceramic substrate was prepared for this example with the structure delineated below in Table 11 and as described in U.S. Provisional Application 63/337,846, filed on May 3, 2022, entitled "Transparent glass-ceramic articles with high shallow hardness and display devices with the same," and incorporated herein by reference in its entirety. The glass-ceramic substrate is an ion-exchanged, LAS glass-ceramic substrate having a thickness of 600 m and a refractive index of 1.533. The glass-ceramic substrate has the following composition: 74.5% $SiO_2$; 7.53% $Al_2O_3$; 2.1% $P_2O_5$; 11.3% $Li_2O$; 0.06% $Na_2O$; 0.12% $K_2O$; 4.31% $ZrO_2$; 0.06% $Fe_2O_3$; and 0.02% $SnO_2$ (wt %, on an oxide basis). In addition, the glass-ceramic substrate was cerammed according to the following schedule: (a) ramp from room temperature to 580° C. at 5° C./min; (b) hold at 580° C. for 2.75 hours; (c) ramp to 755° C. at 2.5° C./min; (d) hold at 755° C. for 0.75 hours; and (e) cool at a furnace rate to room temperature. After ceramming, the glass-ceramic substrate was ion-exchange strengthened in a molten salt bath of 60% $KNO_3$/40% $NaNO_3$+0.12% $LiNO_3$ (wt. %) at 500° C. for 6 hours. The layers of the outer layered film were deposited according to vapor deposition conditions set forth in U.S. Patent Application Publication No. 2020/0158916, the salient portions of which are incorporated herein by reference.

Referring again to the cover article of this example, the layers (e.g., layers 17-27 in Table 11) of the outer layered film above the scratch-resistant layer (e.g., layer 16 in Table 11) are configured to achieve high shallow hardness while not negatively affecting the optical properties of the article, including reflectance in the visible, IR, and near-IR spectra. As is evident from the outer layered film design of Table 11, medium index layers ($SiO_xN_y$, layers 18, 20, 22, 24 and 26) are disposed adjacent to high index layers ($SiN_y$, layers 17, 19, 21, 23, and 25), which drive shallow high hardness levels in the article. Similarly, as is evident in Table 11, the total thickness of the low refractive index layers (e.g., $SiO_2$ layer 27) in the outer structure of the outer layered film above the scratch-resistant layer is minimized to a level that is less than 25 nm, which also helps drive shallow high hardness levels in the article. In at least some embodiments, this shallow high hardness level as described above can be appreciated with the cover article having a hardness greater than 15 GPa, or greater than 17 GPa as measured by a Berkovich Hardness Test at an indentation depth of 125 nm (e.g., see FIGS. 15B and 15C).

Figure 12A:
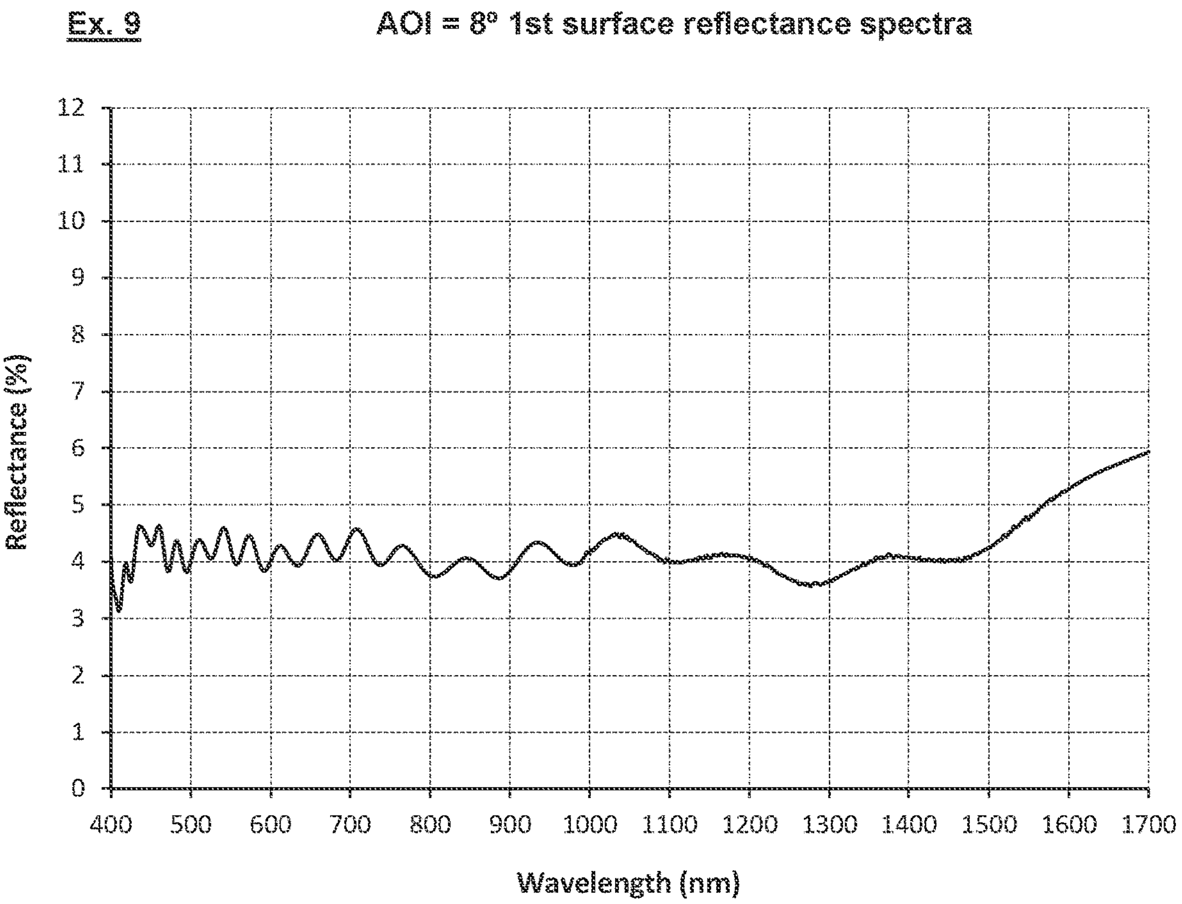
FIG. 12A is a plot of first-surface reflectance v. wavelength at incident angles of 8° for an exemplary cover article of the disclosure.

Referring to FIG. 12A, a plot is provided of first-surface reflectance vs. wavelength for this inventive example, as measured at a near-normal incident angle of 80. Notably, this example exhibits low maximum and minimum reflectance oscillations in the 1000 to 1700 nm wavelength band of less than 2.5%. It is also evident from FIG. 12A that this example exhibits a low maximum reflectance of less than 6% in the near-infrared spectrum from 1000 to 1700 nm.

Figure 12B:
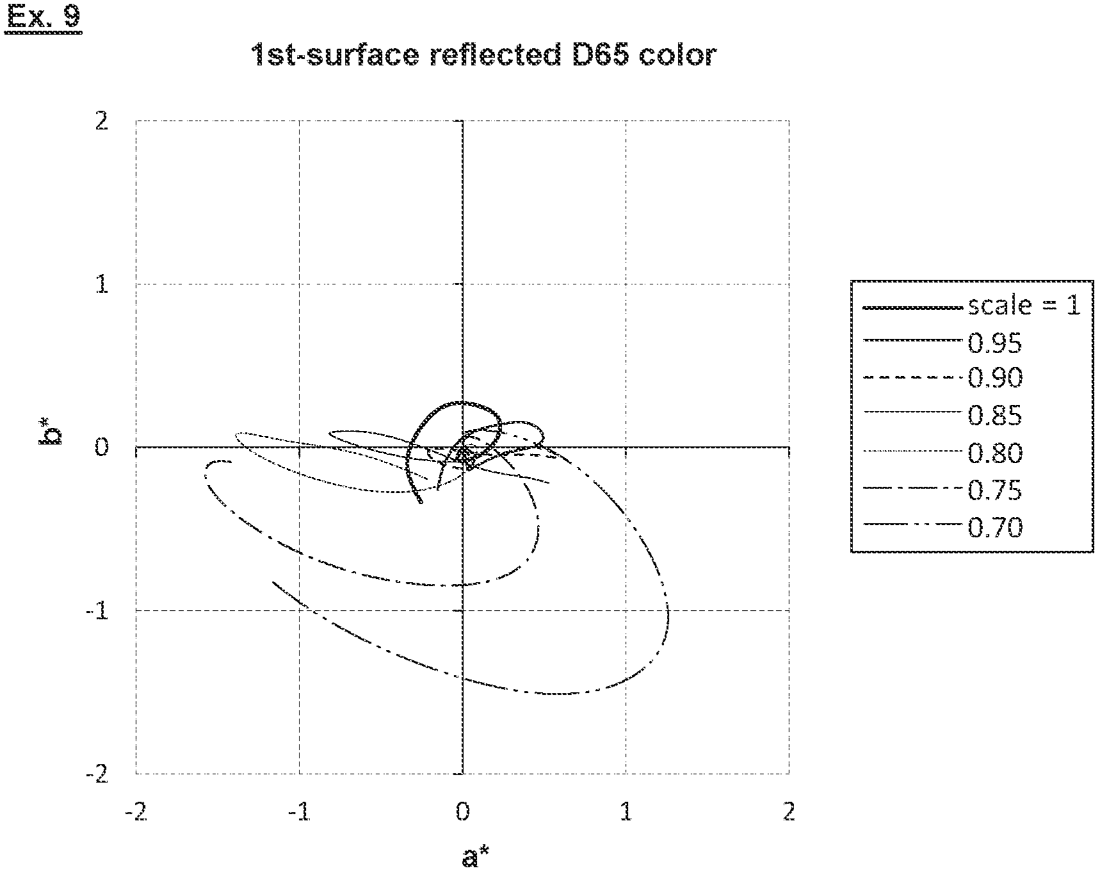
FIG. 12B is a plot of first-surface reflected color, as measured at incident angles from 0° to 90° with various optical film structure thickness scaling factors, for the exemplary cover article FIG. 12A.

Referring to FIG. 12B, a plot is provided of single-sided, reflected color for this inventive example, as measured at incident angles from 0° to 90° with various outer layered film thickness scaling factors. As is evident from FIG. 12B, the color shift exhibited by this inventive example is fairly consistent and less than 4 for the full range of outer layered film thickness scaling factors from about 50 to 100% depicted in this figure.

TABLE 11

Ex. 9 cover article design with strengthened glass-ceramic substrate

| Layer | Material | thickness (nm) | Index (550 nm) |
|---|---|---|---|
| | Glass-Ceramic | Substrate | 1.533 |
| 1 | SiO2 | 25 | 1.476 |
| 2 | SiOxNy | 12.54 | 1.829 |
| 3 | SiO2 | 71.63 | 1.476 |
| 4 | SiOxNy | 21.03 | 1.829 |
| 5 | SiO2 | 73.87 | 1.476 |
| 6 | SiOxNy | 29.33 | 1.829 |
| 7 | SiO2 | 63.3 | 1.476 |
| 8 | SiOxNy | 40.23 | 1.829 |
| 9 | SiO2 | 48.18 | 1.476 |
| 10 | SiOxNy | 52.74 | 1.829 |
| 11 | SiO2 | 32.29 | 1.476 |
| 12 | SiOxNy | 64.81 | 1.829 |
| 13 | SiO2 | 18.38 | 1.476 |

TABLE 11-continued

| Ex. 9 cover article design with strengthened glass-ceramic substrate | | | |
|---|---|---|---|
| Layer | Material | thickness (nm) | Index (550 nm) |
| 14 | SiOxNy | 72.37 | 1.829 |
| 15 | SiO2 | 8 | 1.476 |
| 16 | SiOxNy | 2000 | 1.829 |
| 17 | SiNy | 18.66 | 2.058 |
| 18 | SiOxNy | 34.63 | 1.744 |
| 19 | SiNy | 45.71 | 2.058 |
| 20 | SiOxNy | 19.13 | 1.744 |
| 21 | SiNy | 86.77 | 2.058 |
| 22 | SiOxNy | 8 | 1.744 |
| 23 | SiNy | 70.54 | 2.058 |
| 24 | SiOxNy | 33.86 | 1.744 |
| 25 | SiNy | 28.58 | 2.058 |
| 26 | SiOxNy | 103.04 | 1.655 |
| 27 | SiO2 | 14 | 1.476 |
| | Medium | Air | 1 |
| Total thickness (nm): | | | 3096.6 |
| AR layers thickness (nm): | | | 462.9 |
| Low-RI in AR thickness (nm): | | | 14 |

Example 10

A cover article including a strengthened glass-ceramic substrate was prepared for this example with the structure delineated below in Table 12 and as described in U.S. Provisional Application 63/337,846, filed on May 3, 2022, entitled "Transparent glass-ceramic articles with high shallow hardness and display devices with the same," and incorporated herein by reference in its entirety. The glass-ceramic substrate is an ion-exchanged, LAS glass-ceramic substrate having a thickness of 600 m and a refractive index of 1.528. Further, the glass-ceramic substrate has the following composition: 74.5% $SiO_2$; 7.53% $Al_2O_3$; 2.1% $P_2O_5$; 11.3% $Li_2O$; 0.06% $Na_2O$; 0.12% $K_2O$; 4.31% $ZrO_2$; 0.06% $Fe_2O_3$; and 0.02% $SnO_2$ (wt %, on an oxide basis). The glass-ceramic substrate was cerammed according to the following schedule: (a) ramp from room temperature to 580° C. at 5° C./min; (b) hold at 580° C. for 2.75 hours; (c) ramp to 755° C. at 2.5° C./min; (d) hold at 755° C. for 0.75 hours; and (e) cool at a furnace rate to room temperature. After ceramming, the glass-ceramic substrate was ion-exchange strengthened in a molten salt bath of 60% $KNO_3$/40% $NaNO_3$+0.12% $LiNO_3$ (wt. %) at 500° C. for 6 hours. The layers of the outer layered film were deposited according to vapor deposition conditions set forth in U.S. Patent Application Publication No. 2020/0158916, the salient portions of which are incorporated herein by reference.

Referring again to the cover article of this example, the layers (e.g., layers 17-23 in Table 12) of the outer layered film above the scratch-resistant layer (e.g., layer 16 in Table 12) are configured to achieve high shallow hardness while not negatively affecting the optical properties of the article, including reflectance in the visible, IR, and near-IR spectra. As is evident from the outer layered film design of Table 12, medium index layers ($SiO_xN_y$ layers 18, 20, and 22) are disposed adjacent to high index layers ($SiN_y$ layers 17, 19, and 21), which drive shallow high hardness levels in the article. Similarly, as is evident in Table 12, the total thickness of the low refractive index layers (e.g., $SiO_2$ layer 24) in the outer structure of the outer layered film above the scratch-resistant layer is minimized to a level that is less than 25 nm, which also helps drive shallow high hardness levels in the article. In at least some embodiments, this shallow high hardness level as described above can be appreciated with the cover article having a hardness greater than 15 GPa, or greater than 17 GPa as measured by a Berkovich Hardness Test at an indentation depth of 125 nm (e.g., see FIGS. 15B and 15C). Further, as is also evident in Table 12, the outer structure of this example includes a repeating medium index layer (e.g., layer 23) adjacent to another medium index layer (e.g., layer 22), which can also positively influence the hardness levels of the article at shallow indentation depths.

Figure 13A:
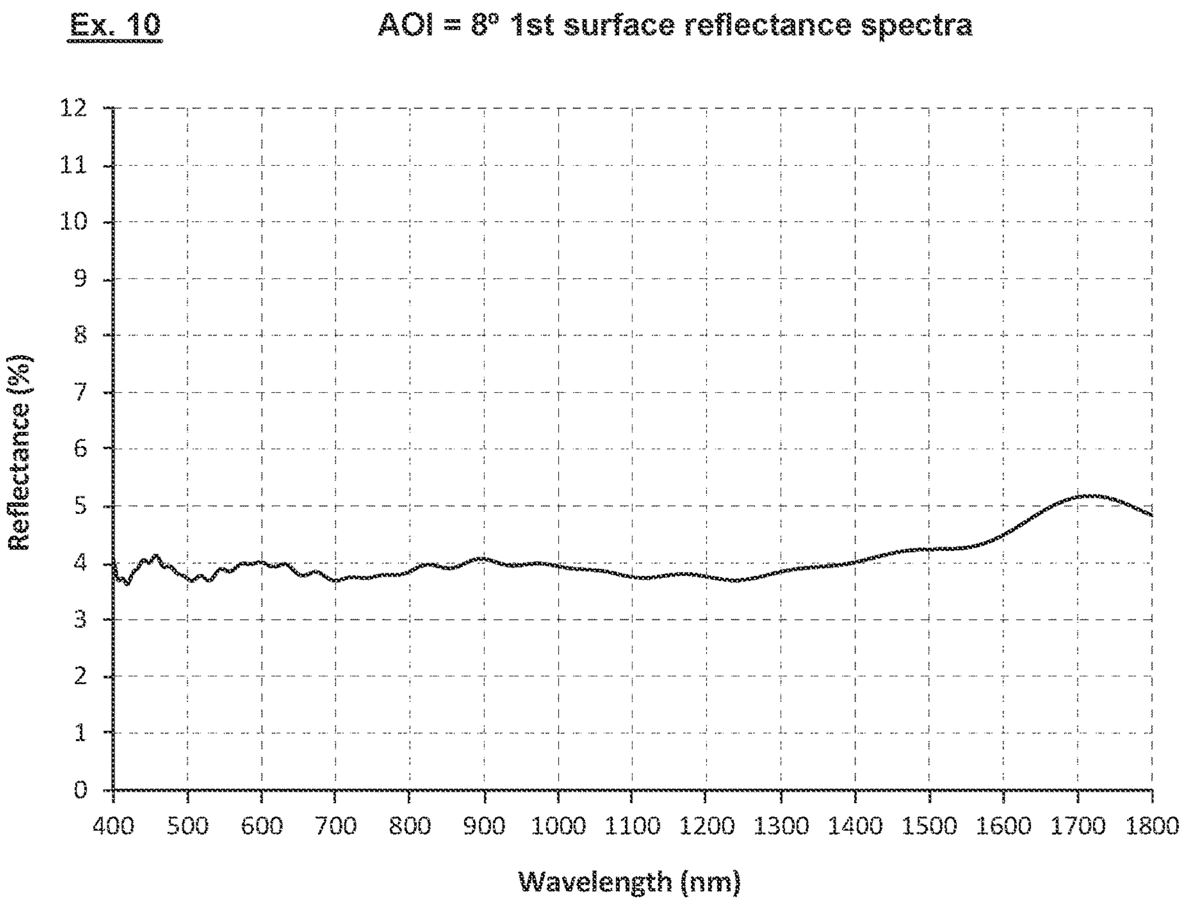
FIG. 13A is a plot of first-surface reflectance v. wavelength at incident angles of 8° for an exemplary cover article of the disclosure.

Referring to FIG. 13A, a plot is provided of first-surface reflectance vs. wavelength for this inventive example, as measured at a near-normal incident angle of 80. Notably, this example exhibits low maximum and minimum reflectance oscillations in the 1000 to 1700 nm wavelength band of less than 2%. It is also evident from FIG. 13A that this example exhibits a low maximum reflectance of less than 5.5% in the near-infrared spectrum from 1000 to 1700 nm.

Figure 13B:
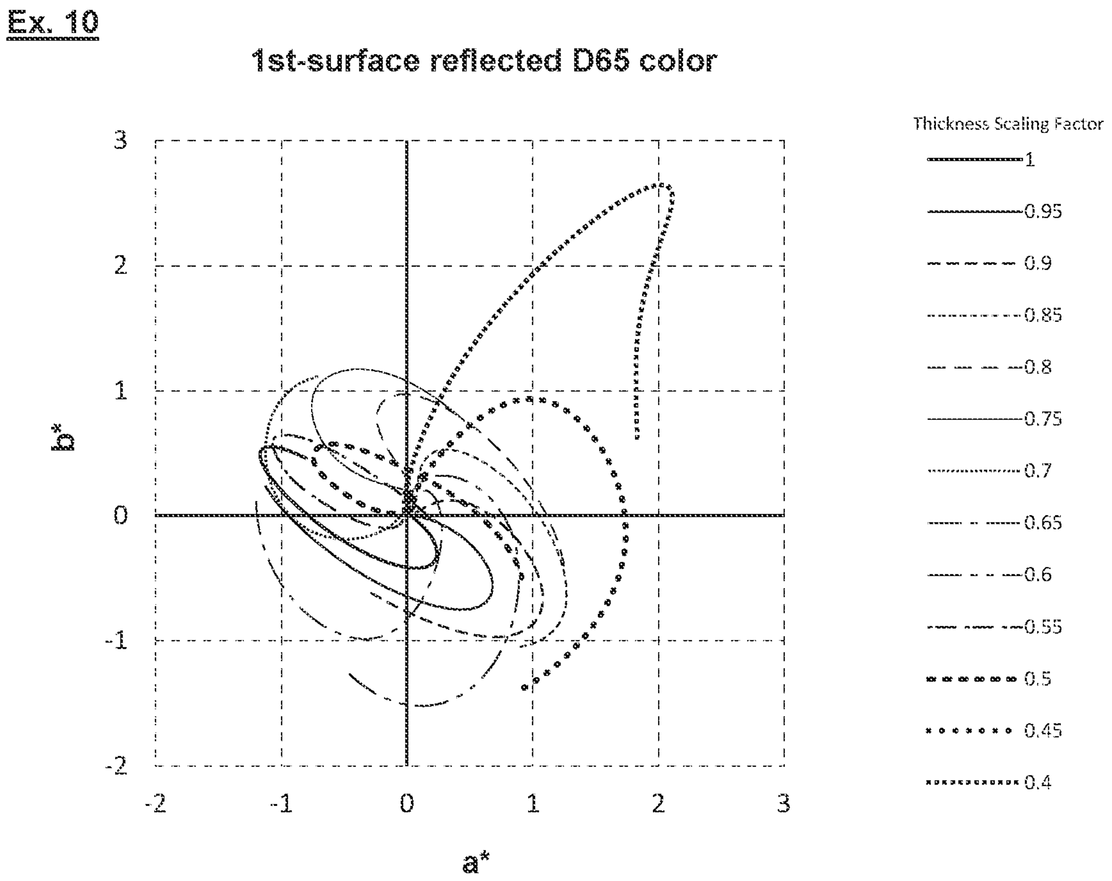
FIG. 13B is a plot of first-surface reflected color, as measured at incident angles from 0° to 90° with various optical film structure thickness scaling factors, for the exemplary cover article FIG. 13A.

Referring to FIG. 13B, a plot is provided of single-sided, reflected color for this inventive example, as measured at incident angles from 0° to 90° with various outer layered film thickness scaling factors. As is evident from FIG. 13B, the color shift exhibited by this inventive example is fairly consistent and less than 4 for the full range of outer layered film thickness scaling factors from about 40 to 100% depicted in this figure.

TABLE 12

| Ex. 10 cover article design with strengthened glass-ceramic substrate | | | |
|---|---|---|---|
| Layer | Material | thickness (nm) | Index (550 nm) |
| | Glass-Ceramic | Substrate | 1.528 |
| 1 | SiO2 | 25 | 1.462 |
| 2 | SiOxNy | 8.99 | 1.945 |
| 3 | SiO2 | 70.16 | 1.462 |
| 4 | SiOxNy | 15.52 | 1.945 |
| 5 | SiO2 | 72.99 | 1.462 |
| 6 | SiOxNy | 23.13 | 1.945 |
| 7 | SiO2 | 62.88 | 1.462 |
| 8 | SiOxNy | 32.66 | 1.945 |
| 9 | SiO2 | 49.17 | 1.462 |
| 10 | SiOxNy | 42.2 | 1.945 |
| 11 | SiO2 | 35.96 | 1.462 |
| 12 | SiOxNy | 48.1 | 1.945 |
| 13 | SiO2 | 24.86 | 1.462 |
| 14 | SiOxNy | 40.77 | 1.945 |
| 15 | SiO2 | 8.75 | 1.462 |
| 16 | SiOxNy | 2000 | 1.829 |
| 17 | SiNy | 13.5 | 2.050 |
| 18 | SiOxNy | 45.7 | 1.754 |
| 19 | SiNy | 25.77 | 2.050 |
| 20 | SiOxNy | 54.2 | 1.754 |
| 21 | SiNy | 19.57 | 2.050 |
| 22 | SiOxNy | 120.71 | 1.754 |
| 23 | SiOxNy | 94.76 | 1.589 |
| 24 | SiO2 | 14 | 1.462 |
| | Medium | Air | 1 |
| Total thickness (nm): | | | 2949.4 |
| AR layers thickness (nm): | | | 388.2 |
| Low-RI in AR thickness (nm): | | | 14 |

Comparative Example 2

A comparative cover article including a strengthened glass substrate was prepared for this example with the structure delineated below in Table 13. The glass substrate is an ion-exchanged, aluminosilicate glass substrate having a thickness of 550 m and a refractive index of 1.51. The substrate has the following composition: 61.81% $SiO_2$;

3.9% $B_2O_3$; 19.69% $Al_2O_3$; 12.91% $Na_2O$; 0.018% $K_2O$; 1.43% MgO; 0.019% $Fe_2O_3$; and 0.223% $SnO_2$ (wt %, on an oxide basis). The substrate was strengthened using a molten salt bath to achieve a maximum compressive stress (CS) of 850 MPa with a depth-of-layer (DOL) of 40 m. Further, the layers of the outer layered film were deposited according to vapor deposition conditions set forth in U. S. Patent Application Publication No. 2020/0158916, the salient portions of which are incorporated herein by reference.

Figure 14A:
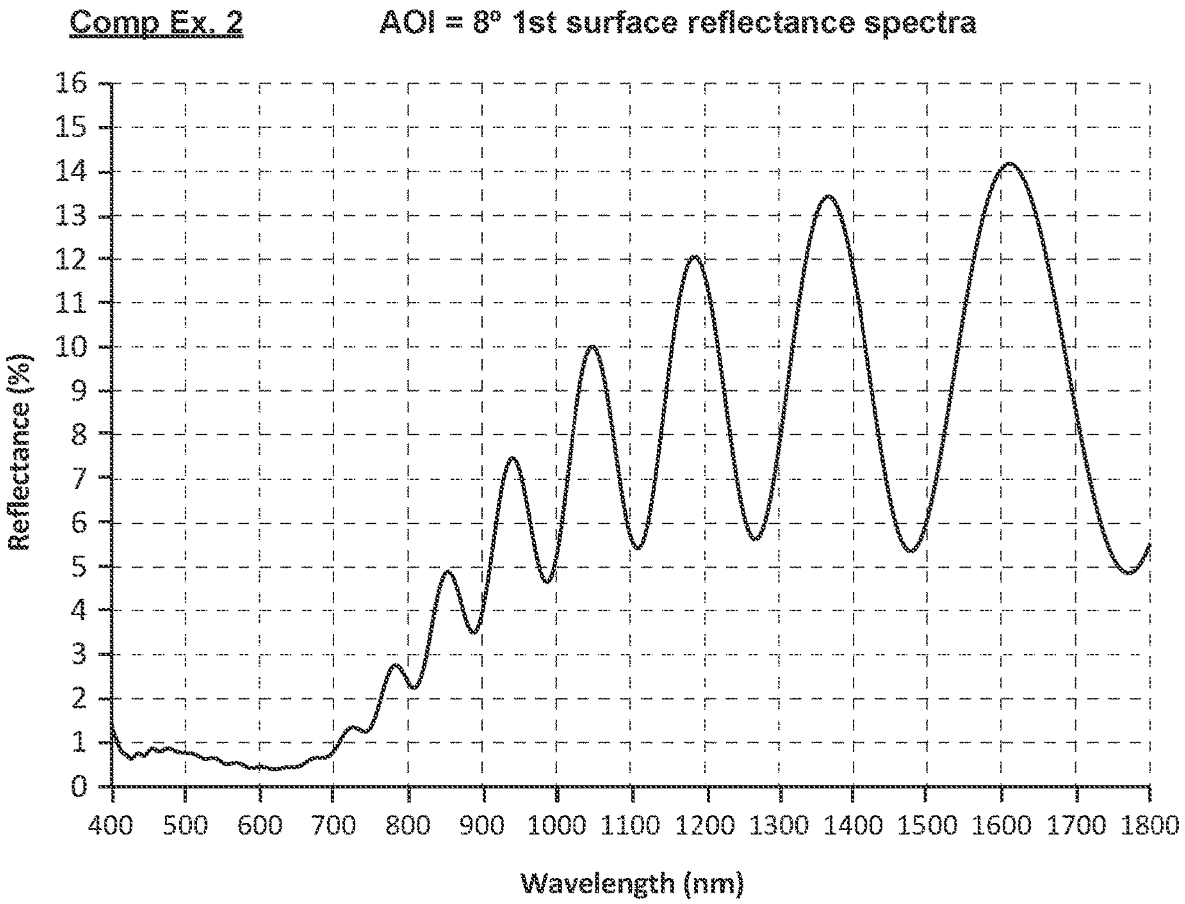
FIG. 14A is a plot of first-surface reflectance v. wavelength at incident angles of 8° for a comparative cover article.

Referring to FIG. 14A, a plot is provided of first-surface reflectance vs. wavelength for this comparative example, as measured at a near-normal incident angle of 8°. Notably, this comparative example exhibits high maximum and minimum reflectance oscillations in the 1000 to 1700 nm wavelength band of greater than 8%. It is also evident from FIG. 14A that this comparative example exhibits high reflectance in the near-infrared spectrum, e.g., over 7% at 940 nm, over 12% at 1200 nm, over 13% at 1350 nm, and over 11% at 1500 nm.

Figure 14B:
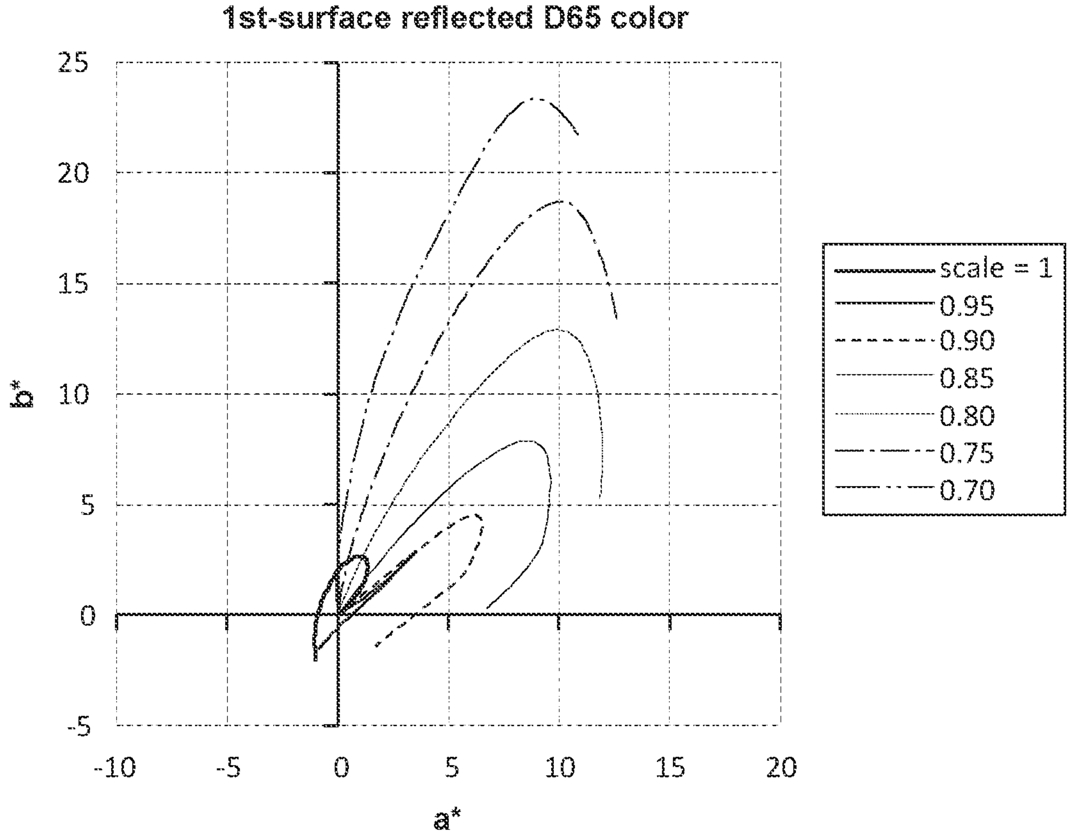
FIG. 14B is a plot of first-surface reflected color, as measured at incident angles from 0° to 90° with various optical film structure thickness scaling factors, for the comparative cover article FIG. 14A.

Referring to FIG. 14B, a plot is provided of single-sided, reflected color for this comparative example, as measured at incident angles from 0° to 90° with various optical film structure thickness scaling factors. As is evident from FIG. 14B, the color shift exhibited by this comparative example is less than 4 only for a narrow range of optical film structure thickness scaling factors from about 95 to 100%.

TABLE 13

Comp. Ex. 2 coated article design with strengthened glass substrate

| Layer | Material | thickness (nm) | Index (550 nm) |
|---|---|---|---|
| | Glass | Substrate | 1.51 |
| 1 | SiO2 | 25 | 1.476 |
| 2 | SiO*x*N*y* | 9.62 | 1.943 |
| 3 | SiO2 | 53.7 | 1.476 |
| 4 | SiO*x*N*y* | 26.14 | 1.943 |
| 5 | SiO2 | 30.12 | 1.476 |
| 6 | SiO*x*N*y* | 44.88 | 1.943 |
| 7 | SiO2 | 8.71 | 1.476 |
| 8 | SiO*x*N*y* | 2000 | 1.943 |
| 9 | SiO2 | 9 | 1.476 |
| 10 | SiN*y* | 46.3 | 2.014 |
| 11 | SiO2 | 16.6 | 1.476 |
| 12 | SiN*y* | 150.2 | 2.014 |
| 13 | SiO2 | 90.5 | 1.476 |
| | Medium | Air | 1 |
| Total thickness (nm): | | | 2510.8 |
| AR layers thickness (nm): | | | 312.6 |
| Low-RI in AR thickness (nm): | | | 116.1 |

Mechanical Properties of Examples 8-10

Figure 15A:
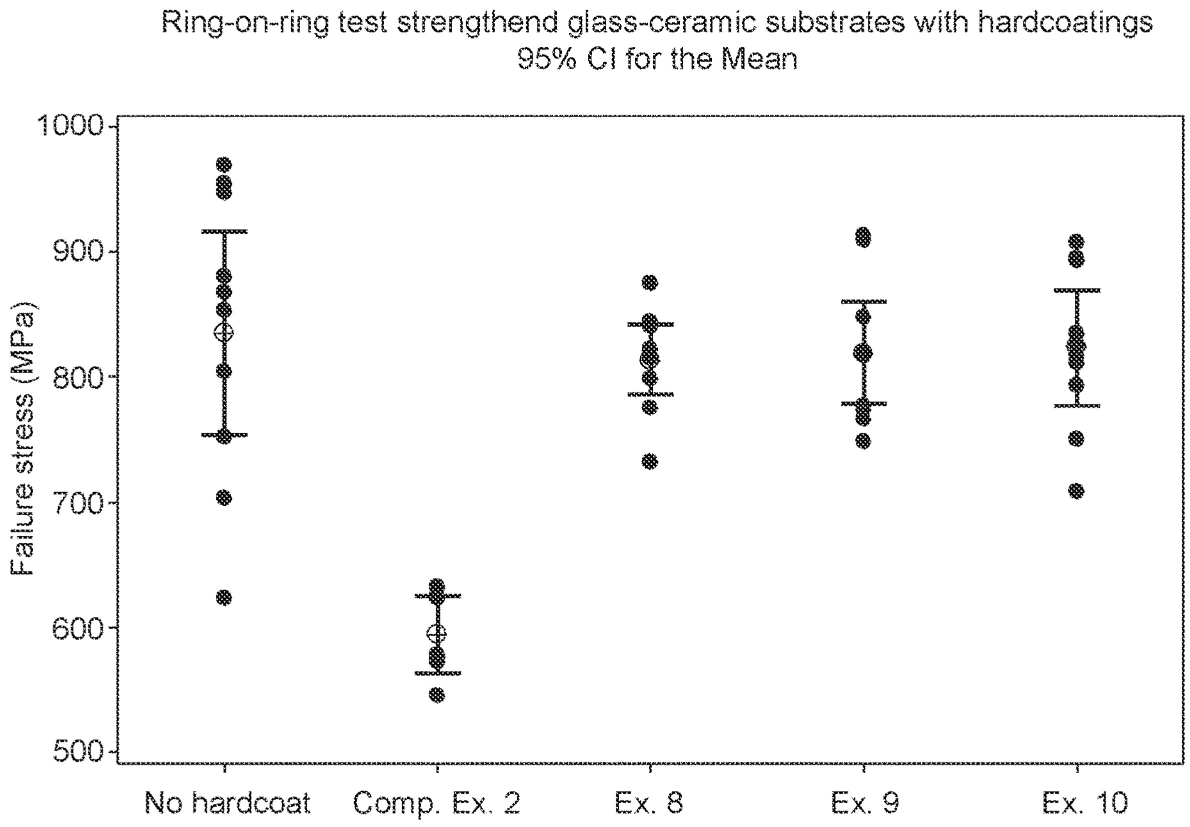
FIG. 15A is a box plot of average article failure stress, as measured in a ring-on-ring test, for the cover articles of the disclosure with the optical properties in FIGS. 11A-13B, a control article without an outer layered structure and a comparative article with the optical properties in FIGS. 14A and 14B.

Referring now to FIG. 15A, a box plot is provided of average article failure stress, as measured in a ring-on-ring test, for the cover articles of Exs. 8-10, Comp. Ex. 2 and a control glass-ceramic substrate without an outer layered film. As is evident from FIG. 15A, the inventive examples demonstrate average failure stress levels of at least 800 MPa, which are comparable to the average failure stress level of a bare glass-ceramic substrate without an outer layered film (denoted "no hardcoat" in FIG. 15A). In contrast, the comparative example (Comp. Ex. 2) demonstrates an average failure stress level of less than 600 MPa, well below the average failure stress levels of the inventive examples (Exs. 8-10).

Figure 15B:
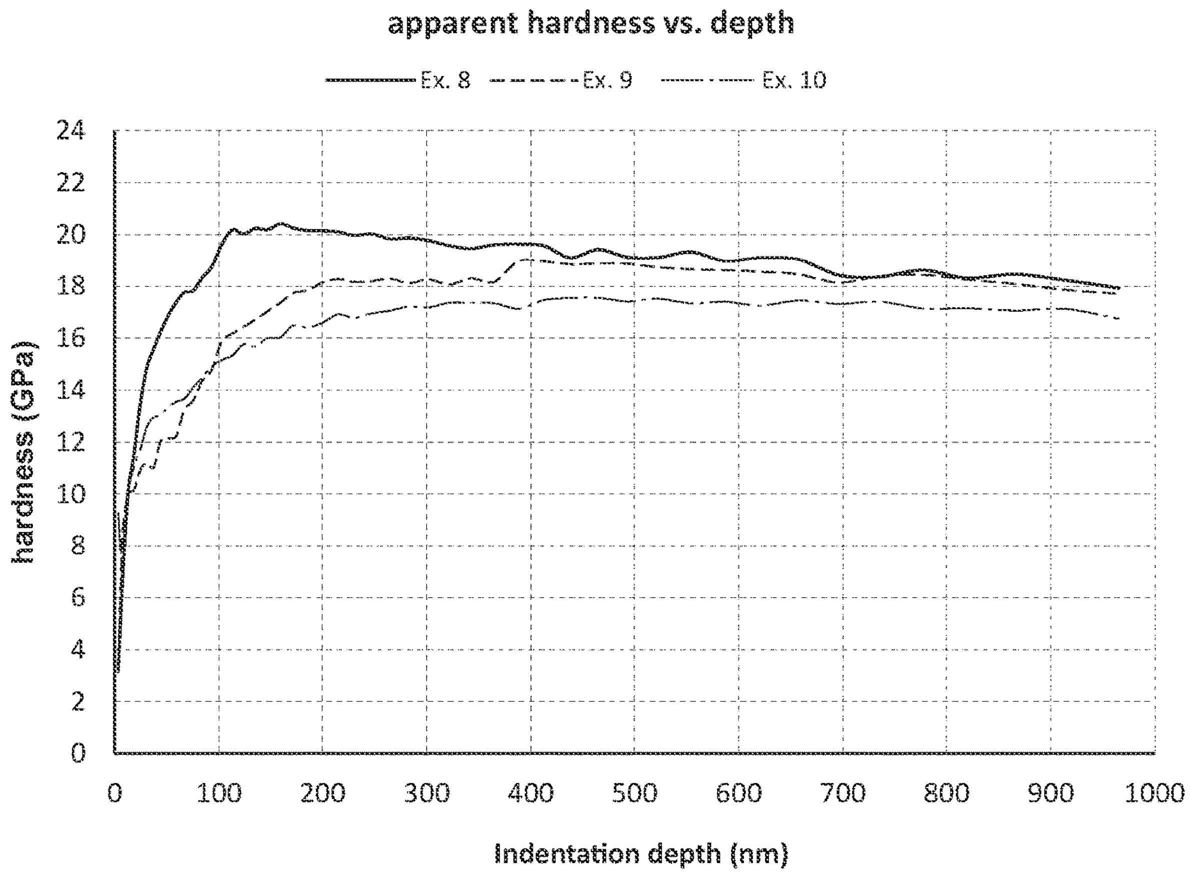
FIG. 15B is a plot of hardness vs. depth, as measured in a Berkovich Hardness Test of the outer layered films of the cover articles of Exs. 8-10.
Figure 15C:
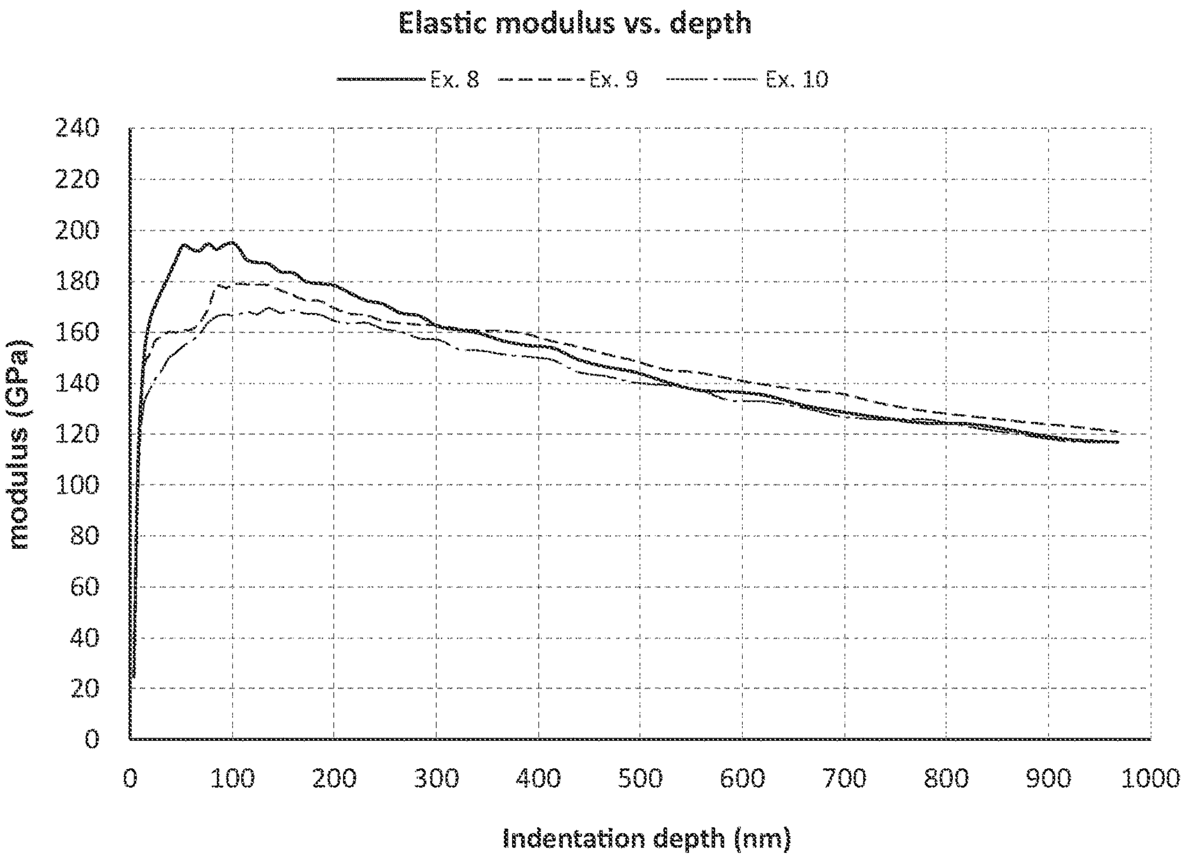
FIG. 15C is a plot of elastic modulus vs. depth, as measured in a Berkovich Hardness Test of the outer layered films of the cover articles of Exs. 8-10.

Referring now to FIGS. 15B and 15C, plots are provided of hardness and elastic modulus vs. displacement, as measured in a Berkovich Hardness Test of the outer layered films of the cover articles of Exs. 8-10. As is evident from FIG. 15B, each of the inventive examples (Exs. 8-10) exhibits a hardness of about 15 GPa or greater at shallow indentation depths from 100 to 125 nm. As is evident from FIG. 15C, each of the inventive examples (Exs. 8-10) exhibits a maximum elastic modulus in the range of 160-200 GPa, and an elastic modulus at 15% of the total thickness of the outer layered film (~450 nm for these examples) of 120-160 GPa.

The various features described in the specification may be combined in any and all combinations, for example, as listed in the following embodiments.

Embodiment 1. A cover article for a sensor is provided that comprises: a substrate comprising a thickness from 50 μm to 5000 μm, an outer primary surface and an inner primary surface, wherein the outer and inner primary surfaces are opposite of one another and the substrate is a chemically-strengthened glass substrate or a glass-ceramic substrate; and an outer layered film disposed on the outer primary surface of the substrate, and wherein the cover article exhibits a first-surface average reflectance of less than 10% for wavelengths from 1000 nm to 1700 nm for at least one angle incidence from 8° to 60°.

Embodiment 2. The cover article of embodiment 1, wherein the outer layered film comprises a scratch resistant layer comprising a nitride or an oxynitride and having a thickness from about 80 nm to 10,000 nm.

Embodiment 3. The cover article of embodiment 2, wherein the outer layered film comprises a refractive index gradient.

Embodiment 4. The cover article of embodiment 2, wherein the outer layered film comprises a plurality of alternating high refractive index and low refractive index layers, and wherein each of the high refractive index layers comprises a nitride or an oxynitride and has a refractive index greater than a refractive index of each of the low refractive index layers.

Embodiment 5. The cover article of embodiment 4, wherein one of the low refractive index layers is a capping layer defining an outermost surface of the outer layered film and the capping layer has a thickness of at least 110 nm, and further wherein the outer layered film comprises an antireflective region over the scratch resistant layer, and the low refractive index layers of the antireflective region comprise a total thickness of less than 275 nm.

Embodiment 6. The cover article of any one of embodiments 1-5, wherein the cover article further exhibits a two-surface average transmittance of greater than 85% for infrared wavelengths from 1000 nm to 1700 nm for at least one angle of incidence from 8° to 40°.

Embodiment 7. The cover article of any one of embodiments 1-6, wherein the cover article exhibits a first-surface average reflectance of less than 5% for infrared wavelengths from 1000 nm to 1700 nm for at least one angle of incidence from 8° to 40°.

Embodiment 8. The cover article of any one of embodiments 1-7, wherein the cover article further exhibits a first-surface average reflectance from 2% to 5% for wavelengths from 800 nm to 1000 nm at an angle of incidence of 8°.

Embodiment 9. The cover article of any one of embodiments 1-8, wherein the cover article further exhibits a first-surface reflected CIE color for all angles of incidence from 0° to 90° with a* from −10 to +10 and b* from −12 to +5 (CIE coordinate b*), as measured under illumination from a D65 illuminant.

Embodiment 10. The cover article of any one of embodiments 1-9, wherein the cover article exhibits a first-surface average photopic reflectance of less than 2% for an angle of incidence of about 8°.

Embodiment 11. The cover article of any one of embodiments 2 and 4-10, wherein the scratch resistant layer and each of the high refractive index layers comprises $SiN_x$ or $SiO_xN_y$.

Embodiment 12. The cover article of any one of embodiments 2 and 4-11, wherein the outer layered film comprises an antireflective region over the scratch resistant layer, and the antireflective region comprises at least five alternating high refractive index and low refractive index layers.

Embodiment 13. The cover article of any one of embodiments 2 and 4-12, wherein the outer layered film comprises an optical interference layer between the scratch resistant layer and the substrate, the optical interference layer comprising alternating high refractive index and low refractive index layers.

Embodiment 14. The cover article of any one of embodiments 5-13, wherein the thickness of the capping layer is from 110 nm to about 200 nm.

Embodiment 15. The cover article of any one of embodiments 5-14, wherein a high refractive index layer adjacent to the capping layer has a thickness from about 10 nm to less than 150 nm.

Embodiment 16. The cover article of any one of embodiments 1-15, wherein the outer layered film exhibits a residual compressive stress of greater than or equal to 700 MPa and an elastic modulus of greater than or equal to 140 GPa.

Embodiment 17. The cover article of any one of embodiments 1-16, wherein the substrate is a glass-ceramic that comprises an elastic modulus of greater than 85 GPa and a fracture toughness of greater than 0.8 MPa-m.

Embodiment 18. The cover article of any one of embodiments 1-17, wherein the outer layered film exhibits a residual compressive stress of from 700 MPa to 1100 MPa and an elastic modulus of from 140 GPa to 200 GPa.

Embodiment 19. The cover article of any one of embodiments 1-18, wherein the outer layered film exhibits an elastic modulus of from 140 GPa to 180 GPa.

Embodiment 20. The cover article of any one of embodiments 1-19, wherein the substrate has a residual surface compressive stress of from 200 MPa to 1200 MPa and a depth of compression (DOC) of from 5 m to 150 km.

Embodiment 21. The cover article of any one of embodiments 1-20, wherein the substrate further exhibits a maximum central tension (CT) value from 80 MPa to 200 MPa, and further wherein the substrate has a thickness of about 1.5 mm or less.

Embodiment 22. The cover article of any one of embodiments 1-21, wherein the substrate has a residual surface compressive stress of from 200 MPa to 400 MPa.

Embodiment 23. The cover article of any one of embodiments 1-22, wherein the cover article exhibits an average failure stress of 800 MPa or greater in a ring-on-ring test with the outer surface of the outer layered film placed in tension.

Embodiment 24. A glass screen protector for a smart phone comprising: a cover glass; and an adhesive backing disposed on the cover glass, wherein the adhesive backing is for attachment to the smart phone, and further wherein at least one portion of the cover glass comprises a cover article of any one of embodiments 1-23.

Embodiment 25. A consumer electronic product, comprising: a housing comprising a front surface, a back surface and side surfaces; electronic components at least partially within the housing, the electronic components comprising at least one of a display and a sensor, the display at or adjacent to the front surface of the housing and the sensor at or adjacent to the front surface or the back surface of the housing; and a cover disposed over at least one of the display and the sensor, wherein at least one portion of the cover comprises the cover article of any one of embodiments 1-23.

Embodiment 26. A cover article for a sensor is provided comprising: a substrate comprising a thickness from 50 μm to 5000 μm, an outer primary surface and an inner primary surface, wherein the outer and inner primary surfaces are opposite of one another and the substrate is a chemically-strengthened glass substrate or a glass-ceramic substrate; and an outer layered film disposed on the outer primary surface of the substrate, wherein the outer layered film exhibits a hardness of at least 8 GPa, as measured with a Berkovich Indenter Hardness Test from the outermost surface of the outer layered film to a depth from about 100 nm to about 500 nm, and further wherein the cover article exhibits a first-surface average reflectance of less than 10% for wavelengths from 1000 nm to 1700 nm for at least one angle of incidence from 8° to 60°.

Embodiment 27. The cover article of embodiment 26, wherein the outer layered film comprises a refractive index gradient.

Embodiment 28. The cover article of embodiment 26, wherein the outer layered film comprises a plurality of alternating high refractive index and low refractive index layers, and wherein each of the high refractive index layers comprises a nitride or an oxynitride and has a refractive index greater than a refractive index of each of the low refractive index layers, Embodiment 29. The cover article of embodiment 28, wherein the outer layered film comprises a scratch resistant layer having a thickness from about 80 nm to 10,000 nm, and further wherein the outer layered film comprises an antireflective region over the scratch resistant layer, and the antireflective region comprises a thickness from about 100 nm to about 525 nm.

Embodiment 30. The cover article of any one of embodiments 26-29, wherein the cover article further exhibits a two-surface average transmittance of greater than 85% for infrared wavelengths from 1000 nm to 1700 nm for at least one angle of incidence from 8° to 40°.

Embodiment 31. The cover article of any one of embodiments 26-30, wherein the cover article exhibits a first-surface average reflectance of less than 5% for infrared wavelengths from 1000 nm to 1700 nm for at least one angle of incidence from 8° to 40°.

Embodiment 32. The cover article of any one of embodiments 26-31, wherein the cover article exhibits a first-surface average photopic reflectance of less than 2% for an angle of incidence of about 8°.

Embodiment 33. The cover article of any one of embodiments 26-32, wherein the cover article further exhibits a first-surface average reflectance from 2% to 5% for wavelengths from 800 nm to 1000 nm at an angle of incidence of 8°.

Embodiment 34. The cover article of any one of embodiments 26-33, wherein the cover article further exhibits a first-surface reflected CIE color for all angles of incidence from 0° to 90° with a* from −10 to +10 and b* from −12 to +5 (CIE coordinate b*), as measured under illumination from a D65 illuminant.

Embodiment 35. The cover article of any one of embodiments 29-34, wherein the scratch resistant layer and each of the high refractive index layers comprises $SiN_x$ or $SiO_xN_y$.

Embodiment 36. The cover article of any one of embodiments 28-35, wherein the antireflective region comprises at least five alternating high refractive index and low refractive index layers.

Embodiment 37. The cover article of any one of embodiments 26-36, wherein the outer layered film exhibits a residual compressive stress of greater than or equal to 700 MPa and an elastic modulus of greater than or equal to 140 GPa.

Embodiment 38. The cover article of any one of embodiments 26-37, wherein the substrate is a glass-ceramic that comprises an elastic modulus of greater than 85 GPa and a fracture toughness of greater than 0.8 MPa-m.

Embodiment 39. The cover article of any one of embodiments 26-38, wherein the outer layered film exhibits a residual compressive stress of from 700 MPa to 1100 MPa and an elastic modulus of from 140 GPa to 200 GPa.

Embodiment 40. The cover article of any one of embodiments 26-39, wherein the outer layered film exhibits an elastic modulus of from 140 GPa to 180 GPa.

Embodiment 41. The cover article of any one of embodiments 26-40, wherein the substrate has a residual surface compressive stress of from 200 MPa to 1200 MPa and a depth of compression (DOC) of from 5 m to 150 μm.

Embodiment 42. The cover article of any one of embodiments 26-41, wherein the substrate further exhibits a maximum central tension (CT) value from 80 MPa to 200 MPa, and further wherein the substrate has a thickness of about 1.5 mm or less.

Embodiment 43. The cover article of any one of embodiments 26-42, wherein the substrate has a residual surface compressive stress of from 200 MPa to 400 MPa.

Embodiment 44. The cover article of any one of embodiments 26-43, wherein the cover article exhibits an average failure stress of 800 MPa or greater in a ring-on-ring test with the outer surface of the outer layered film placed in tension.

Embodiment 45. The cover article of any one of embodiments 26-44, wherein the cover article exhibits a first-surface average photopic reflectance of less than 2% for an angle of incidence of about 8°.

Embodiment 46. A glass screen protector for a smart phone, comprising: a cover glass; and an adhesive backing disposed on the cover glass, wherein the adhesive backing is for attachment to the smart phone, and further wherein at least one portion of the cover glass comprises a cover article of any one of embodiments 26-45.

Embodiment 47. A consumer electronic product, comprising: a housing comprising a front surface, a back surface and side surfaces; electronic components at least partially within the housing, the electronic components comprising at least one of a display and a sensor, the display at or adjacent to the front surface of the housing and the sensor at or adjacent to the front surface or the back surface of the housing; and a cover disposed over at least one of the display and the sensor, wherein at least one portion of the cover comprises the cover article of any one of embodiments 26-45.

Embodiment 48. A cover article for a sensor is provided comprising: a substrate comprising a thickness from 50 μm to 5000 μm, an outer primary surface and an inner primary surface, wherein the outer and inner primary surfaces are opposite of one another and the substrate is a chemically-strengthened glass substrate or a glass-ceramic substrate; and an outer layered film disposed on the outer primary surface of the substrate, wherein the outer layered film comprises a plurality of alternating high refractive index and low refractive index layers, wherein each of the high refractive index layers comprises a nitride or an oxynitride and has a refractive index greater than a refractive index of each of the low refractive index layers, wherein the outer layered film comprises a scratch resistant layer having a thickness from about 80 nm to 10,000 nm, wherein one of the low refractive index layers is a capping layer defining an outermost surface of the outer layered film and the capping layer has a thickness of at least 110 nm, wherein the outer layered film comprises an antireflective region over the scratch resistant layer, and the antireflective region comprises a thickness from about 100 nm to about 525 nm, wherein the low refractive index layers of the antireflective region comprise a total thickness of less than 275 nm, wherein the outer layered film exhibits a hardness of at least 8 GPa, as measured with a Berkovich Indenter Hardness Test from the outermost surface of the outer layered film to a depth from about 100 nm to about 500 nm, and further wherein the cover article exhibits a first-surface average reflectance of less than 10% for wavelengths from 1000 nm to 1700 nm for at least one angle of incidence from 8° to 60°.

Embodiment 49. The cover article of embodiment 48, wherein the cover article further exhibits a two-surface average transmittance of greater than 85% for infrared wavelengths from 1000 nm to 1700 nm for at least one angle of incidence from 8° to 40°.

Embodiment 50. The cover article of embodiment 48 or embodiment 49, wherein the cover article further exhibits a two-surface average transmittance of greater than 75% for infrared wavelengths from 1000 nm to 1700 nm for an angle of incidence of 60°.

Embodiment 51. The cover article of any one of embodiments 48-50, wherein the cover article exhibits a first-surface average reflectance of less than 5% for infrared wavelengths from 1000 nm to 1700 nm for at least one angle of incidence from 8° to 40°.

Embodiment 52. The cover article of any one of embodiments 48-51, wherein the cover article further exhibits a first-surface average reflectance from 2% to 5% for wavelengths from 800 nm to 1000 nm at an angle of incidence of 8°.

Embodiment 53. The cover article of any one of embodiments 48-52, wherein the cover article further exhibits a first-surface reflected CIE color for all angles of incidence from 0° to 90° with a* from −10 to +10 and b* from −12 to +5 (CIE coordinate b*), as measured under illumination from a D65 illuminant.

Embodiment 54. The cover article of any one of embodiments 48-53, wherein the scratch resistant layer and each of the high refractive index layers comprises $SiN_x$ or $SiO_xN_y$.

Embodiment 55. The cover article of any one of embodiments 48-54, wherein the cover article exhibits a first-surface average photopic reflectance of less than 2% for an angle of incidence of about 8°.

Embodiment 56. The cover article of any one of embodiments 48-55, wherein the thickness of the capping layer is from 110 nm to about 200 nm.

Embodiment 57. The cover article of any one of embodiments 48-56, wherein a high index layer adjacent to the capping layer has a thickness from about 10 nm to less than 150 nm.

Embodiment 58. The cover article of any one of embodiments 48-57, wherein the outer layered film exhibits a residual compressive stress of greater than or equal to 700 MPa and an elastic modulus of greater than or equal to 140 GPa.

Embodiment 59. The cover article of any one of embodiments 48-58, wherein the substrate is a glass-ceramic that comprises an elastic modulus of greater than 85 GPa and a fracture toughness of greater than 0.8 MPa-m.

Embodiment 60. The cover article of any one of embodiments 48-59, wherein the outer layered film exhibits a residual compressive stress of from 700 MPa to 1100 MPa and an elastic modulus of from 140 GPa to 200 GPa.

Embodiment 61. The cover article of any one of embodiments 48-60, wherein the outer layered film exhibits an elastic modulus of from 140 GPa to 180 GPa.

Embodiment 62. The cover article of any one of embodiments 48-61, wherein the substrate has a residual surface compressive stress of from 200 MPa to 1200 MPa and a depth of compression (DOC) of from 5 m to 150 μm.

Embodiment 63. The cover article of any one of embodiments 48-62, wherein the substrate further exhibits a maximum central tension (CT) value from 80 MPa to 200 MPa, and further wherein the substrate has a thickness of about 1.5 mm or less.

Embodiment 64. The cover article of any one of embodiments 48-63, wherein the substrate has a residual surface compressive stress of from 200 MPa to 400 MPa.

Embodiment 65. The cover article of any one of embodiments 48-64, wherein the cover article exhibits an average failure stress of 800 MPa or greater in a ring-on-ring test with the outer surface of the outer layered film placed in tension.

Embodiment 66. A glass screen protector for a smart phone, comprising: a cover glass; and an adhesive backing disposed on the cover glass, wherein the adhesive backing is for attachment to the smart phone, and further wherein at least one portion of the cover glass comprises a cover article of any one of embodiments 48-65.

Embodiment 67. A consumer electronic product, comprising: a housing comprising a front surface, a back surface and side surfaces; electronic components at least partially within the housing, the electronic components comprising at least one of a display and a sensor, the display at or adjacent to the front surface of the housing and the sensor at or adjacent to the front surface or the back surface of the housing; and a cover disposed over at least one of the display and the sensor, wherein at least one portion of the cover comprises the cover article of any one of embodiments 48-65.

Embodiment 68. A cover article for a sensor is provided comprising: a substrate comprising a thickness from 50 μm to 5000 μm, an outer primary surface and an inner primary surface, wherein the outer and inner primary surfaces are opposite of one another and the substrate is a chemically-strengthened glass substrate or a glass-ceramic substrate; and an outer layered film disposed on the outer primary surface of the substrate, wherein the cover article exhibits a first-surface average reflectance of less than 10% for wavelengths from 1000 nm to 1700 nm for at least one angle of incidence from 8° to 60°, and further wherein the outer layered film exhibits a residual compressive stress of greater than or equal to 700 MPa and an elastic modulus of greater than or equal to 140 GPa.

Embodiment 69. The cover article of embodiment 68, wherein the outer layered film comprises a scratch resistant layer comprising a nitride or an oxynitride and having a thickness from about 80 nm to 10,000 nm.

Embodiment 70. The cover article of embodiment 69, wherein the outer layered film comprises a refractive index gradient.

Embodiment 71. The cover article of embodiment 69, wherein the outer layered film comprises a plurality of alternating high refractive index and low refractive index layers, and wherein each of the high refractive index layers comprises a nitride or an oxynitride and has a refractive index greater than a refractive index of each of the low refractive index layers.

Embodiment 72. The cover article of any one of embodiments 68-71, wherein the outer layered film exhibits a residual compressive stress of from 700 MPa to 1100 MPa and an elastic modulus of from 140 GPa to 200 GPa.

Embodiment 73. The cover article any one of embodiments 68-72, wherein the outer layered film exhibits an elastic modulus of from 140 GPa to 180 GPa.

Embodiment 74. The cover article of any one of embodiments 68-73, wherein the substrate has a residual surface compressive stress of from 200 MPa to 1200 MPa and a depth of compression (DOC) of from 5 m to 150 μm.

Embodiment 75. The cover article of any one of embodiments 68-74, wherein the substrate further exhibits a maximum central tension (CT) value from 80 MPa to 200 MPa, and further wherein the substrate has a thickness of about 1.5 mm or less.

Embodiment 76. The cover article of any one of embodiments 68-75, wherein the substrate has a residual surface compressive stress of from 200 MPa to 400 MPa.

Embodiment 77. The cover article of any one of embodiments 68-76, wherein the cover article exhibits an average failure stress of 800 MPa or greater in a ring-on-ring test with the outer surface of the outer layered film placed in tension.

Embodiment 78. The cover article of any one of embodiments 68-77, wherein the substrate is a glass-ceramic that comprises an elastic modulus of greater than 85 GPa and a fracture toughness of greater than 0.8 MPa-m.

Embodiment 79. A glass screen protector for a smart phone, comprising: a cover glass; and an adhesive backing disposed on the cover glass, wherein the adhesive backing is for attachment to the smart phone, and further wherein at least one portion of the cover glass comprises a cover article of any one of embodiments 68-78.

Embodiment 80. A consumer electronic product, comprising: a housing comprising a front surface, a back surface and side surfaces; electronic components at least partially within the housing, the electronic components comprising at least one of a display and a sensor, the display at or adjacent to the front surface of the housing and the sensor at or adjacent to the front surface or the back surface of the housing; and a cover disposed over at least one of the display and the sensor, wherein at least one portion of the cover comprises the cover article of any one of embodiments 68-78.

Embodiment 81. A cover article for a sensor is provided comprising: a glass-ceramic substrate comprising a first primary surface and a second primary surface, the primary surfaces opposing one another; and an outer layered film defining an outer surface, the outer layered film disposed on the first primary surface, wherein the cover article exhibits a hardness of greater than 15 GPa, as measured by a Berkovich Hardness Test at an indentation depth of about 125 nm from the outer surface of the outer layered film, and further wherein the cover article exhibits a first-surface average reflectance of less than 10% for wavelengths from 1000 nm to 1700 nm for at least one angle of incidence from 8° to 60°.

Embodiment 82. The cover article of embodiment 81, wherein: the outer layered film comprises a scratch-resistant layer and a plurality of alternating high refractive index (RI) and low RI layers, the outer layered film further comprises an outer structure and an inner structure, the scratch-resistant layer disposed between the outer and inner structures, the outer structure comprises at least one medium RI layer in contact with one of the high RI layers and the scratch-resistant layer, the medium RIlayer comprises a refractive index from 1.55 to 1.80, each of the high RI layers comprises a refractive index of greater than 1.80, and each of the low RI layers comprises a refractive index of less than 1.55, and the glass-ceramic substrate comprises an elastic modulus of greater than 85 GPa and a fracture toughness of greater than 0.8 MPa·√m.

Embodiment 83. The cover article of embodiment 81 or embodiment 82, wherein the outer layered film exhibits a residual compressive stress of greater than or equal to 700 MPa and an elastic modulus of greater than or equal to 140 GPa.

Embodiment 84. The cover article of any one of embodiments 81-83, wherein the outer layered film exhibits a residual compressive stress of from 700 MPa to 1100 MPa and an elastic modulus of from 140 GPa to 200 GPa.

Embodiment 85. The cover article of any one of embodiments 81-84, wherein the outer layered film exhibits an elastic modulus of from 140 GPa to 180 GPa.

Embodiment 86. The cover article of any one of embodiments 81-85, wherein the glass-ceramic substrate has a residual surface compressive stress of from 200 MPa to 1200 MPa and a depth of compression (DOC) of from 5 m to 150 μm.

Embodiment 87. The cover article of any one of embodiments 81-86, wherein the glass-ceramic substrate further exhibits a maximum central tension (CT) value from 80 MPa to 200 MPa, and further wherein the glass-ceramic substrate has a thickness of about 1.5 mm or less.

Embodiment 88. The cover article of any one of embodiments 81-87, wherein the glass-ceramic substrate has a residual surface compressive stress of from 200 MPa to 400 MPa.

Embodiment 89. The cover article of any one of embodiments 81-88, wherein the cover article exhibits an average failure stress of 700 MPa or greater in a ring-on-ring test with the outer surface of the outer layered film placed in tension.

Embodiment 90. The cover article of any one of embodiments 81-89, wherein the cover article exhibits an average failure stress of 500 MPa or greater in a four-point bend test with the outer surface of the outer layered film placed in tension.

Embodiment 91. The cover article of any one of embodiments 81-90, wherein the cover article exhibits a hardness of greater than 17 GPa, as measured by a Berkovich Hardness Test at an indentation depth of about 125 nm from the outer surface of the outer layered film.

Embodiment 92. A glass screen protector for a smart phone, comprising: a cover glass; and an adhesive backing disposed on the cover glass, wherein the adhesive backing is for attachment to the smart phone, and further wherein at least one portion of the cover glass comprises a cover article of any one of embodiments 81-91.

Embodiment 93. A consumer electronic product, comprising: a housing comprising a front surface, a back surface and side surfaces; electronic components at least partially within the housing, the electronic components comprising at least one of a display and a sensor, the display at or adjacent to the front surface of the housing and the sensor at or adjacent to the front surface or the back surface of the housing; and a cover disposed over at least one of the display and the sensor, wherein at least one portion of the cover comprises the cover article of any one of embodiments 81-91.

Many variations and modifications may be made to the above-described embodiments of the disclosure without departing substantially from the spirit and various principles of the disclosure. All such modifications and variations are intended to be included herein within the scope of this disclosure and protected by the following claims.

What is claimed is:

1. A cover article for a sensor, comprising:

a substrate comprising a thickness from 50 μm to 5000 μm, an outer primary surface and an inner primary surface, wherein the outer and inner primary surfaces are opposite of one another and the substrate is a chemically-strengthened glass substrate or a glass-ceramic substrate; and an outer layered film disposed on the outer primary surface of the substrate, and wherein the cover article exhibits a first-surface average reflectance of less than 10% for wavelengths from 1000 nm to 1700 nm for at least one angle of incidence from 8° to 60°, wherein the outer layered film comprises a scratch resistant layer comprising a nitride or an oxynitride and having a thickness from about 80 nm to 10,000 nm, wherein the outer layered film comprises a plurality of alternating high refractive index and low refractive index layers, and wherein each of the high refractive index layers comprises a nitride or an oxynitride and has a refractive index greater than a refractive index of each of the low refractive index layers, and wherein one of the low refractive index layers is a capping layer defining an outermost surface of the outer layered film and the capping layer has a thickness of at least 110 nm, and further wherein the outer layered film comprises an antireflective region over the scratch resistant layer, and the low refractive index layers of the antireflective region comprise a total thickness of less than 275 nm.

2. The cover article of claim 1, wherein the outer layered film comprises a refractive index gradient.

3. The cover article of claim 1, wherein the antireflective region comprises a thickness from about 100 nm to about 525 nm.

4. The cover article of claim 1, wherein the cover article further exhibits a two-surface average transmittance of greater than 85% for infrared wavelengths from 1000 nm to 1700 nm for at least one angle of incidence from 8° to 40°.

5. The cover article of claim 1, wherein the cover article exhibits a first-surface average reflectance of less than 5% for infrared wavelengths from 1000 nm to 1700 nm for at least one angle of incidence from 8° to 40°.

6. The cover article of claim 1, wherein the cover article further exhibits a first-surface average reflectance from 2% to 5% for wavelengths from 800 nm to 1000 nm at an angle of incidence of 8°.

7. The cover article of claim 1, wherein the cover article further exhibits a first-surface reflected CIE color for all angles of incidence from 0° to 90° with a* from −10 to +10 and b* from −12 to +5 (CIE coordinate b*), as measured under illumination from a D65 illuminant.

8. The cover article of claim 1, wherein the cover article exhibits a first-surface average photopic reflectance of less than 2% for an angle of incidence of about 8°.

9. The cover article of claim 1, wherein the scratch resistant layer and each of the high refractive index layers comprises $SiN_x$ or $SiO_xN_y$.

10. The cover article of claim 1, wherein the outer layered film comprises an antireflective region over the scratch resistant layer, and the antireflective region comprises at least five alternating high refractive index and low refractive index layers.

11. The cover article of claim 1, wherein the outer layered film comprises an optical interference layer between the scratch resistant layer and the substrate, the optical interference layer comprising alternating high refractive index and low refractive index layers.

12. The cover article of claim 1, wherein the thickness of the capping layer is from 110 nm to about 200 nm.

13. The cover article of claim 1, wherein a high refractive index layer adjacent to the capping layer has a thickness from about 10 nm to less than 150 nm.

14. The cover article of claim 1, wherein the outer layered film exhibits a residual compressive stress of greater than or equal to 700 Mpa and an elastic modulus of greater than or equal to 140 Gpa.

15. The cover article of claim 1, wherein the substrate is a glass-ceramic that comprises an elastic modulus of greater than 85 Gpa and a fracture toughness of greater than 0.8 Mpa·√m.

16. The cover article of claim 1, wherein the outer layered film exhibits a residual compressive stress of from 700 Mpa to 1100 Mpa and an elastic modulus of from 140 Gpa to 200 Gpa.

17. The cover article of claim 1, wherein the outer layered film exhibits an elastic modulus of from 140 Gpa to 180 Gpa.

18. The cover article of claim 1, wherein the substrate has a residual surface compressive stress of from 200 Mpa to 1200 Mpa and a depth of compression (DOC) of from 5 μm to 150 μm.

19. The cover article of claim 1, wherein the substrate further exhibits a maximum central tension (CT) value from 80 Mpa to 200 Mpa, and further wherein the substrate has a thickness of about 1.5 mm or less.

20. The cover article of claim 1, wherein the substrate has a residual surface compressive stress of from 200 Mpa to 400 Mpa.

21. The cover article of claim 1, wherein the cover article exhibits an average failure stress of 800 Mpa or greater in a ring-on-ring test with the outer surface of the outer layered film placed in tension.

22. A glass screen protector for a smart phone, comprising:

a cover glass; and an adhesive backing disposed on the cover glass, wherein the adhesive backing is for attachment to the smart phone, and further wherein at least one portion of the cover glass comprises a cover article of claim 1.

23. A consumer electronic product, comprising:

a housing comprising a front surface, a back surface and side surfaces;

electronic components at least partially within the housing, the electronic components comprising at least one of a display and a sensor, the display at or adjacent to the front surface of the housing and the sensor at or adjacent to the front surface or the back surface of the housing; and a cover disposed over at least one of the display and the sensor, wherein at least one portion of the cover comprises the cover article of claim 1.

24. A cover article for a sensor, comprising:

a substrate comprising a thickness from 50 μm to 5000 μm, an outer primary surface and an inner primary surface, wherein the outer and inner primary surfaces are opposite of one another and the substrate is a chemically-strengthened glass substrate or a glass-ceramic substrate; and an outer layered film disposed on the outer primary surface of the substrate, wherein the outer layered film comprises a plurality of alternating high refractive index and low refractive index layers, wherein each of the high refractive index layers comprises a nitride or an oxynitride and has a refractive index greater than a refractive index of each of the low refractive index layers, wherein the outer layered film comprises a scratch resistant layer having a thickness from about 80 nm to 10,000 nm, wherein one of the low refractive index layers is a capping layer defining an outermost surface of the outer layered film and the capping layer has a thickness of at least 110 nm, wherein the outer layered film comprises an antireflective region over the scratch resistant layer, and the antireflective region comprises a thickness from about 100 nm to about 525 nm, wherein the low refractive index layers of the antireflective region comprise a total thickness of less than 275 nm, wherein the outer layered film exhibits a hardness of at least 8 Gpa, as measured with a Berkovich Indenter Hardness Test from the outermost surface of the outer layered film to a depth from about 100 nm to about 500 nm, and further wherein the cover article exhibits a first-surface average reflectance of less than 10% for wavelengths from 1000 nm to 1700 nm for at least one angle of incidence from 8° to 60°.

25. A cover article for a sensor, comprising:

a substrate comprising a thickness from 50 μm to 5000 μm, an outer primary surface and an inner primary surface, wherein the outer and inner primary surfaces are opposite of one another and the substrate is a chemically-strengthened glass substrate or a glass-ceramic substrate; and an outer layered film disposed on the outer primary surface of the substrate, wherein the cover article exhibits a first-surface average reflectance of less than 10% for wavelengths from 1000 nm to 1700 nm for at least one angle of incidence from 8° to 60°, and further wherein the outer layered film exhibits a residual compressive stress of greater than or equal to 700 Mpa and an elastic modulus of greater than or equal to 140 Gpa, wherein the outer layered film comprises a scratch resistant layer comprising a nitride or an oxynitride and having a thickness from about 80 nm to 10,000 nm, wherein the outer layered film comprises a plurality of alternating high refractive index and low refractive index layers, and wherein each of the high refractive index layers comprises a nitride or an oxynitride and has a refractive index greater than a refractive index of each of the low refractive index layers, and wherein one of the low refractive index layers is a capping layer defining an outermost surface of the outer layered film and the capping layer has a thickness of at least 110 nm, and further wherein the outer layered film comprises an antireflective region over the scratch resistant layer, and the low refractive index layers of the antireflective region comprise a total thickness of less than 275 nm.

26. A cover article for a sensor, comprising:

a glass-ceramic substrate comprising a first primary surface and a second primary surface, the primary surfaces opposing one another; and an outer layered film defining an outer surface, the outer layered film disposed on the first primary surface, wherein the cover article exhibits a hardness of greater than 15 Gpa, as measured by a Berkovich Hardness Test at an indentation depth of about 125 nm from the outer surface of the outer layered film, and further wherein the cover article exhibits a first-surface average reflectance of less than 10% for wavelengths from 1000 nm to 1700 nm for at least one angle of incidence from 8° to 60°, wherein the outer layered film comprises a scratch resistant layer comprising a nitride or an oxynitride and having a thickness from about 80 nm to 10,000 nm, wherein the outer layered film comprises a plurality of alternating high refractive index and low refractive index layers, and wherein each of the high refractive index layers comprises a nitride or an oxynitride and has a refractive index greater than a refractive index of each of the low refractive index layers, and wherein one of the low refractive index layers is a capping layer defining an outermost surface of the outer layered film and the capping layer has a thickness of at least 110 nm, and further wherein the outer layered film comprises an antireflective region over the scratch resistant layer, and the low refractive index layers of the antireflective region comprise a total thickness of less than 275 nm.

27. A cover article for a sensor, comprising:

a substrate comprising a thickness from 50 μm to 5000 μm, an outer primary surface and an inner primary surface, wherein the outer and inner primary surfaces are opposite of one another and the substrate is a chemically-strengthened glass substrate or a glass-ceramic substrate; and an outer layered film disposed on the outer primary surface of the substrate, wherein the outer layered film exhibits a hardness of at least 8 Gpa, as measured with a Berkovich Indenter Hardness Test from the outermost surface of the outer layered film to a depth from about 100 nm to about 500 nm, and further wherein the cover article exhibits a first-surface average reflectance of less than 10% for wavelengths from 1000 nm to 1700 nm for at least one angle of incidence from 8° to 60°, wherein the outer layered film comprises a scratch resistant layer comprising a nitride or an oxynitride and having a thickness from about 80 nm to 10,000 nm, wherein the outer layered film comprises a plurality of alternating high refractive index and low refractive index layers, and wherein each of the high refractive index layers comprises a nitride or an oxynitride and has a refractive index greater than a refractive index of each of the low refractive index layers, and wherein one of the low refractive index layers is a capping layer defining an outermost surface of the outer layered film and the capping layer has a thickness of at least 110 nm, and further wherein the outer layered film comprises an antireflective region over the scratch resistant layer, and the low refractive index layers of the antireflective region comprise a total thickness of less than 275 nm.

28. The cover article of claim 27, wherein the antireflective region comprises a thickness from about 100 nm to about 525 nm.

* * * * *